US010878926B2

(12) United States Patent
Shukla et al.

(10) Patent No.: US 10,878,926 B2
(45) Date of Patent: Dec. 29, 2020

(54) SYSTEMS AND METHODS FOR HIGH-PERFORMANCE WRITE OPERATIONS

(71) Applicant: Sandisk Technologies LLC, Plano, TX (US)

(72) Inventors: Pitamber Shukla, Milpitas, CA (US); Mohan Dunga, Santa Clara, CA (US); Anubhav Khandelwal, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/591,210

(22) Filed: Oct. 2, 2019

(65) Prior Publication Data

US 2020/0035313 A1  Jan. 30, 2020

Related U.S. Application Data

(63) Continuation of application No. 15/967,572, filed on Apr. 30, 2018, now Pat. No. 10,460,816.

(Continued)

(51) Int. Cl.
| | |
|---|---|
| *G11C 16/10* | (2006.01) |
| *G11C 16/34* | (2006.01) |
| *G11C 16/26* | (2006.01) |
| *G06F 3/06* | (2006.01) |
| *G11C 11/4074* | (2006.01) |
| *G11C 29/52* | (2006.01) |

(Continued)

(52) U.S. Cl.
CPC ........ *G11C 16/3459* (2013.01); *G06F 3/0659* (2013.01); *G06F 3/0679* (2013.01);

(Continued)

(58) Field of Classification Search
CPC ............ G11C 16/3459; G11C 11/4074; G11C 16/0483; G11C 16/10; G11C 16/26; G06F 3/0659; G06F 3/0679

(Continued)

(56) References Cited

U.S. PATENT DOCUMENTS

| 5,615,159 A | * | 3/1997 | Roohparvar | ........... | G11C 16/20 |
| | | | | | 365/185.07 |
| 5,619,453 A | * | 4/1997 | Roohparvar | ........... | G11C 16/10 |
| | | | | | 365/185.29 |

(Continued)

FOREIGN PATENT DOCUMENTS

| WO | 2007149677 | 12/2007 |
| WO | 2019112675 | 6/2019 |

OTHER PUBLICATIONS

International Search Report and Written Opinion dated Feb. 1, 2019 for international application PCT/US2018052055.

(Continued)

*Primary Examiner* — Harry W Byrne
(74) *Attorney, Agent, or Firm* — Vierra Magen Marcus LLP

(57) ABSTRACT

A high-performance write operation to program data to a group of non-volatile memory cells may be completed in response to applying a single programming pulse to the group. Programming of the cells may be verified (and/or corrected) after completion of the command. Verifying programming of the cells may comprise identifying under-programmed cells, and applying an additional programming pulse to the identified cells. The under-programmed cells may comprise cells within an under-program range below a target level. The under-program range may be determined based on a threshold voltage distribution of the cells in response to applying the single programming pulse.

9 Claims, 19 Drawing Sheets

Related U.S. Application Data

(60) Provisional application No. 62/596,501, filed on Dec. 8, 2017.

(51) Int. Cl.
*G11C 16/04* (2006.01)
*G11C 29/04* (2006.01)

(52) U.S. Cl.
CPC .......... *G11C 11/4074* (2013.01); *G11C 16/10* (2013.01); *G11C 16/26* (2013.01); *G11C 16/3431* (2013.01); *G11C 29/52* (2013.01); *G11C 16/0483* (2013.01); *G11C 2029/0409* (2013.01)

(58) Field of Classification Search
USPC ............ 365/185.01, 185.02, 185.03, 185.05, 365/185.06, 185.1, 185.11, 185.17, 365/185.21, 185.22
See application file for complete search history.

(56) References Cited

U.S. PATENT DOCUMENTS

| | | | |
|---|---|---|---|
| 6,577,532 B1 | 6/2003 | Chevallier | |
| 6,891,752 B1 * | 5/2005 | Bautista | G11C 16/16 365/185.11 |
| 7,489,549 B2 | 2/2009 | Mokhlesi | |
| 8,576,623 B2 | 11/2013 | Nawata | |
| 9,448,868 B2 | 9/2016 | Liang | |
| 9,548,124 B1 | 1/2017 | Hazeghi et al. | |
| 9,666,286 B2 | 5/2017 | Lee | |
| 9,672,919 B2 | 6/2017 | Meir et al. | |
| 9,754,662 B2 | 9/2017 | Komatsu | |
| 9,773,560 B2 | 9/2017 | Park et al. | |
| 2004/0264252 A1 * | 12/2004 | Morikawa | G11C 16/0475 365/185.28 |
| 2007/0297226 A1 | 12/2007 | Mokhlesi | |
| 2008/0253181 A1 | 10/2008 | Edahiro | |
| 2009/0097318 A1 * | 4/2009 | Sarin | G11C 16/0483 365/185.17 |
| 2009/0310406 A1 * | 12/2009 | Sarin | G11C 11/5628 365/185.03 |
| 2014/0226413 A1 | 8/2014 | Gomez et al. | |
| 2017/0076813 A1 | 3/2017 | Kato et al. | |
| 2017/0169896 A1 | 6/2017 | Kavalipurapu et al. | |
| 2019/0180831 A1 | 6/2019 | Shukla et al. | |

OTHER PUBLICATIONS

Shukla, et al., Notice of Allowance dated Jun. 20, 2019 for U.S. Appl. No. 15/967,572.

* cited by examiner

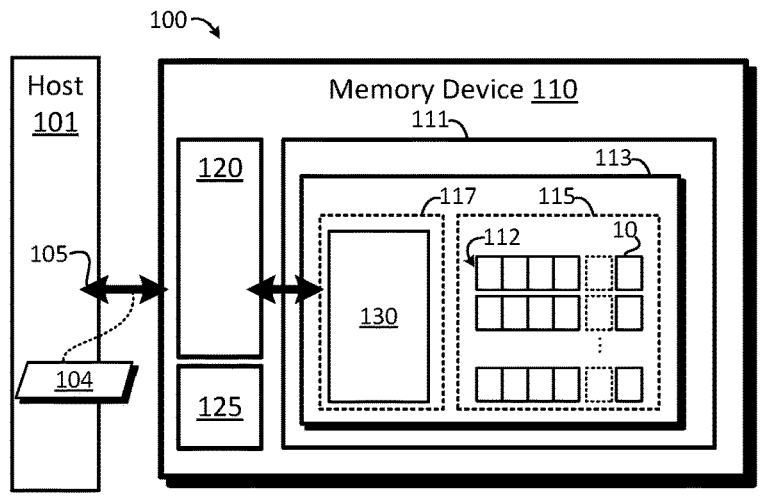
FIG. 1
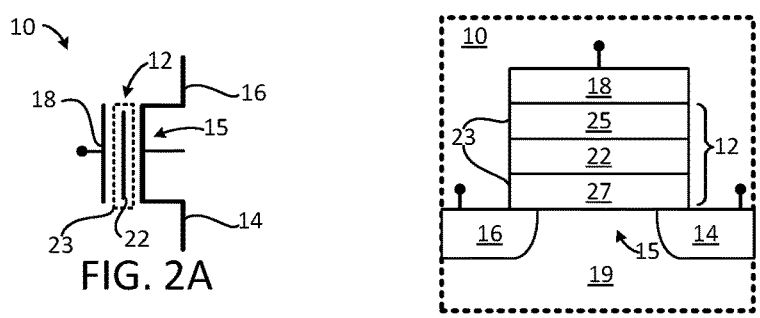
FIG. 2A
FIG. 2B
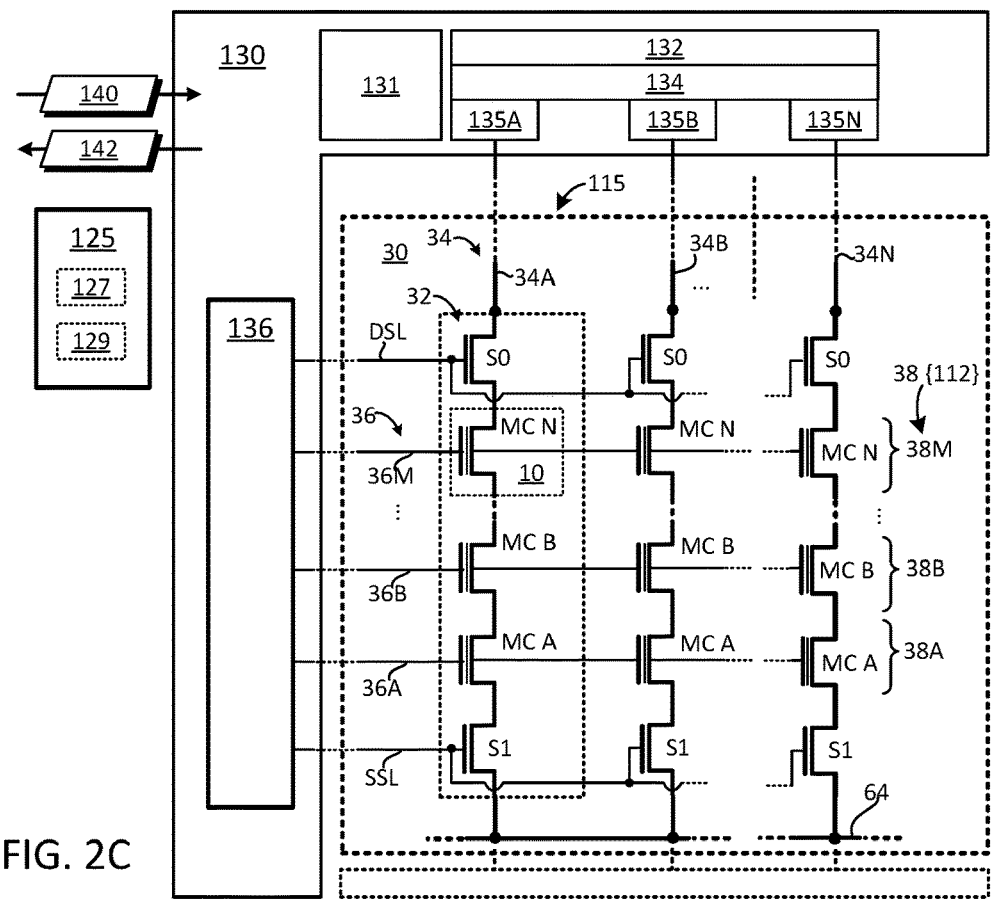
FIG. 2C

SYSTEMS AND METHODS FOR HIGH-PERFORMANCE WRITE OPERATIONS

CROSS REFERENCE TO RELATED APPLICATIONS

The Application Data Sheet (ADS) filed herewith is incorporated by reference. This application claims the benefit of U.S. patent application Ser. No. 15/967,572, filed Apr. 30, 2018, published as US 2019/0180831 on Jun. 13, 2019 and issued as U.S. Pat. No. 10,460,816 on Oct. 29, 2019, which claims priority to U.S. Provisional Patent Application No. 62/596,501, filed Dec. 8, 2017, each of which is hereby incorporated by reference to the extent such subject matter is not inconsistent with this disclosure.

TECHNICAL FIELD

This disclosure pertains to non-volatile memory and, in particular, high-performance, background-verified operations for writing data to the non-volatile memory.

BRIEF DESCRIPTION OF THE DRAWINGS

FIG. 1 is a schematic block diagram of one embodiment of memory device configured to implement high-performance write operations, as disclosed herein.

FIG. 2A is a schematic block diagram of one embodiment of a non-volatile memory cell.

FIG. 2B is a schematic block diagram of another embodiment of a non-volatile memory cell.

FIG. 2C is a schematic block diagram of one embodiment of memory control circuitry configured to implement high-performance write operations, as disclosed herein.

DETAILED DESCRIPTION OF PREFERRED EMBODIMENTS

Figure 2D:
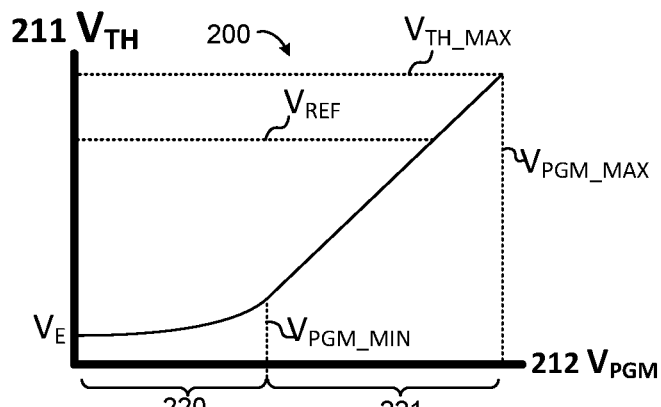
FIG. 2D comprises a plot depicting increases to $V_{TH}$ of a cell in response to respective programming pulses.

Data may be programmed to a non-volatile memory cell (or cell) by, inter alia, setting the cell to one of a plurality of states, each state representing and/or corresponding to a respective data value. The states may include an erased (or non-programmed) state and one or more programmed states. In some embodiments, each state may correspond to a respective voltage threshold (and/or range of voltage threshold). The voltage threshold ($V_{TH}$) of a cell may refer to the voltage level, potential, and/or value at which the cell transitions from a non-conductive state to a conductive state. A programming scheme may define a plurality of states, each state corresponding to a respective $V_{TH}$ (and/or range of $V_{TH}$), and corresponding to a respective data value. The states may include, but are not limited to: an erased (or non-programmed) state, and one or more programmed states (e.g., a multi-level scheme may define a plurality of programmed states, each corresponding to a respective $V_{TH}$ range and representing a respective data value, such as "000" through "111"). A single-level scheme may define an erased state and a programmed state (e.g., representing "1" and "0," respectively). The erased state may correspond to $V_{TH}$ between about −4 to 0 volts, and the programmed state may correspond to $V_{TH}$ between about 0 and 4 volts. Programmed cells may be distinguished from erased cells by use of one or more reference and/or verify voltage levels. A reference voltage level may be used to distinguish programmed cells from erased cells. The reference voltage level ($V_{REF}$) may be between voltage level(s) of the programmed and the erased states (at a point selected to optimally distinguish programmed cells from erased cells). In some embodiments, the state of a cell may be validated, verified, read, and/or sensed by, inter alia, determining whether the cell is conductive in response to biasing the cell at $V_{REF}$: if conductive, the $V_{TH}$ of the cell may be determined to be less than (or equal to) $V_{REF}$ and, as such, may be determined to be in the erased (or non-programmed) state; and, if non-conductive, the $V_{TH}$ of the cell may be determined to be at least $V_{REF}$ and, as such, may be determined to be in the programmed state.

Data may be programmed to a page comprising a plurality of cells by, inter alia, applying programming pulse(s) to the page. The programming pulse(s) may be configured to raise the $V_{TH}$ of selected cells to respective target values (e.g., to at least $V_{REF}$). The response of respective cells to programming pulses may vary. A programming pulse having an amplitude and/or duration sufficient to raise the $V_{TH}$ of a first cell to at least $V_{REF}$ may fail to raise the $V_{TH}$ of a second cell to $V_{REF}$ (e.g., raise the $V_{TH}$ of a second cell to a level below $V_{REF}$). In response to applying such a programming pulse, the first cell may be fully programmed, and the second cell may be under-programmed. As used herein, a "fully programmed" cell refers to a cell having a $V_{TH}$ that is within the $V_{TH}$ range corresponding to the target state of the cell, such as the programmed state (e.g., at least $V_{REF}$). As used herein, an "under-programmed" cell refers to a cell having a $V_{TH}$ that has been raised to a level below the $V_{TH}$ range corresponding to the target state of the cell (e.g., below $V_{REF}$). Fully programming the second cell may require a programming pulse having a higher amplitude and/or duration. Applying such a programming pulse to the first cell may result in over-programming the first cell. As used herein, "over-programming" refers to applying a programing pulse to a cell having an amplitude and/or duration greater than an amplitude and/or duration required to fully program the cell. Over-programming a cell may comprise increasing the $V_{TH}$ of a cell above a determined level, applying a programming pulse having an amplitude and/or duration higher than an amplitude and/or duration threshold for the cell, and/or the like. Over-programming a cell may result in increased wear and/or degradation of the cell, which may prematurely reduce the number of program/erase cycles the cells is capable of enduring before failure. Over-programming may also lead to other error conditions, such as string cut-off conditions where the $V_{TH}$ of a cell is raised at or above a non-select and/or pass voltage level.

The time required to complete foreground commands that involve the storage of data within a non-volatile memory can be a key contributor to overall performance. As used herein, a "foreground command" refers to a command received, fetched, and/or retrieved for execution at a memory system and/or device. Foreground commands may include, but are not limited to: commands pertaining to one or more of a client of the memory device 110, a host of the memory device 110 (e.g., host commands issued by the host 101), an external entity separate from the memory device 110 (e.g., external commands received, fetched, and/or retrieved via the interconnect 105); storage commands; commands corresponding to one or more standards and/or specifications; commands corresponding to the NVM Express (NVMe) standard (e.g., NVMe commands); PCI commands; PCIe commands, and/or the like. As used herein, the latency of a foreground command may refer to a delay between the time at which the foreground command is received, fetched, retrieved, and/or processed for execution, and the time at which execution of the foreground command is completed (and/or indicated as being complete by, inter alia, acknowledging completion of the foreground command, reporting completion of the foreground command, returning from execution of the foreground command, returning a completion and/or return code corresponding to the foreground command, recording a completion entry corresponding to the foreground command, issuing a completion indication pertaining to the foreground command, and/or the like). As used herein, a "foreground operation" refers to an operation that pertains to execution of a foreground command and/or contributes to the latency of a foreground command (e.g., a verified write operation performed in response to a foreground command).

In order to account for cell-to-cell variations, groups of cells may be programmed in write operations that include foreground verification. As used herein, a "foreground verification" and/or a "foreground verification operation" refers to verifying programming of a group of cells in one or more foreground operation(s) (e.g., verifying programming prior to indicating that execution of the corresponding foreground command is complete). A verified write operation to program data to a group of cells may comprise at least one foreground verification operation (e.g., at least one foreground operation to validate, verify, read, and/or sense one or more of the cells prior to completing the verified write operation). Implementing verified write operations in response to foreground commands may ensure that cells are fully programmed before such commands are indicated as being complete. However, the latency of a foreground command executed by use of a verified write operation may include the latency for the foreground verification operation thereof.

A write operation may comprise a series of program/verify cycles, each program/verify cycle comprising: applying one or more programming pulses to a group of cells, and a foreground verify operation performed subsequent to applying the one or more programming pulses. The foreground verify operation of a program/verify cycle may be performed in response to applying the one or more programming pulses, and may comprise one or more verify, read, and/or sense operations to identify program verified cells of the group. As used herein, a "program verified" cell refers to a cell that has been verified, read, and/or sensed as being fully programmed to a respective target level (e.g., determined to have a $V_{TH}$ of at least $V_{REF}$ and/or a verify reference level above $V_{REF}$). A "non-program verified" cell may refer to a cell that has not been program verified (e.g., has a $V_{TH}$ lower than a target level). Cells identified as being program verified may be inhibited during subsequent program/verify cycles (e.g., may be inhibited while subsequent programming pulses are applied to the group). The amplitude and/or duration of the programming pulses may be incrementally increased during the series. The program/verify cycles may continue until all (or a threshold number) of the cells have been program verified. Cells that are program verified in earlier program/verify cycles (in response to foreground programming pulses having lower amplitudes and/or durations) may be inhibited when programming pulses having higher amplitudes and/or durations are applied to the group, which may prevent over-program conditions. Moreover, applying a series programming pulses having increasing amplitudes and/or durations until all (or a threshold number) of the cells are program verified may ensure that the group is fully programmed before completion of the corresponding foreground command (e.g., prevent under-program conditions).

Although implementing write operations that comprise applying a series programming pulses and/or performing one or more foreground verification operations in response to foreground commands may ensure accurate programming (and prevent under- and/or over-program conditions), such operations may contribute to the latency of the foreground commands. The latency of foreground commands executed by use of such a write operations may include latencies for one or more program/verify cycles, the latency of each program/verify cycle comprising latencies for applying one or more programming pulses, and latencies for performing a corresponding foreground verification operation. Moreover, the latencies of the foreground commands may vary depending on the number of program/verify cycles that are required before all (or a threshold number) of the cells being programmed in the respective write operations are program verified, which may vary from write operation to write operation. For the purpose of command timing and/or scheduling, the latency of foreground commands implemented by such write operations may be reported as corresponding to a latency for implementing a maximum number of program/erase cycles.

The latency of foreground commands that involve storing data within the memory may be reduced by, inter alia, executing such commands by use of unverified write operations. As used herein, an unverified write operation refers to a write operation that completes in response to applying one or more programming pulses to a group of cells. The latency of unverified write operations may include the latency for applying programming pulse(s) to a group of cells, and may exclude foreground verification latency (e.g., latencies of foreground operations to verify, read, and/or sense cells of the group). Due to cell-to-cell variations, it may not be feasible to configure programming pulses to fully program cells, while preventing under- and/or over-program conditions. An unverified write operation may be configured to generate unverified programming pulse(s) having amplitude(s) and/or duration(s) adapted in accordance with programming characteristics of respective cells. As used herein, the "programming characteristics" of a cell may indicate, inter alia, the manner in which the cell responds to programming pulses (e.g., the rate at which the $V_{TH}$ of the cell changes in response to programming pulses having respective amplitudes and/or durations). A programming pulse adapted to fully program an "average" cell to a target state may, however, result in under-programming other cells. Applying programming pulses with amplitude(s) and/or duration(s) configured to raise the $V_{TH}$ of all of the cells to at least $V_{REF}$ regardless of the programming characteristics thereof, may prevent under-program conditions, but may result in high levels of over-programming, which may cause increased wear and/or degradation of certain cells, result in higher power consumption (and/or operating temperature), may create string cut-off conditions, and/or the like.

Disclosed herein are systems, methods, apparatus, non-volatile storage medium, circuitry, and/or logic for implementing high-performance operations to store data within a memory that do not impose foreground verification latency. Disclosed herein are high-performance operations in which cells are ensured to be accurately programmed without foreground verification, and while preventing under- and/or over-programing. Disclosed herein are embodiments of high-performance write operations, which may be completed in response to a single, first, or initial programming pulse to a group of cells. The group may be scheduled for background verification, which may be performed after acknowledging completion of a corresponding foreground command.

Disclosed herein are embodiments of an apparatus that comprises a memory structure comprising a plurality of memory cells, and a write circuit to apply a single programming pulse to a group of memory cells in response to a command. The apparatus may further comprise command processing logic configured to complete the command in response to the single programming pulse and mark the group for background verification. In some embodiments, a first memory cell of the group is to be programmed to a target memory state responsive to the command, and the command processing logic is configured to return an indication that execution of the command is complete while a voltage threshold of the first memory cell remains below a read reference voltage level for the target memory state. The apparatus may further comprise a read circuit configured to determine whether selected memory cells of the plurality of memory cells are in one of a programmed state and a non-programmed state based on whether voltage thresholds of the selected memory cells exceed a determined reference voltage potential. The write circuit may be configured to generate the single programming pulse at a programming voltage level configured such that voltage thresholds of one or more memory cells of the plurality of memory cells remain below the determined reference voltage potential in response to the single programming pulse. The apparatus may include verification logic configured to implement a background verification operation on the group of memory cells subsequent to completion of the command. The verification logic may comprise detection logic configured to identify under-programmed memory cells of the group, and correction logic configured to cause the write circuit to apply a corrective programming pulse to the under-programmed memory cells. The detection logic may be configured to identify the under-programmed memory cells of the group by use of a sense circuit, configured to: determine first conductive states of respective memory cells of the group responsive to biasing a word line coupled to the respective memory cells at a first voltage potential, the first voltage potential corresponding to the reference value; and determine second conductive states of the respective memory cells responsive to biasing the word line at a second voltage potential, the second voltage potential corresponding to the reference value less the margin. An amplitude of the corrective programming pulse may be higher than an amplitude of the single programming pulse. In some embodiments, the apparatus may comprise idle logic adapted to configure the verification logic to perform the background verification operation in response to determining that the command processing logic is idle.

Disclosed herein are embodiments of a memory device, comprising: a memory controller configured to: apply a first programming pulse to a page comprising a plurality of memory cells in response to a first command, and indicate that the first command is complete in response to the first programming pulse. The memory device may further comprise a device controller configured to schedule background verification of the page. The device controller may be further configured to cancel the background verification in response to determining that data corresponding to the first command does not need to be retained. The first command may pertain to a foreground command issued by a host computing device, and the device controller may be further configured to: acknowledge completion of the first command in response to the first programming pulse and without verifying programming of the memory cells comprising the page, and issue a second command to the memory controller after acknowledging completion of the first command, the second command configured to cause the memory controller to implement the scheduled background verification of the page. The memory controller may be further configured to implement the scheduled background verification of the page by: identifying under-programmed memory cells of the page, the under-programmed memory cells having voltage thresholds lower than a reference voltage potential used to read data states of the memory cells by less than a determined amount; and applying a second programming pulse to the under-programmed memory cells. In response to a command to implement the scheduled background verification of the page, the memory controller may be further configured to: identify memory cells within the page having voltage thresholds between a first reference voltage level used to distinguish programmed memory cells from non-programmed memory cells and a second reference voltage level, the second reference voltage level lower than the first reference voltage level by an under-program factor; and apply a second programming pulse to the identified memory cells (in sense operations performed at respective reference voltage levels). The device controller may be further configured to determine the under-program factor based on a distribution of threshold voltages. The device controller may comprise foreground processing logic configured to execute commands of a host; and background processing logic configured to direct the memory controller to implement the scheduled background verification of the page while the foreground processing logic is idle. The first command may pertain to a host command retrieved from a queue, and the device controller may be configured to instruct the memory controller to perform the scheduled background verification of the page in response to determining that the queue is empty.

Disclosed herein are embodiments of a method for performing a single-pulse program operation in response to a host command, comprising: applying an initial programming pulse to selected cells within a page of a non-volatile memory, queuing program verification of the page, comprising determining whether voltage thresholds of the selected cells are above a target reference level used for reading data from the non-volatile memory; and reporting that the host command is complete in response to applying the initial programming pulse and prior to performing the queued program verification for the page. The queued program verification of the page may be performed after reporting that the host command is complete. The program verification may comprise: identifying under-programmed cells within the page, the under-programmed cells comprising cells determined to have voltage thresholds that are below the target reference level and above a minimum reference level lower than the target reference level; and applying a second programming pulse to the under-programmed cells, the second programming pulse configured to increase voltage thresholds of the under-programmed cells to at least the target reference level. The program verification may further comprise identifying program verified cells within the page, the program verified cells comprising cells determined to have voltage thresholds of at least the target reference level; and inhibiting the program verified cells during the second programming pulse. The program verification may include: identifying non-programmed cells within the page, the non-programmed cells comprising cells determined to have voltage thresholds lower than the minimum reference level; and inhibiting the non-programmed cells during the second programming pulse. The minimum reference level may be the target reference level minus a compensation factor; and the compensation factor may comprise one of: a constant value, and a value derived from a voltage threshold distribution. The minimum reference level may be determined by, determining cell counts at each of a plurality of different test reference voltage levels, each test reference voltage level lower than the target reference level; interpolating a distribution curve from the determined cell counts; and setting the minimum reference level in accordance with a minimum identified within the interpolated distribution curve.

Disclosed herein are embodiments of a memory system, comprising: read circuitry operatively coupled to a non-volatile memory and configured determine whether respective cells of the non-volatile memory are programmed in response to sensing whether voltage thresholds of the respective cells are higher than a reference voltage level; write circuitry operatively coupled to the non-volatile memory; and system controller configured to: direct the write circuitry to apply a first programming pulse to a selected memory unit in response to a command, the first programming pulse configured to program one or more cells of the selected memory unit, record that the selected memory unit requires post-write validation (e.g., operation(s) to validate voltage thresholds of the one or more cells), and acknowledge completion of the command in response to the first programming pulse. The controller may be further configured to perform a post-write validation of the selected memory unit after acknowledging completion of the first command, the post-write validation comprising: using the read circuitry to identify cells of the selected memory unit having voltage thresholds that are lower than the reference voltage level by less than a voltage delta; and configuring the write circuitry to apply a second programming pulse to the identified cells. The controller may be further configured to perform post-write validation of the selected memory cells during an idle period, comprising identifying under-programmed cells of the selected memory unit, by sensing the cells of the selected memory unit at the reference voltage level minus a delta value, and sensing the cells of the selected memory unit at the reference voltage level; and causing the write circuitry to apply a second programming pulse to the under-programmed cells. The controller may be further configured to set the delta value to one of a pre-determined value and a value derived from a voltage threshold distribution corresponding to the memory unit.

Disclosed herein are embodiments of a system, comprising means for programming data to a page of non-volatile memory cells of a storage device in response to a command, comprising: means for applying a first programming pulse to the page, the first programming pulse configured to raise threshold voltages of selected non-volatile memory cells of the page to a reference voltage level for distinguishing programmed memory cells from erased memory cells, means for scheduling a selective reprogramming of the page, and means for completing the command while the threshold voltage of at least one of the selected non-volatile memory cells is below the reference voltage level. The system may further comprise means for selectively reprogramming the page after completing the command, comprising: means for identifying non-volatile memory cells of the page that have threshold voltages within a margin below the reference voltage level, and means for applying a second programming pulse to the identified non-volatile memory cells.

FIG. 1 is a schematic block diagram of a system 100 comprising one embodiment of a memory device 110 configured to implement high-performance write operations, as disclosed herein. The memory device 110 may comprise a controller 120 (a device controller 120), which may be configured to, inter alia, operably couple the memory device 110 to a host 101. The host 101 may comprise any suitable means for hosting the memory device 110 including, but not limited to: a computing device, a computing system, a server, a server computing device, a server computing system, a personal computing device, a personal computing system, a mobile computing device (e.g., a smartphone, a tablet, or the like), a mobile computing system, an embedded computing device, an embedded computing system, a virtual computing system (e.g., a virtual machine, a virtual desktop), a virtualization environment (e.g., a virtualization kernel, a hypervisor), and/or the like.

In some embodiments, the memory device 110 may be embedded within the host 101 and/or may comprise an internal component of the host 101. The memory device 110 may comprise an on-board memory, on-board storage, integrated memory, integrated storage, a memory module, a storage module, and/or the like. The memory device 110 may comprise an add-on device, such as an add-on storage device, an add-on memory device, a peripheral device, or the like, and may be configured to be coupled to the host 101 through one or more of an on-board interconnect, a system interconnect, an external interconnect, a remote interconnect, and/or the like. Alternatively, or in addition, the memory device 110 may be separate from and/or independent of the host 101; the memory device 110 may be embodied as a device, apparatus, and/or system that is separate and/or independent from one or more computing devices, apparatus, and/or systems comprising the host 101. The memory device 110 may comprise a memory device, a storage device, an external memory device, an external storage device, a memory appliance, a storage appliance, a server, a memory server, a storage server, a network-attached memory device, a network-attached storage device, a cache device, a cache appliance, and/or the like. Although FIG. 1 depicts a single host 101, the disclosure is not limited in this regard. The memory device 110 could be operatively, communicatively, and/or electrically coupled to any number of hosts 101 (e.g., may be shared between a plurality of hosts 101).

The device controller 120 may be configured to, inter alia, operatively, communicatively, and/or electrically couple the memory device 110 to an interconnect 105. The interconnect 105 may include, but is not limited to, an input/output (I/O) bus, an I/O controller, a local bus, a host bridge (Northbridge, Southbridge, or the like), a front-side bus, a peripheral component interconnect (PCI), a PCI express (PCI-e) bus, a Serial AT Attachment (serial ATA or SATA) bus, a parallel ATA (PATA) bus, a Small Computer System Interface (SCSI) bus, a Direct Memory Access (DMA) interface, an IEEE 1394 (FireWire) interface, a Fiber Channel interface, a Universal Serial Bus (USB) connection, and/or the like. In some embodiments, the memory device 110 may be communicatively coupled to the host 101 through an electronic communication network (not shown in FIG. 1 to avoid obscuring details of the illustrated embodiments). The interconnect 105 may, therefore, comprise one or more of: a network, a network connection, a network interface, a storage network interface, a Storage Area Network (SAN) interface, a Virtual Storage Area Network (VSAN) interface, a remote bus, a PCE-e bus, a fabric interface, a PCI Express fabric interface, an Infiniband fabric interface, a Fibre Channel Protocol (FCP) fabric interface, a HyperSCSI interface, a remove DMA (RDMA) interface, and/or the like. Although FIG. 1 depicts a single interconnect 105, the disclosure is not limited in this regard, and the memory device 110 could be configured to be operatively, communicatively, and/or electrically coupled to any number of hosts 101 via any number of different interconnects 105.

The memory resources 111 may comprise, inter alia, a memory structure 113. The memory structure 113 may comprise a plurality of cells 10 (within a memory 115 thereof), each of which may be configured to store a respective quantum of data (e.g., respective data values, bits, and/or the like). The cells 10 may comprise any suitable means for storing and/or retrieving electronic data including, but not limited to: volatile memory, non-volatile memory, non-transitory memory, solid-state memory, Flash memory, NAND-type Flash memory, NOR-type Flash memory, Programmable Metallization Cell (PMC) memory, Silicon-Oxide-Nitride-Oxide-Silicon (SONOS) memory, Resistive RAM (RRAM) memory, Floating Junction Gate (FJG) RAM, ferroelectric memory (FeRAM), magnetoresistive memory (MRAM), phase change memory (PRAM), Electrically Erasable Programmable Read-Only Memory (EEPROM), and/or the like. In some embodiments, the cells 10 may be arranged and/or organized into memory units 112. As used herein, a memory unit 112 refers to any suitable group, collection, arrangement, and/or organization of cells 10. A memory unit 112 may comprise, but is not limited to: a group of cells 10, a collection of cells 10, a set of cells 10, a page, a physical page, a meta page (e.g., a group of pages), a segment, a physical segment, a meta segment, a sector, a physical sector, a meta sector, a block, a physical block, a meta block, an erase block, and/or the like. A memory unit 112 may represent a smallest storage unit at which data are stored, written, programmed, and/or read from the memory 111. For example, in one embodiment, each memory unit 112 may be configured to hold 4 KB of data. In some embodiments, the memory units 112 may correspond to a physical structure, arrangement, and/or organization of the cells 10 (e.g., may comprise respective rows of a block and/or array of cells 10).

The memory 115 may be operatively coupled to memory control circuitry 130, which may be configured to perform operations on respective memory units 112 thereof, which may include, but are not limited to: writing data to respective memory units 112, reading data from respective memory units 112, initializing respective memory units 112 (and/or groups of memory units 12), erasing memory units 112 (and/or groups of memory units 12), and/or the like.

The memory structure 113 may comprise any suitable means for embodying, forming, and/or implementing one or more cells 10 and/or memory units 112 (and/or memory control circuitry 130). The memory structure 113 may include, but is not limited to: a die, a plane, a chip, a package, a substrate, a semiconductor substrate, a semiconductor, a semiconductor wafer, a Flash memory die, a NAND-Flash die, a NOR-Flash die, and/or the like. The memory structure 113 may further comprise a control core 117 (e.g., a peripheral region), which may comprise, inter alia, peripheral circuitry pertaining to the memory 115 (e.g., input/output circuitry, control circuitry, read circuitry, write circuitry, sense circuitry, buffer circuitry, latch circuitry, and/or the like). In some embodiments, the memory control circuitry 130 may be embodied on and/or within the memory structure 113 (e.g., within the control core 117, as illustrated in FIG. 1). Alternatively, the memory control circuitry 130 may be formed on and/or within a structure that is separate from the memory structure 113. Although FIG. 1 depicts a memory device 110 comprising a single memory structure 113, the disclosure is not limited in this regard; the memory device 110 could comprise any number of memory structure(s) 113, each comprising respective memories 115, control cores 117, cells 10, memory units 112, and/or the like. Moreover, although FIG. 1 depicts a memory structure 113 comprising a distinct memory 115 and control core 117, the disclosure is not limited in this regard; in some embodiments, control, interconnect and/or periphery circuitry pertaining to the memory 115 may be implemented therein (e.g., may be interspersed with cells 10, memory units 112, and/or other components of the memory 115 as opposed to being embodied within a distinct region, such as the control core 117).

FIG. 2A depicts one embodiment of a cell 10. In the FIG. 2A embodiment, the cell 10 comprises a non-volatile (NV) memory cell, such as a Floating Gate (FG) memory cell, NAND memory cell, and/or the like. The cell 10 may comprise a field-effect transistor having a source 14, a drain 16, and a control gate 18. The cell 10 may further comprise a charge storage unit 12. The charge storage unit 12 may comprise any suitable means for storing, trapping, and/or retaining charge (e.g., electrons) including, but not limited to: a floating gate, a charge trapping (dielectric) layer, and/or the like. In the FIG. 2A embodiment, the charge storage unit 12 comprises a floating gate 22. The source 14 and drain 16 may comprise n-type regions, and the substrate (channel region 15) may comprise a p-type region. The floating gate 22 may be isolated from the control gate 18, source 14, drain 16, and/or substrate (channel region 15) by isolation structure 23, which may enable the floating gate 22 to retain charge (e.g., electrons) trapped therein. The isolation structure 23 may comprise one or more of an insulating material, oxide material, gate oxide material, tunnel oxide material, oxide-nitride-oxide (ONO) material, dielectric material, insulating layer, oxide layer, gate oxide layer, tunnel oxide later, tunneling dielectric layer, ONO layer, and/or the like. In some embodiments, the isolation structure 23 comprises a tunneling dielectric having an oxide-nitride-oxide (ONO) structure.

As illustrated in FIG. 2B, in some embodiments, the charge storage unit 12 may comprise a floating gate 22, and the isolation structure 23 may comprise a blocking layer 25 and a tunneling layer 27. The floating gate 22 may be disposed between the blocking layer 25 and the tunneling layer 27. The tunneling layer 27 may comprise a tunneling dielectric, tunneling oxide, or the like. The blocking layer 25 may be configured to isolate the floating gate 22 from the control gate 18 and may be comprised of a suitable material, such as a blocking oxide (a blocking $SiO_2$ layer). The tunneling layer 27 may be configured to isolate the floating gate 22 from the drain source 14, drain 16, and/or substrate 19 (channel region 15). As disclosed in further detail herein, charge may be trapped within the floating gate 22 using Fowler-Nordheim (FN) tunneling, or another suitable technique. In some embodiments, the tunnel oxide layer 27 may be configured to enable charge to be stored within the floating gate 22 (or drained therefrom) through FN tunneling, which leverages the quantum-effect of electron tunneling in the presence of a strong electric field to enable electrons (or holes) to cross the tunnel oxide layer 27. One or more of the blocking layer 25 and the tunneling layer 27 may comprise an ONO structure. As disclosed in further detail herein, programming a cell 10 may comprise setting the $V_{TH}$ of the cell 10 within a desired range and reading a cell 10 may comprise determining whether the $V_{TH}$ of the cell 10 is within one or more determined ranges. Although particular examples of cells 10 are described herein, the disclosure is not limited in this regard and could be adapted for use with any suitable type of cell 10, utilizing any suitable structure, and/or configuration.

As illustrated in FIG. 2C, a plurality of cells 10 may be embodied within a block 30. The block 30 depicted in FIG. 2C may be one of a plurality of blocks 30 embodied within the memory 115 and/or memory structure 113. In the FIG. 2C embodiment, the block 30 may comprise an N×M array of cells 10. The block 30 may comprise N strings 32 (e.g., N columns), each string 32 comprising M cells 10 (e.g., M rows). The block 30 may comprise N bit lines 34, each bit line 34A-N coupled to a respective string 20 through, inter alia, a respective drain select transistor S0 controlled by a drain select line (DSL). The strings 32 may be selectively coupled to a source line 64 by source select transistors S1, which may be controlled by a source select line (SSL). The block 30 may further comprise M word lines 36, each word line 36A-M coupled to the control gates 18 of cells 10 across the strings 32 (e.g., along respective rows of the block 30). The cells 10 coupled to a same word line 36 may comprise a page 38. As illustrated in FIG. 2B, the block 30 may comprise M pages 38A-M: page 38A comprising cells 10 (MC A) coupled to word line 36A, page 38B comprising cells 10 (MC B) coupled to word line 36B, and so on, with page 38M comprising cells 10 (MC M) coupled to word line 36M. The pages 36 may comprise and/or correspond to respective memory units 112 (e.g., the block 30 may comprise M units 112, each comprising and/or corresponding to a respective page 38A-M).

In the FIG. 2B embodiment, the memory control circuitry 130 may comprise and/or be operatively coupled to a read circuit 132, a write circuit 134, and/or driver circuitry 136. The read circuit 132 may be configured to read data from selected pages 38, and the write circuit may be configured to erase and/or program selected pages 38, and the driver circuitry 136 may be configured to bias and/or drive word lines 36, control lines (e.g., DSL and/or SSL), and/or signals and/or lines during erase, program, sense, and/or read operations, as disclosed in further detail herein. As illustrated in FIG. 2B, the write circuit may comprise and/or be communicatively coupled to one or more read/write blocks 135 (e.g., read/write blocks 135A-N), each of which may correspond to a respective bit line 34. The read/write blocks 135A-N may be configured to hold a respective data value (e.g., a data value to be programmed to a respective cell 10, or read from the cell 10). The memory control circuitry 130 may be configured to buffer, latch, and/or transfer data values to be stored within a page 38 to the read/write blocks 135A-N.

The read circuit 132 may sense and/or read selected cells 10 by, inter alia, sensing $V_{TH}$(s) of the selected cells 10. As disclosed herein, the $V_{TH}$ of a cell 10 refers to a voltage potential and/or level at which the control gate 18 of the cell 10 must be biased in order to cause the cell 10 to transition from a non-conducting state to a conducting state (e.g., the voltage potential and/or level at which the transistor comprising the cell 10 turns "on," enabling drain-to-source current flow). The $V_{TH}$ of a cell 10 may correspond to an amount of charge Q within the charge storage unit 12 thereof (e.g., $$V_{TH} = V_{TH\_0} - \frac{Q}{C_{PP}},$$

where Q is an amount of charge trapped within the floating gate 22 of the cell 10, $V_{TH\_0}$ is the neutral threshold voltage of the cell 10, and $C_{PP}$ is a capacitance of the cell 10, such as interpoly dielectric capacitance). A sense operation on a cell 10 may comprise determining whether the cell 10 is conductive in response to biasing the cell 10 at a particular level (while biasing the control gate 18 of the cell 10 at a sense level, $V_S$). If the cell 10 is conductive at the particular level, the $V_{TH}$ of the cell 10 may be determined to be lower than $V_S$; if the cell 10 is non-conductive, the $V_{TH}$ of the cell 10 may be determined to be at or above $V_S$.

The state of a cell 10 may, therefore, correspond to the $V_{TH}$ of the cell 10. In some embodiments, the memory control circuitry 130 may implement a single-level scheme comprising two states: a programmed state; and a non-programmed, or erased state, each representing a respective data value (e.g., the programmed state representing a "0" bit value and the non-programmed state representing a "1" bit value). The states may be distinguished by use of a reference voltage ($V_{REF}$). As used herein, a reference voltage level ($V_{REF}$) refers to a voltage level, potential, and/or value used to determine, read, sense, verify, and/or validate whether a cell 10 is programmed to a particular state (which may correspond to a particular data value). The read circuit 132 may determine that cells 10 having a $V_{TH}$ below $V_{REF}$ are in the non-programmed state (represent and/or store a "1" data value), and that cells 10 having $V_{TH}$ at or above $V_{REF}$ may be determined to be in the programmed state (represent and/or store a "0" data value). The read circuit 132 may sense the state of a cell 10 by, inter alia, determining whether the cell 10 is conductive in response to biasing the control gate 18 of the cell 10 at $V_{REF}$. If the cell 10 is determined to be "on" when biased at $V_{REF}$, the $V_{TH}$ of the cell 10 may be determined to be lower than $V_{REF}$ and, as such, the cell 10 may be determined to be in the non-programmed state (store and/or represent a "1" data value). If the cell 10 is determined to be off when biased at $V_{REF}$, the $V_{TH}$ of the cell 10 may be determined to be higher than $V_{REF}$ and, as such, the cell 10 may be determined to be in the programmed state (store and/or represent a "0" data value).

In some embodiments, the read circuit 132 may be configured to read a plurality of cells 10 in parallel. The read circuit 132 may be configured to read data units from selected pages 38, each data unit comprising a plurality of data values (e.g., each page comprising N data values of a data unit, each data value stored within a respective one of N cells 10 comprising each page 38). Reading a selected page 38 may comprise sensing the bit lines 34A-N of the block 30 in response to: a) biasing the word line of the selected page 38 at $V_{REF}$; and b) biasing word lines 36 of the non-selected pages 38 at a higher voltage level ($V_{PASS}$) configured to cause the cells 10 coupled thereto to conduct, regardless of the state thereof (regardless of whether the cells 10 are programmed or non-programmed). Accordingly, the cells 10 of the non-selected pages 38 may not significantly contribute to the impedance along the respective bit lines 34A-N, such that a conduction current and/or voltage drop sensed thereon corresponds to the respective cells 10 of the selected page 38, as opposed to cells 10 of the non-selected pages 38. As illustrated in FIG. 2C, the read circuit 132 may comprise and/or be communicatively coupled to read/write blocks 135 (e.g., read/write blocks 135A-N, each of which may correspond to a respective bit line 34A-N). The read/write blocks 135A-N may comprise sense circuitry configured to sense a conduction current and/or voltage drop on respective bit lines 34A-N, which may indicate the state of the respective cells 10 of the selected page 38. The read circuit 132 may latch, buffer, and/or hold data values corresponding to the determined states of the respective cells 10 within the respective read/write blocks 135A-N, which may comprise the data unit stored within the selected page 38.

In some embodiments, raising the $V_{TH}$ of a cell 10 at or above $V_{PASS}$ may result in a "cut-off" condition, which may prevent other cells 10 within the same string 32 from being accurately sensed. If the $V_{TH}$ of a cell 10 within a particular string is at or above $V_{PASS}$, the cell 10 may remain off while other cells 10 are being sensed (since $V_{PASS}$ is insufficient to turn on the cell 10), cutting off the particular string 32 and preventing the state of the other cells 10 therein from being accurately sensed.

The memory control circuitry 130 may configure the write circuit 134 to store data within respective pages 38. Storing a data unit within a page 38 may comprise programming respective cells 10 of the page 38 in accordance with respective data values of the data unit. As illustrated in FIG. 2B, the write circuit may comprise and/or be communicatively coupled to read/write blocks 135A-N, each of which may correspond to a respective bit line 34A-N. The read/write blocks 135A-N may be configured to hold respective data values. The memory control circuitry 130 may be configured to buffer, latch, and/or transfer data values of a data unit within respective read/write blocks 135A-N. The write circuit 134 may be configured to store the data values within respective cells 10 of a selected page 38. In the single-level scheme disclosed above, the write circuit 134 may be configured to: a) program cells 10 being used to store and/or represent data values corresponding to the programmed state (e.g., target cells to store and/or represent "0" data values) by, inter alia, raising the $V_{TH}$ of the cells 10 to at least $V_{REF}$; and inhibit programming of cells 10 being used to store and/or represent data values corresponding to the non-programmed state (e.g., "1" data values), which may comprise maintaining the $V_{TH}$ of such cells 10 at or below $V_{REF}$. Programming a cell 10 may comprise applying one or more programming pulse(s) to the word line 36 thereof, while biasing the word lines 36 of the unselected pages 38 at the pass voltage ($V_{PASS}$) and grounding the bit line 34 thereof. The programming pulse(s) may be configured to raise the $V_{TH}$ of the cell to at least $V_{REF}$. The programming pulse(s) may be configured to raise the $V_{TH}$ of the cell 10 by, inter alia, increasing an amount of charge Q stored therein (e.g., $$V_{TH} = V_{TH\_0} - \frac{Q}{C_{PP}},$$

as disclosed above). The amount of charge Q injected into the charge storage unit 12 of the cell 10, and corresponding increase to $V_{TH}$, in response to a programming pulse may be a function of the amplitude of the pulse (e.g., the voltage level or potential of the pulse). The amplitude of the programming pulse may determine the strength of the electric field produced thereby which, in turn, may determine the probability of electron injection into the floating gate 22 of the cell 10 (and the corresponding increase to the $V_{TH}$ of the cell 10).

FIG. 2D is a plot 200 depicting increases in the $V_{TH}$ of a particular cell 10 from an initial, erased state in response to programming pulses having different amplitudes (and substantially the same duration). The $V_{TH}$ of the particular cell 10 may be initialized to $V_E$, which may correspond to a voltage potential between about −4 and 0 volts. The vertical axis 211 of the plot 200 corresponds to increasing $V_{TH}$ of the cell 10, and the horizontal axis 212 corresponds to increasing programming pulse amplitude (increasing $V_{PGM}$). As illustrated in FIG. 2D, the increases to $V_{TH}$ may be divided into a non-linear region 220 and a linear region 221. The non-linear region 220 corresponds to programming pulses having $V_{PGM}$ below the amplitude required to trigger tunneling across the isolation structure 23 and/or tunneling layer 27 of the particular cell 10 (e.g., $V_{PGM} > V_{PGM\_MIN}$). As such, programming pulses having $V_{PGM}$ below $V_{PGM\_MIN}$ may result in slow, non-linear increases in $V_{TH}$. Programming pulses $V_{PGM}$ above $V_{PGM\_MIN}$ of the particular cell 10 may produce electric fields sufficient to trigger tunneling, which may result in increases to the $V_{TH}$ of the particular cell that are substantially linear with the respect to the amplitude of the programming pulse, $V_{PGM}$. Increases to the $V_{TH}$ of the particular cell 10 in response to a programming pulse having an amplitude greater than $V_{PGM\_MIN}$ may be modeled as, $V_{TH\_1} = V_{TH\_0} + PR \cdot V_{PRG}$, where $V_{TH\_0}$ is the $V_{TH}$ of the particular cell 10 before applying the programming pulse (e.g., $V_E$), $V_{TH\_1}$ is the $V_{TH}$ of the particular cell 10 after applying a programming pulse of amplitude $V_{PGM}$ thereto, and PR is a linear scaling factor (e.g., the linear "program rate" of the particular cell 10).

As illustrated in FIG. 2D, the use of high amplitude programming pulses (e.g., where $V_{PGM}$ is significantly higher than $V_{PGM\_MIN}$) may result in faster increases in the $V_{TH}$ of the cells 10 being programmed (and hence, faster programming to a target $V_{TH}$ for the cell 10, such as $V_{REF}$). However, high amplitude programming pulses (and/or longer duration programming pulses) may result in over-programming. As used herein, over-programming a cell 10 may refer to one or more of: over-pulsing the cell 10, over-charging the cell 10, and/or the like. Over-pulsing a particular cell 10 may comprise applying a programming pulse to the particular cell 10 that has: an amplitude above a maximum programming pulse amplitude for the cell 10, a duration longer than a maximum duration for the cell 10, a total energy above a maximum programming energy for the cell 10, and/or the like. The maximum programming pulse amplitude ($V_{PGM\_MAX}$) for a particular cell 10 may indicate a programming pulse amplitude at which the cell 10 will experience undesired levels of wear and/or degradation. As described above, applying a programing pulse to a cell 10 may comprise driving the word line 36 coupled to the cell 10 with the programming pulse while the drain 16 thereof is grounded, which may produce an electric field across the tunneling layer 27 (and which may cause electrons to tunnel from the channel region 15, through the tunneling layer 2, and into the floating gate 22). Increasing the amplitude of the electric field may increase the probability of electron injection, but may also lead to degradation of the cell 10 (e.g., breakdown of the isolation structure 23, dielectric layer 25, tunneling layer 27, and/or the like). The programming pulse amplitude at which such degradation is projected to occur (and/or the point at which the rate of such degradation is projected to reach an undesirable level) may be referred to as the maximum programming pulse amplitude ($V_{PGM\_MAX}$) of the cell 10. Over-pulsing a cell 10 may, therefore, refer to applying a programming pulse having an amplitude at or above the $V_{PGM\_MAX}$ of the cell. Similar maximums may be defined for pulse duration and/or energy. Over-charging a cell 10 may refer to increasing an amount of charge Q within the charge storage unit 12 thereof above a maximum charge level (e.g., $Q_{MAX}$ of the charge storage unit 12) and/or increasing the $V_{TH}$ thereof above a maximum $V_{TH}$ level (e.g., $V_{TH\_MAX}$). Over-charging a cell 10 may result in degradation, as disclosed above (e.g., degradation of the isolation structure 23, dielectric 25, tunneling layer 27, and/or the like). Over-charging a cell 10 may also result in a cut-off condition, as disclosed above (e.g., where the cell 10 has a $V_{TH}$ that exceeds $V_{PASS}$, such that the cell 10 will remain non-conductive when sensing other cells 10 within the string 32 thereof).

As disclosed above, the change to the $V_{TH}$ of a particular cell 10 in response to a programming pulse may be a function of the amplitude of the programming pulse. The change may also be a function of programming characteristics of the particular cell 10. The programming characteristics of a cell 10 may include, but are not limited to: the minimum amplitude required to initiate tunneling within the cell (e.g., $V_{PGM\_MIN}$ of the cell 10), the rate at which $V_{TH}$ increases during tunneling (e.g., the linear programming rate, PR of the cell 10), and/or the like. The programming characteristics of a cell 10 may further comprise programming constraints or thresholds, such as a maximum pulse amplitude for the cell (e.g., $V_{PGM\_MAX}$), a maximum pulse duration and/or energy, a maximum threshold voltage (e.g., $V_{TH\_MAX}$, which may be less than $V_{PASS}$), and/or the like. In some embodiments, a set of ideal programming characteristics may be determined for the cell 10. As used herein, ideal programming characteristics (IPC), refer to cell programming characteristics based on, inter alia, design, fabrication, and/or process characteristics of the memory structure 113, cells 10 embodied therein and/or components of the cells 10 (e.g., the source 14, drain 16, control gate 18, channel region 15, substrate 19, floating gate 18, charge storage unit 12, floating gate 22, isolation structure 23, blocking layer 25, tunneling layer 27, and/or the like). An "ideal" cell 10 refers to a cell 10 that conforms to the IPC. Such characteristics may include, but are not limited to: the design of the cells 10, dimensions of the cells 10, layout of the cells 10, material(s) used to fabricate the cells 10 (and/or respective components thereof), fabrication constraints, process type, process size (e.g., transistor size), processes used to fabricate components of the cells 10 (e.g., chemical etching, electroplating, vapor deposition, and/or the like), process corners within the memory structure 113, and/or the like. By way of non-limiting example, the $V_{PGM\_MIN}$ of the IPC (the voltage level required to initiate tunneling within an ideal cell 10) may be based on, inter alia, the design of the charge storage unit 12, material(s) comprising the blocking layer 25, material(s) comprising the tunneling layer 27, the material(s) comprising the substrate 19 (and/or channel region 15), and/or the like. The PR of the IPC (the rate at which Q are injected during tunneling and/or degree to which Q increases the $V_{TH}$ of an ideal cell 10) may be based on similar characteristics, such as the capacitance of the cell 10 and/or blocking layer 25 (e.g., interpoly capacitance, $C_{PP}$), tunneling characteristics of the tunneling layer 27 (e.g., thickness, impedance, and/or the like), characteristics of the floating gate 22, and/or the like. The IPC may further define programming constraints of ideal cells 10. For example, the $V_{PGM\_MAX}$ and/or $V_{TH\_MAX}$ of an ideal cell 10 may be based on, inter alia, breakdown threshold(s) of the charge storage unit 12 (e.g., the isolation layer 23, blocking layer 25, tunneling layer 27, and/or the like), information pertaining to the amplitude of electric field(s) the cell 10 is designed to withstand (e.g., a maximum electric field the isolation layer 23, blocking layer 25, and/or tunneling layer 27 is designed to withstand), wear characteristics of the cell 10, the $V_{PASS}$ used during read and/or write operations (which my define an upper bound for $V_{TH\_MAX}$), and/or the like.

The programming characteristics of respective cells 10 within the memory 113 may differ from the IPC. Programming characteristics may vary from cell-to-cell, page-to-page, block-to-block, and/or the like. The differences may be due to, inter alia, cell-, page-, and/or block-level variations from the design, fabrication, and/or process characteristics disclosed above, fabrication variations, process variations, process corners, process impurities, and/or the like. Programming characteristics of a cell 10 may determine the "programming speed" and/or "programming sensitivity" of the cell 10 relative to other cells 10 within the memory 115. As used herein, the "programming speed" of a cell 10 refers to the degree and/or rate at which $V_{TH}$ of the cell 10 changes in response to programming pulses (e.g., the amplitude required to initiate tunneling ($V_{PGM\_MIN}$), the rate at which $V_{TH}$ increases in response to programming pulses (PR), and/or the like). A fast cell 10 may refer to a cell that exhibits faster increases to $V_{TH}$ (and/or requires lower-amplitude programming pulses to reach a target level, such as $V_{REF}$) as compared to other cells 10 (e.g., average or ideal cells 10). A fast cell 10 may have a lower $V_{PGM\_MIN}$ and/or higher PR than other cells 10. A slow cell 10 may refer to a cell 10 that exhibits slower increases to $V_{TH}$ (and/or requires higher-amplitude programming pulses to reach a target level, such as $V_{REF}$) as compared to other cells 10. A slow cell 10 may have a higher $V_{PGM\_MIN}$ and/or lower PR than other cells 10. As used herein, the "programming sensitivity" of a cell 10 may refer to sensitivity of cells 10 to programming pulses (e.g., the degree to which cells 10 are worn and/or degraded by such programming pulses). A "sensitive," "program-sensitive" or "more sensitive" cell 10 refers to a cell 10 that is unacceptably worn and/or degraded by programming pulses that would not unacceptably wear and/or degrade other, less sensitive cells 10 (e.g., slow, ideal, and/or average cells 10). Sensitive cells 10 may comprise cells 10 having $V_{PGM\_MAX}$ and/or $V_{TH\_MAX}$ programming characteristics that are lower than those of other, less sensitive cells 10. Sensitive cells 10 may comprise fast cells 10 that would have the $V_{TH}$ thereof raised to, or above, $V_{TH\_MAX}$ by a programming pulse that would not raise the $V_{TH}$ of other, slower cells 10 to the $V_{TH\_MAX}$ thereof. A "non-sensitive" cell 10 refers to a cell 10 that is not unacceptably worn and/or degraded by programming pulses that would unacceptably wear and/or degrade other cells 10 (e.g., fast, ideal, and/or average cells 10). A non-sensitive cell 10 may have a higher $V_{PGM\_MAX}$ and/or $V_{TH\_MAX}$ than other, more sensitive cells 10. In some embodiments, the sensitivity of a cell 10, such as $V_{PGM\_MAX}$ and/or $V_{TH\_MAX}$ may be based on, inter alia, a determined $V_{PGM\_MIN}$ and/or PR of the cell 10. Alternatively, or in addition, $V_{PGM\_MAX}$ and/or $V_{TH\_MAX}$ may be based on a determined error rate of the cell 10, wear level of the cell 10, degradation of the cell 10, usage conditions, determined programming characteristics of the cell 10, and/or the like.

Figure 2E:
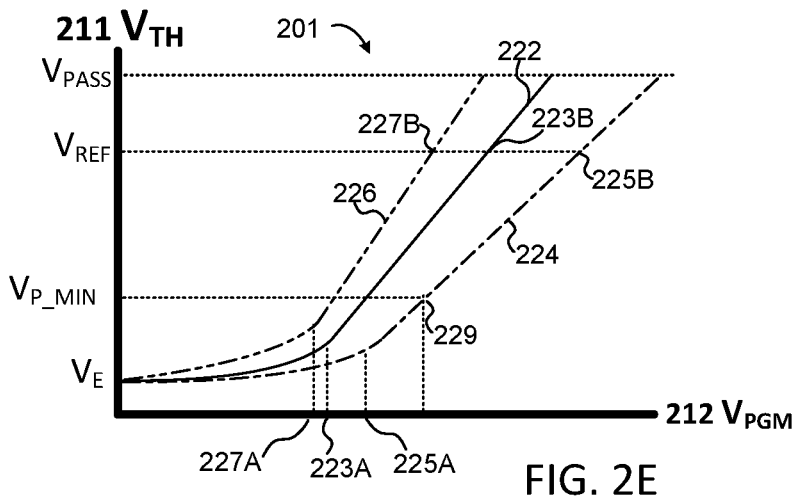
FIG. 2E comprises a plot depicting increases to $V_{TH}$ of cells having different programming characteristics in response to respective programming pulses.

FIG. 2E is a plot 201 illustrating changes to $V_{TH}$ in cells 10 having different programming characteristics in response to programming pulses of varying amplitude (and substantially a same duration). In FIG. 2E, the horizontal axis 212 corresponds to programming pulses of increasing amplitude (and substantially the same duration), and the vertical axis 211 shows increases in cell $V_{TH}$ in response to such programming pulses (from a non-programmed and/or erased state $V_E$, which may correspond to $V_{TH}$ between about −4 and 0 volts). In FIG. 2E, the plot line 222 corresponds to an ideal cell 10, plot line 224 corresponds to a slow cell 10, and plot line 226 corresponds to a fast cell 10. The ideal cell 10 of plot line 222 may exhibit programming characteristics that correspond to the design, fabrication, and/or process characteristics for the memory 115 (e.g., may comprise ideal programming characteristics, as disclosed herein). Alternatively, or in addition, the programming characteristics of an ideal cell 10 may refer to an average, median, and/or mean programming characteristics of the cells 10 within the memory 115 (and/or a particular region thereof). Programming characteristics of the slow and fast cells 10 (corresponding to plot lines 224 and 226, respectively) may differ from the ideal cell 10, as disclosed above. The slow and/or fast cells 10 may comprise cells 10 that deviate from the design, fabrication, and/or processing characteristics of the memory 115. Alternatively, or in addition, the slow and/or fast cells 10 may comprise cells 10 with different levels of wear and/or degradation (e.g., the slow cell 10 may have a higher wear and/or degradation level as compared to other cells 10, and the fast cell 10 may have a lower wear and/or degradation level as compared to other cells 10).

As illustrated in FIG. 2E, the $V_{TH}$ of the ideal, slow, and fast cells 10 may change differently in response to programming pulse(s) having the same amplitude and/or duration. Although not depicted in FIG. 2E to avoid obscuring details of the illustrated embodiments, each plot line 222, 224, and 226 may comprise respective non-linear and linear regions, which may be separated by $V_{PGM\_MIN}$ of the ideal, slow, and fast cells 10 (as indicated by points 223A, 225A, and 227A, respectively). Point 223A indicates the programming pulse amplitude that triggers tunneling in the ideal cell 10 ($V_{PGM\_MIN}$ of the ideal cell 10), point 225A indicates the programming pulse amplitude that triggers tunneling in the slow cell 10 ($V_{PGM\_MIN}$ of the slow cell 10), and point 227A indicates the programming pulse amplitude that triggers tunneling in the fast cell 10 ($V_{PGM\_MIN}$ of the fast cell 10). As illustrated in FIG. 2E, the $V_{PGM\_MIN}$ of the fast cell 10 may be lower than the $V_{PGM\_MIN}$ of the ideal cell 10, which is lower than the $V_{PGM\_MIN}$ of the slow cell 10. As such, a programming pulse that initiates tunneling in the fast cell 10 may not initiate tunneling in the ideal and/or slow cells 10, and a programming pulse that initiates tunneling in the fast and ideal cells 10 may not initiate tunneling in the slow cell 10. As such, the slow, ideal, and fast cells 10 may transition from a non-linear to a linear regime at different programming pulse amplitudes. Moreover, the rate at which $V_{TH}$ increases in response to programming pulses of the same amplitude and/or duration may differ between the slow, ideal, and fast cells 10 (e.g., the linear scaling factor PR of the fast cell 10 may be higher than the PR of the ideal cell 10, which may be higher than the PR of the slow cell 10).

In FIG. 2E, point 223B on plot line 222 indicates the programming pulse amplitude configured to raise $V_{TH}$ of an ideal cell 10 from $V_E$ to $V_{REF}$, point 225B on plot line 224 indicates the programming pulse amplitude configured to raise the $V_{TH}$ of a slow cell 10 from $V_E$ to $V_{REF}$, and point 227B on plot line 226 indicates the programming pulse amplitude configured to raise the $V_{TH}$ of a fast cell 10 from $V_E$ to $V_{REF}$. The programming pulse amplitude corresponding to point 223B may be referred to as the "optimal" programming pulse amplitude ($V_{PGM\_OPT}$), which may define the amplitude of a single programming pulse configured to raise the $V_{TH}$ of an ideal and/or average cell 10 from $V_E$ to $V_{REF}$ at a particular pulse duration. In addition, the programming pulse amplitude corresponding to point 225B may be referred to as a "high" programming pulse amplitude ($V_{PGM\_HIGH}$), which may define the amplitude of a single programming pulse configured to raise the $V_{TH}$ of slow cells 10 from $V_E$ to $V_{REF}$ at the particular pulse duration, and the programming pulse amplitude corresponding to point 227B may be referred to as the "fast" programming pulse amplitude ($V_{PGM\_LOW}$), which may define the amplitude of a single programming pulse configured to raise the $V_{TH}$ of fast cells 10 from $V_E$ to $V_{REF}$ at the particular pulse duration.

Although not depicted in FIG. 2E to avoid obscuring details of the illustrated embodiments, the slow, ideal, and fast cells 10 may comprise and/or correspond to respective programming constraints, which may include, but are not limited to: a maximum pulse amplitude ($V_{PGM\_MAX}$), a maximum voltage threshold ($V_{TH\_MAX}$), and/or the like, as disclosed herein. $V_{PGM\_HIGH}$, $V_{PGM\_OPT}$, and $V_{PGM\_LOW}$ may define the amplitude of programming pulses configured to fully program cells 10 having different programming characteristics (e.g., slow, ideal, and fast cells 10, respectively).

The memory control circuitry 130 may configure the write circuit 134 and/or driver circuitry 136 to implement write operations within the memory 115, which may comprise generating programming pulses configured to "fully program" groups of cells 10 to respective target states in parallel (e.g., pages 38 and/or blocks 30). As used herein, "fully programming" a cell 10 to a target state refers to raising $V_{TH}$ of the cell 10 to at least a voltage level, potential, and/or value for verifying, validating, and/or reading the target state (e.g., raising $V_{TH}$ of the cell 10 to $V_{REF}$ used to distinguish programmed cells 10 from non-programmed cells 10). The groups may comprise cells 10 having different programming characteristics (and/or the programming characteristics of respective cells 10 may vary from group to group, e.g., programming characteristics, which may vary on a cell-by-cell basis, page-by-page basis, block-by-block basis, and/or the like, as disclosed herein). Applying a programming pulse having an amplitude and/or duration configured to fully program certain types of cells 10 (e.g., slow cells 10) may result in over-programming other types of cells 10 (e.g., ideal and/or fast cells 10). For example, in the FIG. 2E embodiment, a programming pulse having amplitude ($V_{PGM\_HIGH}$) may be configured to fully program slow cells 10, but may result in over-programming other cells 10 (e.g., ideal and/or fast cells 10), which may comprise over-pulsing the other cells 10 (e.g., applying a programming pulse having an amplitude that exceeds $V_{PGM\_MAX}$ of such cells 10) and/or over-charging the other cells 10 (e.g., raising the $V_{TH}$ of such cells 10 above $V_{PASS}$ and/or $V_{TH\_MAX}$ thereof). Similarly, applying a programming pulse having an amplitude configured to fully program an ideal cell 10 ($V_{PGM\_OPT}$) may result in over-programming more sensitive cells 10 (e.g., fast cells 10), and may not fully program less sensitive cells (e.g., slow cells 10).

In some embodiments, the memory control circuitry 130 may manage variations in programming characteristics by, inter alia, implementing verified write operations. Performing a verified write operation to program data to a group of cells 10 (e.g., a page 38) may comprise: a) applying a series of programming pulses to the group of cells 10; and b) performing foreground verify operations between one or more of the programming pulses of the series, each foreground verify operation to identify program verified cells 10 of the group, which may be inhibited from subsequent programming pulses of the series. The program/verify cycles may continue until substantially all (and/or a threshold number) of the cells 10 have been program verified. The foreground verify operation(s) may be interleaved between one or more of the programming pulses of the series, and may be performed on cells 10 that have not yet been program verified (e.g., may comprise sensing and/or reading respective non-program verified cells 10, as disclosed herein). The amplitude and/or duration of the initial programming pulses in the series may be configured to avoid over-programming faster and/or more sensitive cells 10 (e.g., fast cells 10). In the FIG. 2E embodiment, an initial programming pulse of the series may have an amplitude at or below $V_{PGM\_MIN}$ of fast cells 10 (point 227A on plot 226). The amplitude and/or duration of the programming pulses may be increased during the series (e.g., the amplitude of programming pulses may be incrementally increased by a trim factor, as follows: $V_{PGM}(n)=V_{PGM\_INIT}+n \cdot V_{PGM\_TRIM}$, where $V_{PGM}(n)$ is the amplitude of pulse n in the series, $V_{PGM\_INIT}$ is an amplitude of the first programming pulse in the series, and $V_{PGM\_TRIM}$ is a determined trim factor). Inhibiting a cell 10 may comprise biasing the bit line 34 coupled thereto at a determined voltage, rather than coupling the bit line 34 to ground (e.g., driving a program inhibit voltage potential ($V_{INH}$) on bit lines 34 coupled to program verified cells 10). In verified write operation, fast cells 10 may be program verified after initial programming pulses of the series are applied, and may be inhibited thereafter, which may prevent over-programming of such cells 10 by higher amplitude programming pulses applied later in the series. In FIG. 2E, fast cells 10 of plot line 226 may be program verified in response to programming pulse(s) at or about point 227B; ideal cells 10 may be program verified after subsequent programming pulses of the series are applied (e.g., in response to programming pulse(s) at or about point 223B on plot line 222); and slow cells 10 may be program verified in response to later programming pulses in the series (e.g., in response to programming pulse(s) at or about point 225B on plot line 224).

Executing a command by use of a verified write operation may comprise: a) sequentially applying a series of programming pulse(s) to a group of cells 10; b) performing at least one foreground verification operation (after one or more programming pulses of the series); and c) completing the verified write operation (and corresponding command) in response to determining that all (and/or a threshold number) of the cells 10 have been program verified. Although verified write operations may prevent under- and/or over-programming, such operations may impose a substantial latency overhead. The latency of a command implemented by use of a verified write operation may comprise: a) the latency required to sequentially generate and/or apply a series of foreground programming pulses to a group of cells 10; b) the latency required to perform foreground verification operations in response to respective foreground programming pulses; and/or c) the latency required to implement such program/verify processing until substantially all of the cells have been program verified. A verified write operation (and corresponding foreground command) may not be acknowledged as complete until at least one foreground verification operation has been completed. Moreover, the latency of verified write operations may be variable since, inter alia, the latency of a verified write operation may depend on the number of program/verify cycles required before substantially all (or a threshold number) of the cells 10 are program verified, which may vary from operation to operation (e.g., in accordance with programming characteristics of the cells 10 being programmed).

In some embodiments, the memory control circuitry 130 may be configured to reduce the latency of programming operations by, inter alia, implementing unverified, single-pulse programming operations. As used herein, an "unverified, single-pulse program" (USPP) operation refers to a programming operation that is completed in response to a single programming pulse. A USPP may be completed without verifying the cells 10 being programmed (e.g., without verifying, reading, and/or sensing the cells 10). In one embodiment, a USPP operation may comprise an over-program USPP operation, which may comprise applying a single "over-program" pulse to the cells 10 being programmed. As used herein, an "over-program" pulse refers to a programming pulse configured to raise the $V_{TH}$ of each cell 10 of the memory 115 to at least $V_{REF}$ (or another specified level), regardless of the programming characteristics thereof. The amplitude and/or duration of an over-program pulse may be configured to guarantee that the $V_{TH}$ of the cells 10 being programmed will be raised to at least $V_{REF}$ (e.g., may have an amplitude and/or duration corresponding to point 225B of FIG. 2D). An over-program pulse may comprise a programming pulse configured to fully program slow cells 10 (e.g., configured to have an amplitude of at least $V_{PGM\_HIGH}$). Although over-program USPP operations may ensure that slow cells 10 are fully programmed in response to a single programming pulse, over-program USPP operations may result in over-programming other cells 10 (e.g., fast, ideal, and/or average cells 10). In some embodiments, the cells 10 may be configured to compensate for over-programming by, inter alia, being configured to limit the charge and/or $V_{TH}$ thereof (e.g., by isolating the cells, providing for draining over-charged cells 10, configuring the floating gate 22, isolation structure 23, blocking layer 25, and/or tunneling layer 27 to reject charge above a determined level, and/or the like). Alternatively, or in addition, the memory control circuitry 130 may be configured to compensate for over-program USPP operations by, inter alia, increasing the $V_{PASS}$ voltage level(s) used to bias unselected cells 10 to above the $V_{TH}$ of the over-programmed cells.

As disclosed above, performing an over-program USPP operation on a group of cells 10 in response to, inter alia, a command may comprise applying a single over-program pulse to the cells 10 having an amplitude and/or duration configured to raise $V_{TH}$ of the cells 10 being programmed to target states thereof regardless of the programming characteristics thereof (e.g., including slow cells 10). The over-program USPP operation (and corresponding command) may be completed in response to applying the single programming pulse. The over-program USPP operation (and corresponding command) may be completed without verifying, reading, and/or sensing the cells 10. As such, the latency of an over-program USPP operation may be significantly lower than the latency of conventional, verified write operations. However, although over-program USPP operations may provide higher performance, over-program USPP operations may require compensation for higher cell $V_{TH}$ levels, may create string cut-off conditions, and/or may result in increased wear and/or degradation within the memory 115. Moreover, cell programming may not be verified, which may result in failure to identify failed cells 10 until data are attempted to be read from the cells 10.

In some embodiments, the memory control circuitry 130 may be configured to implement under-program USPP operations. An under-program USPP operation may comprise applying single "under-program" pulse to the cells 10 being programmed. As used herein, an "under-program" pulse refers to a programming pulse configured to raise the $V_{TH}$ of cells 10 to at least a minimum level ($V_{P\_MIN}$), while preventing over-programming of substantially any of the cells 10, regardless of the programming characteristics thereof. An under-program pulse may refer to a programming pulse having an amplitude and/or duration corresponding to point 227B and/or 229 of FIG. 2D (an amplitude of about $V_{PGM\_LOW}$). The single under-program pulse may be configured to fully program fast cells 10 while other cells 10 remain under-programmed. As used herein, an under-programmed cell 10 refers to a cell 10 having a $V_{TH}$ that has been increased above an initial level (e.g., $V_E$) towards a target level ($V_{REF}$) by a programming pulse, but that remains below the target level after having the programming pulse applied thereto (e.g., has a $V_{TH}$ above $V_E$, but below $V_{REF}$). Alternatively, or in addition, an under-programmed cell 10 may refer to a cell 10 having $V_{TH}$ that has been raised to at least a minimum level below $V_{REF}$ (e.g., within a margin of $V_{REF}$). In some embodiments, the single under-program pulse may be configured to raise the $V_{TH}$ of substantially all of the cells 10 being programmed (including slow cells 10) to at least a minimum level (e.g., minimum level of an under-programmed cell, shown as $V_{P\_MIN}$ in FIG. 2E), while preventing over-programming of substantially any of the cells 10 (e.g., fast cells 10, if any). The under-program pulse may be configured to have an amplitude and/or duration corresponding to point 229 (about the amplitude and/or duration corresponding to the point 227B, e.g., $V_{PGM\_LOW}$). As disclosed above, the amplitude and/or duration of the under-program pulse(s) may be configured to raise the $V_{TH}$ of substantially all of the cells 10 (including slow cells 10) to at least $V_{P\_MIN}$, while preventing over-programming of substantially any of the cells 10 (including fast, ideal, and/or average cells 10). In one embodiment, the memory control circuitry 130 configures the write circuit 134 (and/or drive circuitry 136) to implement an under-program USPP operation on a group of cells 10 by, inter alia, applying a single under-program pulse to the group. The under-program USPP operation may be completed in response to applying the under-program pulse and without verifying, reading, and/or sensing the cells 10. The under-program USPP operation may be completed while the $V_{TH}$ of one or more of the cells 10 remains below $V_{REF}$.

Figure 2F:
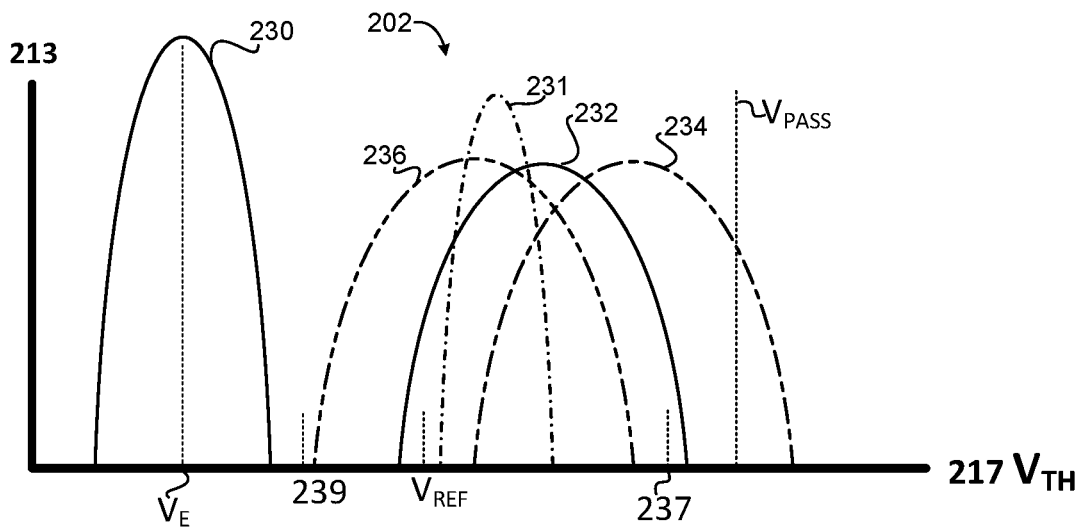
FIG. 2F depicts exemplary $V_{TH}$ distributions.

FIG. 2F is a plot 202 illustrating exemplary cell $V_{TH}$ distributions. The vertical axis 211 may correspond to increasing cell count, and the horizontal axis 217 may correspond to increasing $V_{TH}$ of the cells Distribution 230 illustrates an exemplary $V_{TH}$ distribution of cells 10 in the erased and/or non-programmed state. Distribution 230 illustrates the $V_{TH}$ of respective cells 10 after the memory control circuitry 130 configures the write circuit 134 (and/or driver circuitry 136) to implement operations to erase and/or initialize the respective cells 10 (and/or respective blocks 30). The distribution 230 of erased cells 10 may be centered at about $V_E$, which may be between −4 and 0 volts.

Distribution 231 shows an exemplary $V_{TH}$ distribution of cells 10 programmed to $V_{REF}$ in respective verified write operation(s) (e.g., multi-cycle write operations, each cycle including foreground verification, as disclosed herein). As illustrated, the verified write operation(s) may yield a relatively tight $V_{TH}$ distribution 231 at or above $V_{REF}$ (outliers, such as failed cells 10 or the like are not depicted to avoid obscuring details of the disclosed embodiments). The latency of the verified write operation(s) may, however, be relatively high since, inter alia, each operation requires at least one foreground verification before completion. Each verified write operation may comprise a variable number of program/verify cycles, each requiring completion of a respective foreground verification operation.

Distribution 232 illustrates an exemplary $V_{TH}$ distribution of cells 10 in response to applying an "optimal" programming pulse thereto (a single programming pulse having an amplitude and/or duration corresponding to point 223B of FIG. 2D, e.g., an amplitude of about $V_{PGM\_OPT}$). The $V_{TH}$ distribution 232 (as well as distributions 234 and 236) may correspond to cells 10 after a certain level wear and, as such, may be wider than corresponding distributions of new, unworn cells 10 (e.g., the distributions 232, 234, and/or 236 may correspond to cells 10 that have endured a particular number of program-erase cycles). As illustrated in FIG. 2F, in response to an optimal programming pulse, most of the cells 10 may be fully programmed (have a $V_{TH}$ of at least $V_{REF}$). A few slow cells 10, however, may remain under-programmed (e.g., have $V_{TH}$ below $V_{REF}$ in response to the single pulse). Moreover, the single programming pulse at $V_{PGM\_OPT}$ may over-program a few sensitive cells 10 (faster cells 10). As illustrated, distribution 232 exceeds point 237, which may correspond to a maximum $V_{TH}$ of one or more cells 10. The optimal distribution 232 may, however, remain below $V_{PASS}$, which may prevent cut-off conditions.

Over-program distribution 234 illustrates an exemplary $V_{TH}$ distribution of cells 10 in response to applying a over-program pulse thereto (a single programming pulse having an amplitude and/or duration configured to fully program cells 10 regardless of the programming characteristics thereof, including, e.g., slow cells 10). The amplitude and/or duration of the over-program pulse of distribution 234 may correspond to point 225B of FIG. 2D (e.g., have an amplitude of about $V_{PGM\_HIGH}$). As illustrated, the single over-program pulse may fully program substantially all of the cells 10 (e.g., raise the $V_{TH}$ of substantially all of the cells 10 to at least $V_{REF}$). The single over-program pulse may, however, over-program a substantial number of the cells 10. The over-program distribution 234 may exceed $V_{TH\_MAX}$ of a substantial proportion of the cells 10. Moreover, the $V_{TH}$ of a few faster cells 10 may exceed $V_{PASS}$, which may result in cut-off conditions (unless the cells 10 and/or memory control circuitry 130 are configured to compensate for such over-programming by, e.g., limiting $V_{TH}$ of the cells 10, increasing $V_{PASS}$ to a higher level, and/or the like, as disclosed herein).

Under-program distribution 236 illustrates an exemplary $V_{TH}$ distribution of cells 10 in response to applying an under-program pulse thereto (a single programming pulse having an amplitude and/or duration configured to raise the $V_{TH}$ of substantially all of the cells 10 to at least a minimum level, such as $V_{P\_MIN}$, regardless of the programming characteristics thereof, while avoiding over-programming substantially any of the cells 10). As illustrated, in response to a single under-program pulse: the $V_{TH}$ of substantially all of the cells 10 may be at least $V_{P\_MIN}$ (represented as point 239 in FIG. 2F); some of the cells 10 may be fully programmed (have $V_{TH}$ above $V_{REF}$); and substantially none of the cells 10 are over-programmed. A substantial proportion of the cells 10 may, however, remain under-programmed (e.g., have $V_{TH}$ below $V_{PASS}$ and the $V_{TH\_MAX}$ of more sensitive cells, point 237). A few of the cells 10, however, may be under-programmed (have a $V_{TH}$ within a margin below $V_{REF}$, e.g., above $V_{P\_MIN}$ and below $V_{REF}$).

Referring to FIG. 2C, in some embodiments, the memory control circuitry 130 may be configured to implement high-performance write operations to program groups of cells 10. As used herein, a high-performance write (HPW) operation refers to an operation to program a group of cells 10 that is configured to complete in response to applying a single programming pulse to the group (and without verifying programming of the cells 10). Accordingly, some embodiments of the HPW operations disclosed herein may be referred to as single-pulse program (SPP) operations. In contrast to the USPP operation(s) disclosed above, HPW operations may be configured to ensure cells 10 are fully programmed, while preventing under- and/or over-programming. Embodiments of the disclosed HPW operations may be configured to ensure full programming without incurring the latency involved in conventional, verified program operations (e.g., may be completed in response to applying a single programming pulse, without verifying, reading, and/or sensing cells 10 prior to completion). Accordingly, embodiments of the HPW operations disclosed herein may not include latency due to, inter alia, foreground verification.

The memory device 110 may be configured to receive, fetch, and/or retrieve commands for execution. As disclosed above, executing a command may comprise completing a plurality of operations (e.g., internal operations or commands implemented within the memory device 110 in response to the command). The latency of a foreground command, such as a host command, may be expressed in terms of the latency of the operations required to execute the foreground command, as follows: $L_F = \Sigma_N L_I^n$, where $L_F$ is the latency of the foreground command and $L_I^n$ are latencies of each of N operations required to complete to foreground command (and which are performed sequentially and/or cannot be performed concurrently and/or in parallel). As disclosed above, the latency of a foreground command implemented by a verified write operation may comprise the latency for sequentially applying a series of programming pulses, and the latency for performing one or more foreground verification operations. The HPW operations disclosed herein may avoid foreground verification and, as such, the latency of a foreground command implemented by an HPW operation may include the latency for generating a single programming pulse, and may exclude the latency of foreground verification (e.g., may complete without verifying, reading, and/or sensing the programmed cells 10.

Embodiments of the HPW operations disclosed herein may be further configured to ensure that cells 10 are fully programmed. In some embodiments, an HPW operation to program a group of cells 10 may comprise: a) applying a single programming pulse to the cells 10; and b) scheduling background verification for the group. As used herein, "background verification" refers to one or more background operation(s) configured to ensure full programming of a group of cells 10. As used herein, a "background operation" refers to an operation that does not contribute to the latency of a foreground command and/or foreground operations pertaining to such commands (e.g., may not be required in order to complete a foreground command). A background operation may, therefore, refer to an asynchronous operation that is not synchronized to execution of a foreground command. Background operations may be transparent with respect to foreground command latency and, as such, may comprise transparent commands. Background operations may be implementing during idle periods and, as such, may be referred to as idle and/or off-line operations. As used herein, an "idle period" and/or "idle condition" refers to a time during which foreground commands are not being executed (and/or no foreground commands are pending for execution). Background verification may comprise: a) identifying under-programmed cells 10 of a selected group of cells 10; and b) applying an additional programming pulse to the identified cells 10 (if any). The under-programmed cells 10 may comprise cells 10 having a $V_{TH}$ within a determined margin below a target reference level (e.g., $V_{REF}$). The additional programming pulse may be configured to increase the $V_{TH}$ of the identified cells 10 to at least the target reference voltage level (without over-programming the cells 10). Cells 10 determined to have a $V_{TH}$ at or above the target reference voltage level and/or below the target reference voltage level by more than the determined range may be inhibited during the additional programming pulse. Background verification may further comprise determining a suitable and/or optimal margin for use in distinguishing under-programmed cells 10 from erased (and/or non-programmed) cells 10.

In some embodiments, an HPW operation comprises an unverified, single-pulse program operation that may be completed in response to applying an initial or first programming pulse to a group of cells 10. In contrast to the exemplary over-program USPP operation(s) described herein, the first programming pulse applied during respective HPW operations may be configured to avoid over-programming, despite variations in cell programming characteristics. The first programming pulse may have an amplitude and/or duration configured to prevent cells 10 from exceeding $V_{TH\_MAX}$ thereof, regardless of the programming characteristics thereof (e.g., the first programming pulse may be configured to prevent over-programming of different types of cells 10, including fast, ideal, average, slow and/or other types of cells 10). The amplitude of the first programming pulse may be configured to be below $V_{PGM\_MAX}$ of the cells 10, regardless of the programming characteristics thereof (e.g., may have an amplitude below the $V_{PGM\_MAX}$ of faster and/or more program-sensitive cells 10). The first programming pulse may comprise an under-program pulse, as disclosed herein. The disclosed HPW operations may comprise scheduling background verification operations to ensure the cells 10 are fully programed, without the need for foreground verification. In some embodiments, an HPW operation comprises: a) a foreground operation to apply a first, under-program pulse to selected cells 10, and b) designating the selected cells 10 for background verification to be performed after completion of the HPW operation. Designating the selected cells 10 may comprise scheduling and/or queuing a background verification operation on the selected cells 10. Alternatively, or in addition, the designating may comprise marking and/or recording that the selected cells 10 require background verification. Executing an HPW operation pertaining to a foreground command, such as a host command, may comprise: a) applying the first under-program pulse to the group; and b) indicating, acknowledging, reporting, and/or returning completion of the foreground command in response to applying the first under-program pulse. Applying the first under-program pulse may comprise designating the group for background verification, as disclosed above.

The background verification of a group of cells 10 (e.g., a page 38) may comprise implementing background operation(s) to: a) identify cells 10 having $V_{TH}$ within a threshold below a target reference level (e.g., $V_{REF}$); and b) apply a second programming pulse to the identified cells 10 (if any). The second programming pulse may have an amplitude and/or duration configured to fully program the identified cells 10 (e.g., may have a higher amplitude than the first programming pulse initially applied to the group during execution of the HPW operation). The second programming pulse may be applied after reporting completion of the foreground command and, as such, may be referred to as a subsequent programming pulse, a post-write programming pulse, and/or the like. The second programming pulse may supplement the first programming pulse applied to the identified cells 10 and may be configured to raise the $V_{TH}$ of such cells 10 to at least $V_{REF}$. Accordingly, the second programming pulse may comprise an additional and/or corrective programming pulse.

The identified cells 10 may comprise under-programmed cells 10, as disclosed herein. Identifying the under-programmed cells 10 may comprise performing sense operation(s) to identify cells 10 having a $V_{TH}$ within a range between $V_{REF}$ and $V_{REF}$–M, where M is a margin below $V_{REF}$. The margin may be configured to enable under-programmed cells 10 to be distinguished from erased (and/or non-programmed) cells 10 during background verification. The margin may, therefore, comprise and/or correspond to one or more of an: under-program margin, an under-program factor (UPF), a an under-program compensation factor (UPCF) (or compensation factor), an under-program range, a delta value, a delta factor, a delta voltage, an under-program $V_{TH}$ (e.g., $V_{P\_MIN}$ and/or $V_{P\_IMIN}$, as disclosed in further detail herein), and/or the like. In some embodiments, the margin (and/or corresponding UPF, UPCF, compensation factor, $V_{P\_MIN}$, $V_{P\_IMIN}$ and/or the like) may comprise and//or correspond to a constant value. In some embodiments, a same margin may be used for HPW operations performed throughout the memory 115, memory structure 113, respective pages 38, blocks 38, and/or the like. Alternatively, a separate margin may be determined for respective memory units 112, pages 38, groups of pages 38, blocks 30, groups of blocks 30, regions, and/or the like. In some embodiments, the margin (and/or UPF, compensation factor, and/or the like) may be determined and/or adjusted in accordance with programming characteristics of respective cells 10 (e.g., may be adjusted in accordance with wear level(s) of respective cells 10, determined programming characteristics of the respective cells 10 and/or respective groups thereof, $V_{TH}$ distribution curves derived from sense operations performed on the respective cells 10, and/or the like). In some embodiments, the margin, UPF, and/or other information for identifying under-programmed cells 10 within a group of cells 10 may be determined during background verification of the group (e.g., based on a distribution of $V_{TH}$ of the cells 10 of the group in response to applying a single programming pulse of an HPW operation to the group).

The HPW operations disclosed herein may be implemented in response to respective foreground commands (e.g., write commands). The HPW operations may comprise validating programming a page 38 after reporting completion of the corresponding write command. The disclosed HPW operations may comprise: a) reporting completion of the HPW operation in response to applying an initial, foreground programming pulse to the page 38, and b) marking the page 38 for post-write validation to be completed subsequent to reporting completion of the write command. The post-write validation may comprise: identifying under-programmed cells 10 of the page 38, and applying an additional, corrective programming pulse to the under-programmed cells 38 (if any). The post-write validation may be implemented in one or more background and/or asynchronous operations, as disclosed herein.

The HPW operations disclosed herein may be implemented in accordance with an HPW configuration. As used herein, an HPW configuration refers to any suitable information pertaining to implementation of an HPW operation on a group of cells 10 (and/or corresponding background verification of the group) including, but not limited to: characteristics of the first and/or single programming pulse to be initially applied to the group of cells 10 (e.g., the amplitude and/or duration of the first programming pulse), information pertaining to background verification of the group, information for use in identifying under-programmed cells 10 (e.g., the under-program margin, UPF, compensation factor, and/or other suitable information for identifying under-programmed cells 10 during background verification, such as the bias levels for background sense operation configured to distinguish under-programmed cells 10 from erased, non-programmed, and/or programmed cells 10, background verification threshold(s), and/or the like), characteristics of the second programming pulse to apply to under-programmed cells 10 of the group during background verification, if any (e.g., the amplitude and/or duration of the second programming pulse), and/or the like. The HPW configuration(s) may be maintained in a configuration store 127. The configuration store 127 may comprise and/or correspond to system storage 125 of the memory device 110. The system storage 125 may comprise any suitable means for storing electronic information including, but not limited to: storage circuitry (e.g., latch circuitry, flip-flop circuitry, and/or the like), one or more registers, RAM, volatile RAM, static RAM (SRAM), dynamic RAM (DRAM), non-volatile storage, the memory 115, and/or the like. The system storage 125 may be accessible to one or more of the device controller 120, memory control circuitry 130, and/or the like.

In some embodiments, HPW operations may be implemented in accordance with a single HPW configuration pertaining to the memory 115 and/or memory structure 113. Alternatively, or in addition, a plurality of HPW configuration(s) may be defined, each corresponding to a respective program region within the memory 115 and/or memory structure 113. As used herein, a "program region" refers to a subset of the cells 10 within the memory 115 (and/or memory structure 113). A program region may correspond to a physical layout and/or arrangement of the cells 10 within the memory structure 113. By way of non-limiting example, a program region may correspond to physical sections of a substrate, die, plane, layer(s), and/or the like. As disclosed above, the programming characteristics of respective cells 10 may vary based on, inter alia, design, fabrication and/or process characteristics thereof. A program region may comprise a region of the memory 115 and/or memory structure 113 comprising cells 10 having similar design, fabrication, and/or process characteristics (e.g., cells 10 within a same process corner). Cells 10 within such program regions may share similar programming characteristics, which may differ from the programming characteristics of cells 10 within other programming regions. In one embodiment, the memory structure 113 may be divided into a plurality of program regions, each program region having a respective HPW configuration. The HPW configuration of a program region may be adapted in accordance with programming characteristics of the cells 10 therein. By way of non-limiting example, a first program region may comprise cells 10 that are faster and/or more program-sensitive than cells 10 within a second region (on average). The HPW configuration for the first program region may configure the first programming pulse to have a lower amplitude and/or duration that the first programming pulse applied to cells 10 within the second program region (e.g., to prevent over-programming of the faster cells 10 within the first program region, and ensure that the slower cells within the second program region are programmed to at least $V_{REF}$– UPF). By way of further non-limiting example, the HPW configuration determined for the second program region may configure the second programming pulse to have a higher amplitude and/or longer duration than the second programming pulse applied to under-programmed cells 10 within the first program region (e.g., to ensure that the slower cells 10 within the second program region are fully programmed and/or prevent over-programming of the faster cells 10 within the first program region). In some embodiments, and as disclosed in further detail herein, the UPF may be based on a $V_{TH}$ distribution of a plurality of cells 10. In the non-limiting example above, the HPW configuration for the first program region may comprise a first UPF determined based on, inter alia, a $V_{TH}$ distribution of cells 10 within the first program region, and the HPW configuration for the second program region may comprise a second UPF, which may be based on, inter alia, a $V_{TH}$ distribution of cells 10 within the second program region, and which may be different from the first UPF.

Figure 2G:
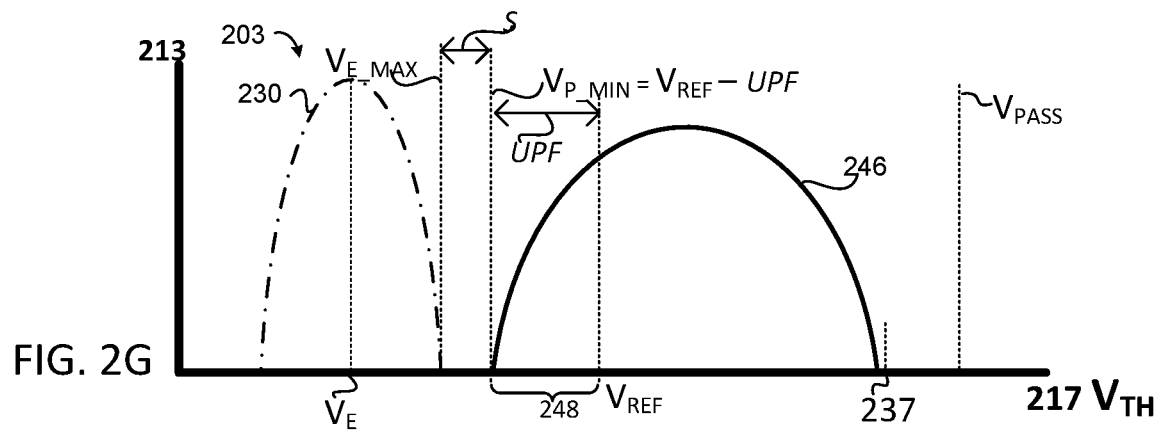
FIG. 2G depicts one embodiment of a $V_{TH}$ distribution and under-program factor corresponding to a single-pulse program operation.

FIG. 2G is a plot 203 illustrating an exemplary cell $V_{TH}$ distribution 246, indicating a distribution of cell 10 $V_{TH}$ levels in response to the first programming pulse of an HPW operation, as disclosed herein. The first programming pulse may comprise an under-program pulse, which may have an amplitude and/or duration configured to avoid programming substantially any of the cells 10, regardless of the programming characteristics thereof (e.g., the distribution 246 may be below $V_{PASS}$ and point 237, which may correspond to a $V_{TH\_MAX}$ of fast and/or more program-sensitive cells 10). The first programming pulse may be further configured to raise the $V_{TH}$ of substantially all of the cells 10 to at least a minimum level, regardless of variations in the programming characteristics thereof. The first programming pulse may have an amplitude ($V_{PGM\_FP}$) configured to increase $V_{TH}$ of substantially all of the cells 10 to within a margin below $V_{REF}$ (e.g., increase $V_{TH}$ to at least a minimum under-program $V_{TH}$, regardless of the programming characteristics of the respective cells 10). In FIG. 2G the margin is depicted as an under-program factor (UPF). The minimum under-program $V_{TH}$ ($V_{P\_MIN}$) may be about $V_{REF}$– UPF. The UPF may be configured to enable under-programmed cells 10 to be distinguished from non-programmed and/or erased cells 10, while preventing over-programming, regardless of variations in cell programming characteristics.

FIG. 2G illustrates an exemplary $V_{TH}$ distribution 230 of erased and/or non-programmed cells 10. The distribution 230 may be centered around $V_E$ and may comprise an upper bound of $V_{E\_MAX}$, which may represent a maximum $V_{TH}$ of an erased and/or non-programmed cell 10. Variations in distribution 230 may be a result of variations in cell programming characteristics, program disturb, pass disturb, and/or the like. The UPF may be configured such that $V_{E\_MAX} < V_{REF}$– UPF, which ensures that under-programmed cells 10 can be distinguished from non-programmed cells 10 during background verification. Identifying under-programmed cells 10 during background verification may comprise sensing the cells 10 at $V_{REF}$–UPF and $V_{REF}$. Cells 10 that are non-conductive at $V_{REF}$–UPF and are conductive at $V_{REF}$ may be identified as being under-programmed cells 10 (since the $V_{TH}$ thereof is within UPF below $V_{REF}$ such that, $(V_{REF}–VD) < V_{TH\_UP} < V_{REF}$, where $V_{TH\_UP}$ is the threshold voltage of an under-programmed cell 10). Erased and/or non-programmed cells 10 may be excluded from misidentification as under-programmed cells 10 since such cells 10 will conduct at $V_{REF}$–UPF (e.g., $V_{E\_MAX} < (V_{REF}–VD)$).

In some embodiments, the memory control circuitry 130 may configure UPF to, inter alia, maintain separation (S) between erased and under-programmed cells. In the FIG. 2G embodiment, the UPF may be configured to maintain separate S as, S=($V_{REF}$−VD)−$V_{E\_MAX}$. As illustrated in plot 204 of FIG. 2H, in some embodiments, the memory control circuitry 130 may configure UPF to be about $V_{E\_MAX}$, such that the separation there between is small. The UPF may be so configured since, inter alia, the initial $V_{TH}$ distribution of erased cells 10 may initially be tighter than depicted by distribution 230. Distribution 230 may be widened due to program, pass, and/or other disturb conditions. Background verification may be scheduled to occur relatively soon after initial programming, while erased cells of the group may remain more tightly clustered around $V_E$ than depicted in distribution 230. Setting the UPF to $V_{E\_MAX}$ may enable the memory control circuitry 130 to accommodate lower and/or wider initial $V_{TH}$ distributions, such as distribution 256, while still reliably distinguishing under-programmed cells 10 from erased and/or non-programmed cells 10 during background verification (and avoiding over-programming).

Figure 2H:
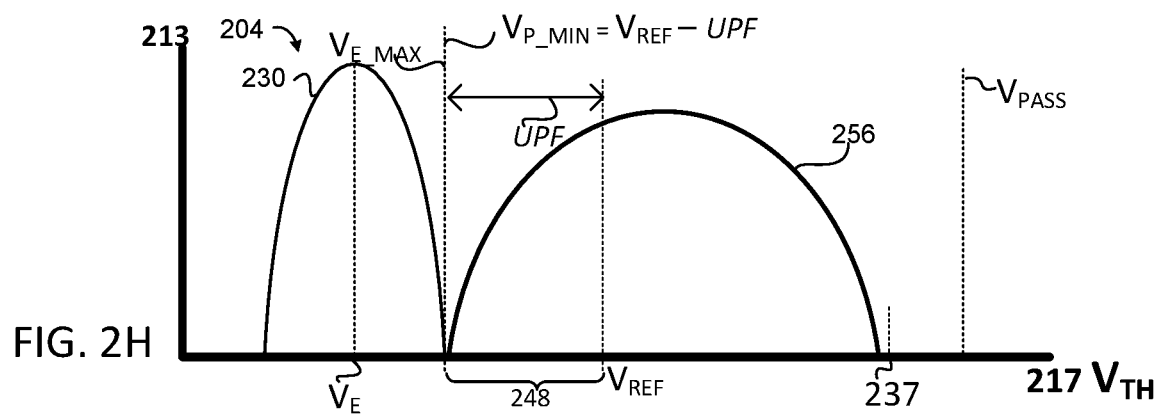
FIG. 2H depicts another embodiment of a $V_{TH}$ distribution and under-program factor corresponding to another embodiment of a single-pulse program operation.
Figure 2I:
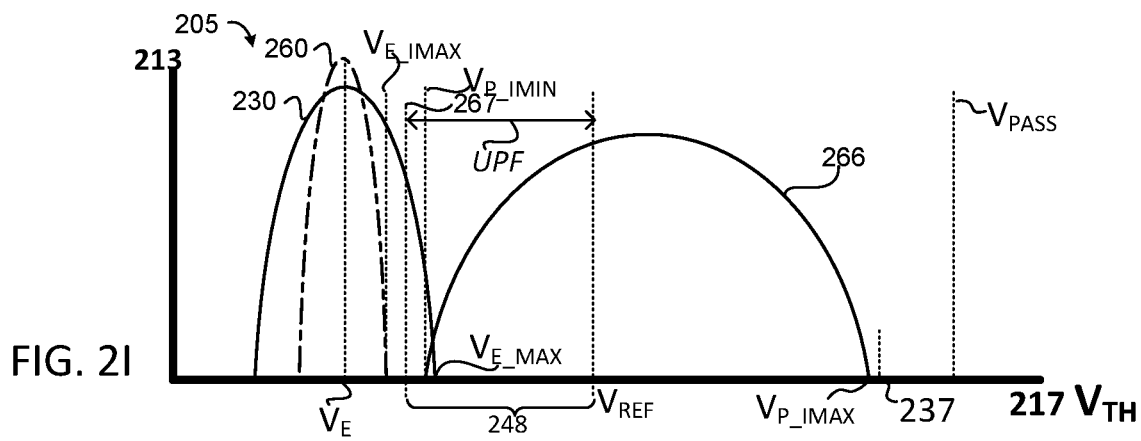
FIG. 2I depicts another embodiment of a $V_{TH}$ distribution and under-program factor corresponding to another embodiment of a single-pulse program operation.

In some embodiments, the memory control circuitry 130 may set the UPF in accordance with an initial $V_{TH}$ distribution of erased cells (initial erase distribution 260 in plot 205 of FIG. 2I). The initial erase distribution 260 may indicate a distribution of cell $V_{TH}$ during an initial period after erasing the respective cells 10. The distribution 260 may spread to distribution 230 thereafter due to, inter alia, disturb and/or other conditions, as disclosed herein. The memory control circuitry 130 may be configured to adapt the UPF in accordance $V_{E\_IMAX}$, which may correspond to a maximum $V_{TH}$ of an erased cell 10 during the initial period (and which may be lower than $V_{E\_MAX}$ of distribution 230). The memory control circuitry 130 may be configured to adapt the UPF to apply first program pulse(s) that accommodate increased variations in cell programming characteristics, prevent over-programming, and retain the ability to distinguish under-programmed cells from erased and/or non-programmed cells (a first program pulse having an amplitude and/or duration yielding widened distribution 266). The widened distribution 266 may range from about $V_{P\_IMIN}$ to $V_{P\_IMAX}$. $V_{P\_IMIN}$ may correspond to an initial $V_{TH}$ of slower, less program-sensitive cells 10 responsive to the first programming pulse (during an initial time period following the first programming pulse), and $V_{P\_MAX}$ may correspond an initial $V_{TH}$ of faster, more program-sensitive cells 10 responsive to the first programming pulse.

As illustrated in FIG. 2I, the distribution 266 may over-lap with the distribution 230 of erased cells. However, if background verification is performed within an initial period after programming and/or erase, the memory control circuitry 130 may retain the ability to distinguish under-programmed cells 10 from erased cells 10 in accordance with the initial erase distribution 260. The memory control circuitry 130 may configure the UPF such that UPF−$V_{REF}$ is about $V_{E\_IMAX}$ (e.g., as illustrated in FIG. 2H). Alternatively, the UPF may be configured to retain a separation (S) between erased and under-programmed cells 10, such that ($V_{REF}$−VD)=$V_{E\_IMAX}$+S (e.g., as illustrated in FIG. 2G). In some embodiments, the UPF may be set in accordance with characteristics of the initial erase distribution 230 and/or cell $V_{TH}$ distribution 266. In some embodiments, the UPF may be set in accordance with point 267, which may comprise voltage between $V_{E\_IMAX}$ and the minimum initial voltage threshold of an under-programmed cell 10 (e.g., $V_{P\_IMIN}$, which may correspond to a minimum of distribution 266).

Figure 2J:
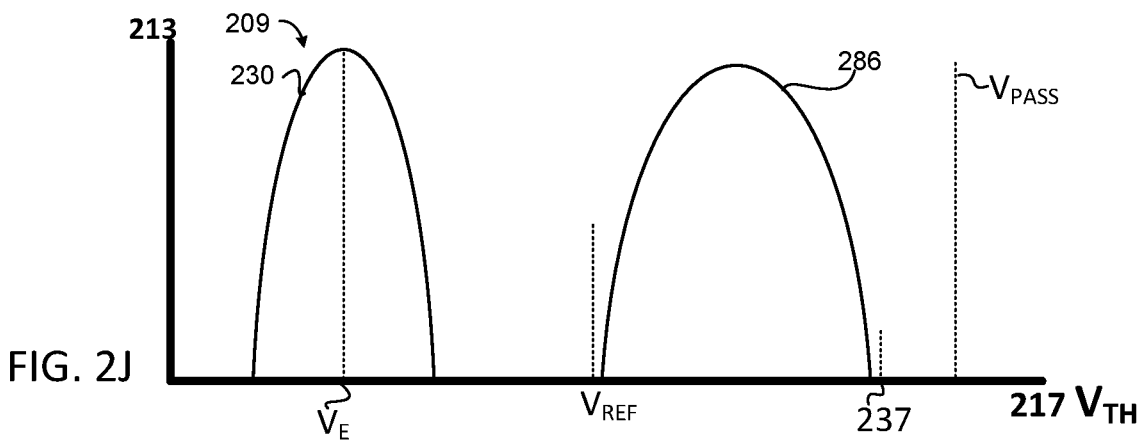
FIG. 2J depicts one embodiment of a $V_{TH}$ distribution after background verification.

The $V_{TH}$ sensed on respective cells 10 may change over time (and/or in response to operation(s) performed within the memory structure 113). The $V_{TH}$ of erased and/or non-programmed cells 10 may change after erasure and/or initialization, and the $V_{TH}$ of programmed (and/or under-programmed) cells 10 may change after application of the first programming pulse. Changes in the $V_{TH}$ of a cell 10 may be due to any number of factors including, but not limited to: charge loss (e.g., leakage of charge Q from the charge storage unit 12 of the cell 10), capacitive coupling, interference coupling, bit line coupling, word line coupling, Yupin coupling effects, program disturb, read disturb, pass disturb, and/or the like. In addition, changes in the sensed $V_{TH}$ of a cell 10 may be caused by, inter alia, sense bias conditions (e.g., the number of cells 10 being sensed in parallel), and/or the like. Changes in sensed $V_{TH}$ may result in widening the $V_{TH}$ distributions disclosed herein. In the FIG. 2I embodiment, widening the $V_{TH}$ distribution of the cells 10 being programmed (distribution 266) may comprise decreasing $V_{P\_IMIN}$ such that the $V_{TH}$ of slower, less program-sensitive under-programmed cells 10 decreases over time. Similarly, widening the $V_{TH}$ of erased and/or non-programmed cells 10 (distribution 260) may comprise increasing the $V_{E\_MAX}$ thereof. The widening may be such that the memory control circuitry 130 loses the ability to accurately distinguish under-programmed cells 10 from erased and/or non-programmed cells 10 during subsequent background verification. As disclosed in further detail herein, FIG. 2J comprises a plot 209 of an exemplary $V_{TH}$ distribution 286 after background verification of the under-programmed cells 10 of $V_{TH}$ distribution 266.

In some embodiments, scheduling background verification may comprise determining a background verification threshold, which may define a time frame within which background verification of a group of cells 10 must be performed in order to, inter alia, ensure accurate differentiation between under-programmed and erased and/or non-programmed cells 10 (e.g., a verification threshold, $\Delta t_{MAX}$). The determined $\Delta t_{MAX}$ may be recorded in an HPW configuration for the group, as disclosed herein. The $\Delta t_{MAX}$ determined for a group of cells 10 may be configured to ensure that background verification may be performed on the group while under-programmed cells 10 can be distinguished from erased cells 10 (at a certain level of reliability). The $\Delta t_{MAX}$ for a group of cells 10 may indicate the time at which the $V_{TH}$ distribution of programmed cells 10 is projected to overlap with the $V_{TH}$ distribution of erased and/or non-programmed cells 10 after application of the first programming pulse (and/or reduce separation therebetween to less than an acceptable threshold). The $\Delta t_{MAX}$ determined for a group may be based, at least in part, on a separation between the initial $V_{TH}$ distributions of erased cells 10 and the cells 10 to which the first programming pulse has been applied (e.g., the margin between $V_{E\_IMAX}$ and $V_{P\_IMIN}$). The time at which the widened distributions of cell $V_{TH}$ are projected to overlap may be expressed as $\Delta t(WR_{P\_DEC}+WR_{E\_INC})+WR_{E\_PGM}=TM$, where $\Delta t$ is an amount of time elapsed from the first programming pulse, $WR_{P\_DEC}$ is a program state widening factor configured to model the rate at which the $V_{TH}$ distribution of programmed cells 10 decreases as a substantially linear function of elapsed time $\Delta t$, $WR_{E\_INC}$ is an erased cell widening factor configured to model the rate at which the $V_{TH}$ distribution of erased cells 10 increases as a substantially linear function of elapsed time $\Delta t$, $WR_{E\_INC}$ is an erased state widening factor configured to model the increase to the $V_{TH}$ of erased cells 10 from initial erasure and/or initialization to application of the first programming pulse (Δt from erasure to application of the first programming pulse), and S is the separation between $V_{E\_IMAX}$ and $V_{E\_IMAX}$. The memory control circuitry 130 may reduce the potential for erase widening errors by, inter alia, reducing the time for which cells 10 are maintained in an erased state before being programmed, which may reduce and/or eliminate $WR_{E\_PGM}$.

The $\Delta t_{MAX}$ for background verification may be set to Δt at which the separation S is equal to the widening of the distributions (e.g., $$\Delta t_{MAX} = \frac{V_{P\_IMIN} - V_{E\_IMAX}}{(WR_{P\_DEC} + WR_{E\_INC})}).$$

Alternatively, or in addition, $\Delta t_{MAX}$ may be set in accordance with a time at which the widened distribution of erased cells 10 is projected to overlap with lower-bound of the under-programmed cells 10 of the group ($V_{REF}$– UPF), which could result in such cells 10 being misidentified as under-programmed cells 10 during background verification. The maximum $V_{TH}$ of an erased cell 10 after time Δt may be expressed as $V_{E\_IMAX}+\Delta t \cdot WR_{E\_INC}+WR_{E\_PGM}$. The $\Delta t_{MAX}$ for the background verification may, therefore, be calculated as the elapsed time at which the maximum $V_{TH}$ of an erased and/or non-programmed cell 10 is projected to reach $V_{REF}$ less the UPF for the background verification, as follows:

$$\Delta t_{MAX} = \frac{V_{REF} - (UPF + WR_{E\_PGM})}{WR_{E\_INC}}.$$

In another embodiment, $\Delta t_{MAX}$ may set in accordance with a time at which the minimum $V_{TH}$ of under-programmed cells 10 is projected to fall below $V_{REF}$– UPF. The minimum $V_{TH}$ of a cell 10 after application of the first programming pulse may be expressed as $V_{P\_IMIN}-\Delta t \cdot WR_{P\_DEC}$. The $\Delta t_{MAX}$ for the background verification may, therefore, be calculated as the elapsed time at which the minimum $V_{TH}$ of an under-programmed cell 10 is projected to reach $V_{REF}$ less the UPF for the background verification, as follows:

$$\Delta t_{MAX} = \frac{V_{REF} - (UPF + V_{P\_IMIN})}{WR_{P\_DEC}}.$$

Although $\Delta t_{MAX}$ is expressed in terms of elapsed time, the disclosure in not limited in this regard. In other embodiments, $\Delta t_{MAX}$ may be a function of operation count or the like (e.g., a number of operation(s) performed on the group and/or proximate to the group).

As illustrated above, the time at which background verification errors are likely to arise may be based on, inter alia, the respective widening rates of erased and programmed cells 10. In some embodiments, the UPF for background verification may be set in accordance with projected widening rates. In embodiments in which $WR_{E\_INC}$ is projected to be about the same as $WR_{P\_DEC}$, the UPF for background verification may be configured to be about between $V_{E\_IMAX}$ and $V_{P\_IMIN}$, as disclosed above (and $\Delta t_{MAX}$ may be simplified as $$\Delta t_{MAX} = \frac{(V_{REF} - VD) - V_{E\_IMAX}}{2WR},$$

where WR is the widening factor of erased and programmed cells 10. By way of non-limiting example, if $WR_{E\_INC}$ is projected to be higher than $WR_{P\_DEC}$ (e.g., the $V_{TH}$ of erased cells 10 is projected to increase at a faster rate than the $V_{TH}$ is projected to decrease), the UPF for background verification may be shifted upwards towards $V_{P\_IMIN}$. By way of further non-limiting example, if $WR_{P\_DEC}$ is projected to be higher than $WR_{E\_INC}$, the UPF for background verification may be shifted downwards towards $V_{E\_IMAX}$. The determined and/or adjusted UPF (and corresponding $\Delta t_{MAX}$) may be recorded in an HPW configuration for the group, as disclosed herein.

Figure 2K:
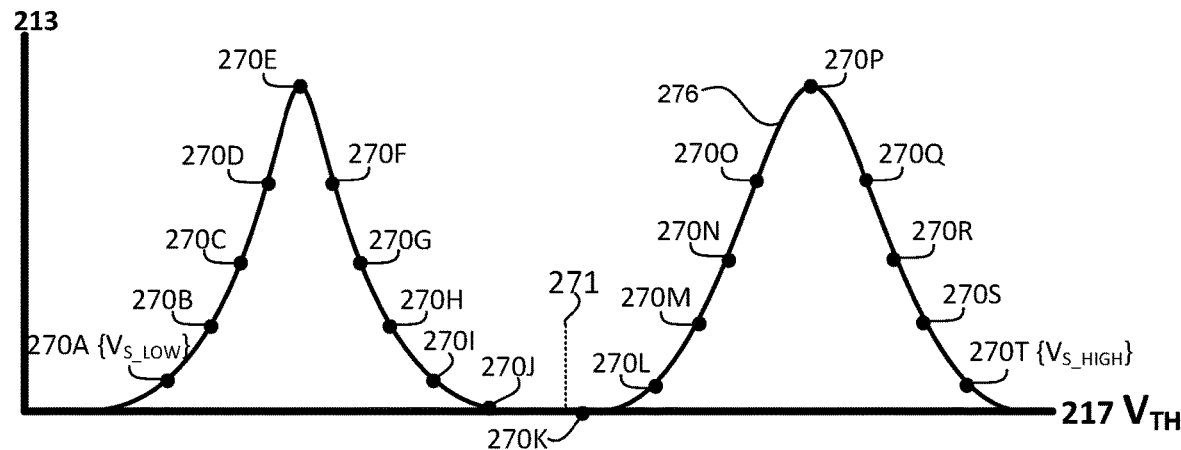
FIG. 2K depicts one embodiment of a $V_{TH}$ distribution curve derived from a plurality of sense operations.

As disclosed above, parameters and/or settings pertaining to HPW operations on respective groups of cells 10 (and/or groups within respective memory regions) may be maintained within respective HPW configuration(s). An HPW configuration may define, inter alia, the amplitude and/or duration of the first pulse, the UPF and/or $\Delta t_{MAX}$ for subsequent background verification operations, the amplitude and/or duration of the second programming pulse to apply to under-programmed cells 10 (if any), and so on. In some embodiments, an HPW configuration may be determined in accordance with design, fabrication, and/or process characteristics for the memory structure 113 (and/or memory region(s) therein). The HPW configuration may be adjusted in accordance with cell-to-cell and/or region-to-region variations in the programming characteristics of the cells 10, wear levels, operating conditions, and/or the like. In some embodiments, an HPW configuration may be determined based on determined $V_{TH}$ distribution of respective cells 10 within the memory 115 (and/or respective memory regions, e.g., the cells 10 of a particular group, page 38, group of pages 38, block 30, group of blocks 30, and/or the like). In some embodiments, a $V_{TH}$ distribution may be derived from sense operations at a plurality of different levels ranging from a level at or below $V_E$ to a level at or above $V_{REF}$ (e.g., up to about $V_{PASS}$). As illustrated in FIG. 2K, a $V_{TH}$ distribution curve 276 may be determined by, inter alia, performing a plurality of sense operations 270, each sense operation 270A-T performed at a respective sense level ranging from a low sense level ($V_{S\_LOW}$ of sense operation 270A) to a high sense level ($V_{S\_HIGH}$ of sense operation 270T). $V_{S\_LOW}$ may be about $V_E$ (at about minimum erased cell $V_{TH}$), and $V_{S\_HIGH}$ may correspond to a level at or above $V_{REF}$ (at about $V_{PASS}$ or $V_{TH\_MAX}$). Each sense operation 270 may comprise determining a number of cells having a $V_{TH}$ at or above the sense level thereof (e.g., a count of cells that were conducting during the particular sense operation 270, and were not conducting during a sense operation 270 performed at a next lower sense level). The sense operations 270 may correspond to a $V_{TH}$ distribution of cells 10, including erased cells 10 and programmed cells 10. As illustrated in FIG. 2K, a $V_{TH}$ distribution curve 276 may be derived from the cell counts determined in the respective sense operations 270A-T. The $V_{TH}$ distribution curve 276 may be derived by, inter alia, interpolating the cell counts of the respective sense operations 270A-T, fitting the cell counts to a function, applying the cell counts to a determined distribution model (e.g., a Gaussian distribution model), using the cell counts to determine function and/or model fitting parameters, and/or the like.

A suitable HPW configuration may be determined based on the derived $V_{TH}$ distribution curve 276. A minimum point 271 along the $V_{TH}$ distribution curve 276 may comprise an optimal reference voltage distinguishing programmed cells 10 from non-programmed cells 10. The minimum point 271 may be identified using any suitable technique including, but not limited to: function minimization, gradient descent, a valley search, and/or the like. The minimum point 271 may be used to determine a suitable UPF (e.g., to distinguish under-programmed cells 10 from erased and/or non-programmed cells 10 during background verification). Alternatively, or in addition, the minimum point 271 may be used as a reference voltage level ($V_{REF}$) for distinguishing programmed cells 10 from erased and/or non-programmed cells 10.

Figure 2L:
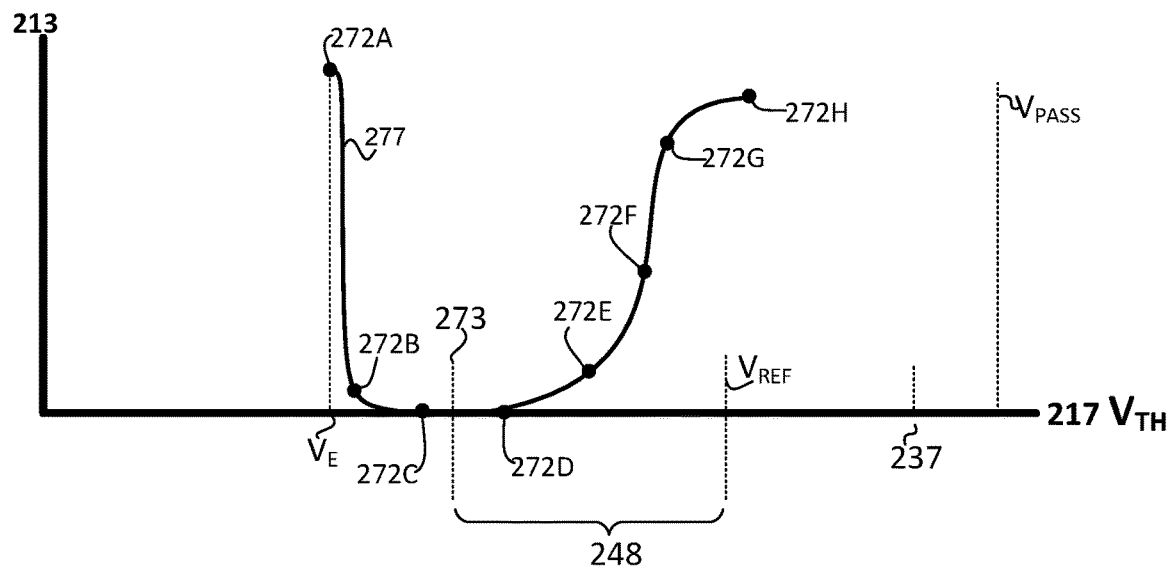
FIG. 2L depicts one embodiment of a $V_{TH}$ distribution curve corresponding to a pulse test operation.

In some embodiments, background verification of a group of cells 10 (e.g., a page 38 and/or group of pages 38) may comprise determining an optimal UPF for accurately distinguishing under-programmed cells 10 from erased and/or non-programmed cells 10 of the group. The background verification may comprise implementing a plurality of sense operations at respective levels, deriving a $V_{TH}$ distribution of the group based on, inter alia, cell counts determined at the respective levels, and using the derived $V_{TH}$ distribution to distinguish under-programmed cells 10 from erased and/or non-programmed cells 10 (and/or determine an optimal UPF for use in identifying the under-programmed cells 10). FIG. 2L illustrates a $V_{TH}$ distribution curve 277 corresponding to a HPW operation on a designated group of cells 10. The $V_{TH}$ distribution curve 277 may be derived from cell counts determined in respective sense operations 272, which may be performed in response to programming the group in an HPW operation (e.g., in response to applying the first programming pulse to selected cells 10 of the group, as disclosed herein). The sense operations 272A-H may be performed at respective sense levels, from a low sense level corresponding to sense operation 272A to a high sense level corresponding to sense operation 272J. The sense operations 272 may be configured to detect a minimum cell count region separating erased and/or non-programmed cells 10 (cells 10 inhibited during the first programming pulse) from cells 10 to which the first programming pulse was applied, including under-programmed cells. As such, the sense operations 272 may span a narrower range of sense levels as compared to the FIG. 2K embodiment: the sense operation 272A may be performed at about $V_E$ (or above); and the sense operation 272J may be performed at about $V_{REF}$ (or below). The $V_{TH}$ distribution curve 277 may be derived from cell counts determined in the respective sense operations 272A-H, as disclosed herein. As illustrated in FIG. 2L, the $V_{TH}$ of the programmed cells 10 may be lower than in FIG. 2K since, inter alia, the $V_{TH}$ distribution curve 277 corresponds to cell $V_{TH}$ before applying the second programming pulse to the under-programmed cells 10 of the group. The $V_{TH}$ distribution curve 277 may be used to distinguish under-programmed cells 10 of the group from erased and/or non-programmed cells 10. The background verification operation may comprise identifying a minimum within the $V_{TH}$ distribution curve 277 (point 273), as disclosed herein. Cells 10 having a $V_{TH}$ that is above the minimum point 273 and below $V_{REF}$ may be identified as under-programmed cells 10 (and may have the second programming pulse applied thereto). Cells 10 having $V_{TH}$ below the minimum point 273 may be identified as erased and/or non-programmed cells 10, which may be inhibited during the second programming pulse (such that the $V_{TH}$ thereof remains substantially unchanged). Cells 10 having $V_{TH}$ at or above $V_{REF}$ may also be inhibited during the second programming pulse (e.g., to prevent over-programming thereof). The optimal UPF for the group may be recorded in a corresponding HPW configuration for use in subsequent background verify operations on the group (and/or other cells 10 and/or groups within a same program region).

In some embodiments, the UPF for background verification may be determined based on determined programming characteristics of cells 10 (as opposed to determining the UPF during respective background verification operations). The UPF may be determined based on, inter alia, pulse test operations performed on respective cells 10 (and/or groups thereof). As used herein, a pulse test operation refers to an operation configured to determine, measure, and/or quantify response(s) to cells 10 when programming pulse(s) are applied thereto (e.g., the response(s) of cells 10 to first, under-program pulses, and/or second programming pulses, as disclosed herein). A program test operation may comprise: a) erasing a test group of cells 10; b) applying a test programming pulse to designated cells 10 of the test group; and c) determining a $V_{TH}$ distribution of the cells 10 within the test group in response to the test programming pulse. The designated cells 10 may be selected randomly (and/or pseudo randomly) from the cells 10 comprising the test group. Alternatively, the designated cells 10 may be selected in accordance with a determined pattern (e.g., a rotating pattern to select certain cells 10 within respective pages 38 and/or blocks 30 within the test group). Cells 10 other than the designated cells 10 may be inhibited during the test programming pulse, as disclosed herein. In some embodiments, the designated cells 10 may comprise a determined number of the cells 10 comprising the test group (e.g., about half or another suitable proportion of the cells 10 comprising the test group). The test programming pulse may comprise an under-program pulse, such as a first programming pulse for an HPW operation, as disclosed herein. The $V_{TH}$ distribution of the cells 10 may be used to determine a suitable UPF (and/or $\Delta t_{MAX}$) for background verification operations, which may be recorded in an HPW configuration, as disclosed herein. The $V_{TH}$ distribution (and/or other pulse test operations) may be used to determine other HPW configuration information, such as suitable characteristics for the initial, first programming pulses of HPW operations, suitable characteristics for the second programming pulses, and/or the like. In some embodiments, the test group may cover substantially all of the cells 10 of the memory 115 (e.g., may comprise cells 10, pages 38, and/or blocks 30 throughout the memory structure 113). Alternatively, the test group may comprise and/or correspond to cells 10 within a particular program region, as disclosed herein (e.g., a group of cells 10, a page 38, a group of pages 38, a block 30, a group of blocks 30, a physical region, and/or the like).

A suitable $\Delta t_{MAX}$ may be based on a projected widening rate of erased and/or programmed cells 10, as disclosed herein (e.g., WR, $WR_{E\_INC}$, $WR_{P\_DEC}$, and/or the like). The $\Delta t_{MAX}$ may be set to a point at which a widened distribution corresponding to the $V_{TH}$ distribution curve 277 provides sufficient differentiation between erased and under-programmed cells. $\Delta t_{MAX}$ may be set to one or more of: a time at which a threshold number of erased cells 10 are projected to have a $V_{TH}$ at or above point 273, a time at which a threshold number of under-programmed cells 10 are projected to have a $V_{TH}$ at or below point 273, and/or the like. The UPF may be adjusted in accordance with different widening rates of erased and/or under-programmed cells 10, as disclosed herein. In some embodiments, the test pulse operation further comprises determining one or more "widened" $V_{TH}$ distribution curves of the cells 10 after determined elapsed time periods following the initial programming pulses, which may comprise performing sense operations after the determined elapsed time periods, and deriving the widened $V_{TH}$ distribution curves therefrom. The widened distribution curves may indicate the rate at which $V_{E\_IMAX}$ of the erased cells 10 increases (e.g., $WR_{E\_INC}$) and/or the rate at which $V_{P\_IMIN}$ decreases ($WR_{P\_DEC}$), as substantially linear functions of elapsed time (and/or operation count). The UPF may be adjusted accordingly (e.g., shifted up or down depending on the relative values of $WR_{E\_INC}$ and/or $WR_{P\_DEC}$, as disclosed herein).

The optimal UPF and/or $\Delta t_{MAX}$ determined in response to the test pulse operation may be recorded in an HPW configuration, which may be used to control HPW operation(s) on cells 10 within the test group. The test group may correspond to a particular one of a plurality of different program regions. As disclosed above, the test group and/or corresponding program region may correspond to one or more of a group of cells 10, a page 38, a group of pages 38, a block 30, a group of blocks 30, a physical region within the memory 115 and/or memory structure, and/or the like. The HPW configuration may be used to control HPW operations on cells within the particular program region. Other test pulse operations may be performed to, inter alia, determine HPW configuration(s) for other program regions. The pulse test operations disclosed herein may be used to determine other HPW configuration parameters including, but not limited to: a configuration for the first programming pulse applied during HPW operations (e.g., amplitude and/or duration of the first programming pulse), information pertaining to corresponding background verification operations, such as an UPF and/or $\Delta t_{MAX}$; a configuration for the second programming pulse applied to under-programmed cells 10 during background verification; and/or the like.

Determining an HPW configuration for a program region may comprise determining a configuration for the first programming pulse, such that the first programming pulse is configured to program substantially all of the cells 10 within the program region to at least $V_{REF}$–UPF, while preventing over-programming substantially any of the cells 10 within the program region (e.g., such that the first program pulse does not raise the $V_{TH}$ of any of the cells 10 above a $V_{TH\_MAX}$ thereof and/or has an amplitude below $V_{PGM\_MAX}$ of the cells 10 within the program region). A suitable first programming pulse may be determined for a programming region by, inter alia, implementing a series of one or more pulse test operations within the program region, each pulse test operation comprising: a) erasing the cells within the program region, b) applying a test programming pulse to designated cells 10 within the program region, and c) determining a corresponding $V_{TH}$ distribution of the cells 10 within the program region. The test programming pulse may be initially set to an amplitude at or below a lower bound for the cells 10 within the memory region (in accordance with design, fabrication, and/or process characteristics thereof). The amplitude of an initial test programming pulse ($V_{PGM\_T0}$) may be below $V_{PGM\_LOW}$. $V_{TH}$ distribution curves responsive to respective test programming pulses may be determined by performing sense operations at respective sense levels, as disclosed herein.

Figure 2M:
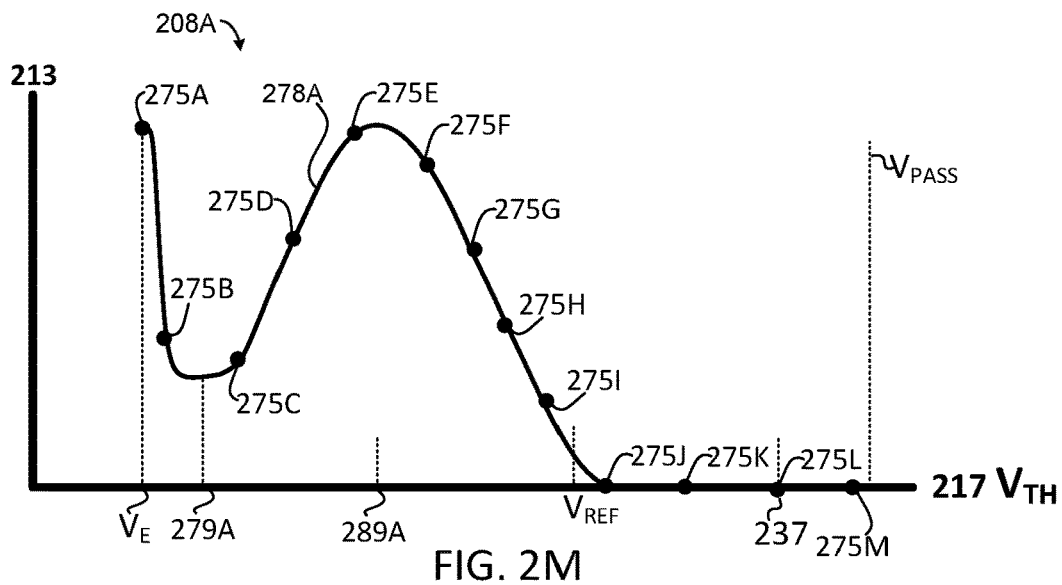
FIG. 2M depicts one embodiment of a $V_{TH}$ distribution curve corresponding to an initial pulse test operation of a series of pulse test operations.

Plot 208A of FIG. 2M depicts one embodiment of a $V_{TH}$ distribution curve 278A derived from sense operations 275 performed after applying an initial test programming pulse to designated cells 10 within a test group corresponding to a particular program region (a programming pulse having amplitude $V_{PGM\_T0}$, which may be substantially lower than $V_{PGM\_LOW}$). The sense operations 275A-M may be performed at respective sense levels ranging from a low sense level of sense operation 275A (about $V_E$) to a high sense level of sense operation 275M (approaching $V_{PASS}$). The $V_{TH}$ distribution curve 278A may be derived from cell counts determined in the respective sense operations 275A-M, as disclosed herein. The $V_{TH}$ distribution curve 278A may indicate whether the initial test programming pulse is suitable for HPW operations and, in particular, whether the initial test programming pulse: a) enables under-programmed cells 10 to be distinguished from erased and/or non-programmed cells 10, and b) prevents over-programming of substantially any of the designated cells 10. In the FIG. 2M embodiment, the initial programming pulse may be determined to prevent over-programming since, inter alia, the $V_{TH}$ distribution 278A remains well below $V_{TH\_MAX}$ (point 237) and $V_{PASS}$. The initial programming pulse may, however, be determined to be insufficient to enable under-programmed cells 10 to be distinguished from erased and/or non-programmed cells 10. The initial programming pulse may be determined to be insufficient in response to, inter alia, determining that no suitable minimum exists between $V_E$ and $V_{REF}$ (e.g., the $V_{TH}$ distribution curve 278A fails to reach a sufficiently low level within the $V_{TH}$ range between $V_E$ and $V_{REF}$). In FIG. 2M, the minimum point 279A between $V_E$ and $V_{REF}$ may exceed a cell count threshold, indicating that substantial overlap exists between erased and under-programmed cells 10. Alternatively, or in addition, the initial programming pulse may be determined to be insufficient in response to determining that an average and/or median $V_{TH}$ of the designated cells 10 programmed thereby (point 289A) is below $V_{REF}$ by more than a threshold.

As disclosed above, an HPW configuration may be determined in response to a series of pulse test operation(s), each pulse test operation applying a programming pulse having an incrementally increased amplitude and/or duration. The series of pulse test operation(s) may be performed until a suitable and/or optimal HPW configuration is determined. In one embodiment, the amplitude of the test programming pulses may be a function of test pulse operation number n, and the amplitude of test pulse n may be $V_{PGM\_Tn} = V_{PGM\_T0} + n \cdot V_{PGM\_TTRIM}$, where $V_{PGM\_T0}$ is the amplitude of the initial test programming pulse and $V_{PGM\_TTRIM}$ is a test programming pulse trim factor.

Figure 2N:
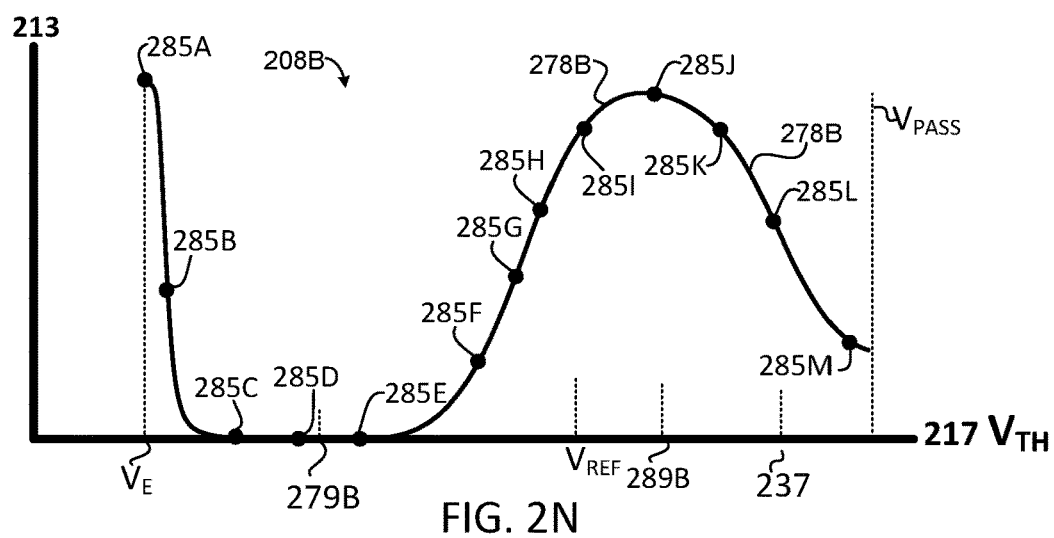
FIG. 2N depicts one embodiment of a $V_{TH}$ distribution curve corresponding to another test pulse operation in a series of pulse test operations.

FIG. 2N comprises a plot 208B depicting an embodiment of a $V_{TH}$ distribution curve 278B in response to pulse test operation N in a series of test pulse operations, which may comprise applying a test programming pulse to designated cells 10 within the program region having an amplitude of $V_{PGM\_TN}$. $V_{PGM\_TN}$ may be at or above $V_{PGM\_HIGH}$. The $V_{TH}$ distribution curve 278B may be derived from cell counts determined in sense operations 285A-M performed at respective sense levels, as disclosed herein. The test programming pulse N may be determined to be suitable for distinguishing under-programmed cells from erased cells in response to identifying the minimum point 279B (having a cell count of substantially 0, below the cell count threshold). The minimum point 279B may be used as the UPF for background verification corresponding to the test programming pulse N. Test programming pulse N may, however, be rejected for failing to prevent over-programming. The rejection may be in response to determining that the $V_{TH}$ distribution curve 278B exceeds $V_{TH\_MAX}$ (point 237) and/or $V_{PASS}$. Alternatively, or in addition, the test programming pulse N may be rejected in response to determining that the average and/or median $V_{TH}$ of the designated cells 10 (point 289B) exceeds $V_{REF}$ by more than a threshold amount (and/or is within a threshold of $V_{TH\_MAX}$ and/or $V_{PASS}$).

Figure 2O:
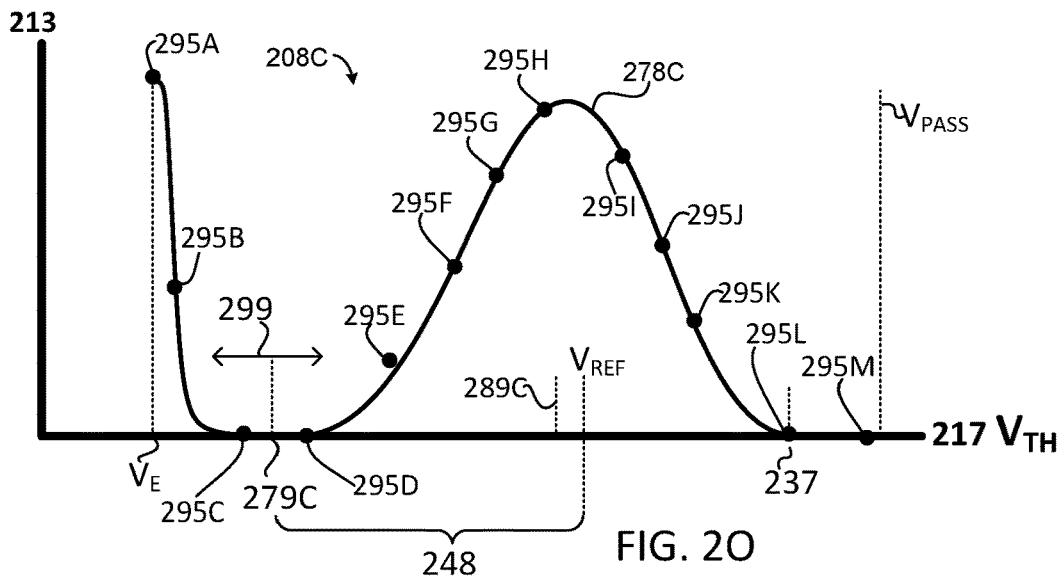
FIG. 2O depicts one embodiment of a $V_{TH}$ distribution curve corresponding to another test pulse operation in a series of pulse test operations.

FIG. 2O comprises a plot 208C depicting an embodiment of a $V_{TH}$ distribution curve 278C in response to another pulse test operation. The pulse test operation of FIG. 2O may correspond to a test pulse operation G between the initial test pulse operation and test pulse operation N, and which may comprise erasing the cells 10 of the test group, and applying a test programming pulse G to designated cells 10 thereof. The amplitude of test programming pulse G may be $V_{PGM\_TG}$, which may be between $V_{PGM\_T0}$ and $V_{PGM\_TN}$ (e.g., may be between $V_{PGM\_LOW}$ and $V_{PGM\_OPT}$). The $V_{TH}$ distribution curve 278C may be derived from cell counts determined in sense operations 295A-M performed at respective sense levels, as disclosed herein. Test programming pulse G may be determined to be suitable for a first programming pulse of HPW operations within the test group in response to determining that the minimum between $V_E$ and $V_{REF}$ (point 279C) on the resulting $V_{TH}$ distribution curve 278C corresponds to a cell count below the cell count threshold (substantially zero), and the cell count remains below the threshold within a suitable $V_{TH}$ range 299 of 279C (indicating that the test programming pulse G provides sufficient separation between erased and under-programmed cells 10), while preventing substantially any of the designated cells 10 from being over-programmed. The test programming pulse G may be determined to prevent over-programming in response to determining that the $V_{TH}$ distribution curve 278C reaches a sufficiently low level (substantially zero) prior to $V_{TH\_MAX}$ (point 237) and/or the average and/or median $V_{TH}$ of the designated cells 10 (point 289C) is within a threshold of $V_{REF}$.

In response to determining that test programming pulse G is suitable for HPW operations in the program region, an HPW configuration for the program region may be determined therefrom. The HPW configuration may comprise a configuration for the first programming pulse, which may configure the first programming pulse to have an amplitude and/or duration corresponding to the amplitude and/or duration of test programming pulse G (e.g., an amplitude of about $V_{PGM\_TG}$). In addition, the UPF of the HPW configuration may be set to about point 279C, and a corresponding $\Delta t_{MAX}$ may be determined, as disclosed herein. In addition, a configuration for the second programming pulse may be defined to configure the amplitude and/or duration thereof to be incrementally higher than the first programming pulse. The amplitude of the second programming pulse may be $V_{PGM\_FP} + V_{PGM\_BGTRIM}$, where $V_{PGM\_FP}$ is the amplitude of the first programming pulse (e.g., about $V_{PGM\_TG}$) and $V_{PGM\_BGTRIM}$ is a trim factor (e.g., about $V_{PGM\_TRIM}$).

In some embodiments, the test pulse operation(s) may further comprise verifying the resulting HPW configuration. Verifying the HPW configuration may comprise, inter alia, using the determined UPF to identify under-programmed cells (cells 10 in region 248 of the $V_{TH}$ distribution curve 278C), and verifying that the number of programmed and under-programmed cells 10 corresponds to the number of designated cells 10 to which the test programming pulse G was applied. Verifying the HPW configuration may further comprise applying a second programming pulse to the identified cells 10, and determining an updated $V_{TH}$ distribution curve of the cells 10. The updated $V_{TH}$ distribution curve may be evaluated to ensure that substantially all of the designated cells 10 have a $V_{TH}$ at or above $V_{REF}$ (none of the designated cells 10 remain in an under-programmed state), and that substantially none of the designated cells 10 have a $V_{TH}$ at or above $V_{TH\_MAX}$ and/or $V_{PASS}$ (substantially none of the designated cells 10 have been over-programmed). The updated $V_{TH}$ distribution curve may be used to determine and/or adjust $V_{REF}$ as disclosed herein (e.g., set $V_{REF}$ to a minimum between a distribution of erased and programmed cells 10). The $V_{REF}$ may be recorded in the HPW configuration, as disclosed herein.

If the HPW configuration is successfully validated, the HPW configuration may be recorded in a configuration store 127, and may be used to control subsequent HPW operations performed within the program region. If the HPW configuration fails validation, the HPW configuration may be adjusted accordingly. By way of non-limiting example: if the updated $V_{TH}$ distribution curve indicates that more than a threshold number of cells 10 were over-programmed, the HPW configuration may be adjusted to, inter alia, decrease the amplitude and/or duration of the second programming pulse (and/or first programming pulse); if the updated $V_{TH}$ distribution curve indicates that one or more cells 10 remained under-programmed after applying the second programming pulse thereto, the HPW configuration may be adjusted to, inter alia, increase the amplitude and/or duration of the second programming pulse (and/or first programming pulse); and/or the like. The adjusted HPW configuration may be validated by, inter alia, performing another pulse test operation within the program region, as disclosed herein.

HPW configurations for use in implementing HPW operations within respective program regions may be determined by, inter alia, performing pulse test operation(s) within the respective program regions, as disclosed herein. The HPW configuration(s) of respective program regions may be updated. Updating the HPW configuration for a program region may comprise validating a current HPW configuration for the program region and adjusting and/or replacing the HPW configuration in response to the validation. Alternatively, updating the HPW configuration for a program region may comprise performing a series of pulse test operations within the program region to determine an updated HPW configuration for the program region, as disclosed herein. The HPW configuration of a program region may be updated in response to any suitable criterion including, but not limited to: wear levels of cells 10 within the program region, error rate for operations within the program region (e.g., program error rate, read error rate, and/or the like), reliability metrics for the region, a time threshold, operating conditions, user preferences, command (s), and/or the like. In some embodiments, the HPW configuration of a program region may be updated periodically and/or after a determined number of program-erase cycles have been performed therein.

As disclosed above, an HPW operation may be completed on a group of cells 10 in response to applying a first programming pulse thereto. A corresponding background verification operation may be performed subsequent to completing the HPW operation (and/or indicating completion of the corresponding foreground command). The background verification operation may comprise identifying under-programmed cells 10 within the group, and applying a second programming pulse to the identified cells 10. The under-programmed cells 10 may be identified based on a determined UPF. The UPF may comprise a pre-determined constant value, which may apply to substantially all of the cells 10 within the memory 115 and/or memory structure 113. Alternatively, the UPF may be based on programming characteristics of the group of cells 10 (e.g., may be determined in response to test pulse operations performed within a program region comprising the group, as disclosed herein). Identifying under-programmed cells 10 may comprise sensing cells 10 having a $V_{TH}$ between $V_{REF}$–UPF and $V_{REF}$ (e.g., $(V_{REF}-\text{UPF}) < V_{TH} < V_{REF}$). Under-programmed cells 10 may be distinguished from fully programmed cells 10, which have a $V_{TH}$ at or above $V_{REF}$ and from erased and/or non-programmed cells 10, which have a $V_{TH}$ at or below $V_{REF}$–UPF. Identifying the under-programmed cells 10 may comprise performing sense operations, including a sense operation at $V_{REF}$, and a sense operation at $V_{REF}$–UPF. The under-programmed cells 10 may be identified as cells 10 sensed as being non-conductive in response to the sense operation at $V_{REF}$–UPF and being conductive in response to the sense operation at $V_{REF}$.

In some embodiments, under-programmed cells 10 may be distinguished from erased and/or non-programmed cells based on a $V_{TH}$ distribution curve, the cells 10 comprising the group responsive to the first programming pulse (e.g., a $V_{TH}$ distribution curve 277 as illustrated in FIG. 2L). The background verification operation may comprise: a) performing a plurality of sense operations at different respective levels (e.g., from about $V_E$ to about $V_{REF}$); b) deriving a $V_{TH}$ distribution curve for the group from cell counts determined in the respective sense operations; and c) determining a minimum point between $V_E$ and $V_{REF}$ (e.g., minimum point 273 of FIG. 2L). Cells 10 having a $V_{TH}$ between the determined minimum point and $V_{REF}$ may be identified as under-programmed cells 10. Cells 10 having a $V_{TH}$ below the minimum point may be identified as erased and/or non-programmed cells 10, and cells 10 having a $V_{TH}$ at or above $V_{REF}$ may be identified as being fully programmed. The under-programmed cells 10 may comprise cells 10 within under-program regions 248 of FIGS. 2G-I, K and N.

The background verification operation on the group may further comprise applying a second programming pulse to the under-programmed cells 10. The second programming pulse may have an amplitude and/or duration configured to raise the $V_{TH}$ of the under-programmed cells 10 to at least $V_{REF}$, while avoiding over-programming of the under-programmed cells 10 and/or other cells 10 of the group. The amplitude and/or duration of the second programming pulse may be higher than the amplitude and/or duration of the first programming pulse of the HPW operation. The amplitude of the second programming pulse may be $V_{PGM\_FP}$+$V_{PGM\_BGTRIM}$, where $V_{PGM\_FP}$ is the amplitude of the first programming pulse and $V_{PGM\_BGTRIM}$ is a trim factor. Cells 10 of the group, other than the identified cells 10, may be inhibited while the second programming pulse is applied to the under-programmed cells 10 (e.g., by biasing bit lines 34 thereof at $V_{INH}$).

Referring back to FIG. 2J, the plot 209 illustrates an exemplary $V_{TH}$ distribution 286 of programmed cells 10 after implementing background verification. The $V_{TH}$ distribution 286 may result from applying a second programming pulse to the under programmed cells 10 within the $V_{TH}$ distribution 266 of FIG. 2I. The second programming pulse may be configured such that the $V_{TH}$ of substantially all of the programmed cells 10 (including under-programmed cells 10) are at or above $V_{REF}$. The second programming pulse may be further configured to avoid over-programming the under-programmed cells 10, such that the $V_{TH}$ of the cells 10 remain below point 237 and/or $V_{PASS}$, regardless of the programming characteristics thereof.

Referring to FIG. 2C, in some embodiments, the memory control circuitry 130 may be configured to implement HPW operations on respective pages 38 within respective block(s) 30 of the memory 115. Each page 38 may comprise a group of cells 10 (e.g., N cells 10). The memory control circuitry 130 may comprise memory controller 131, which may be configured to implement one or more types of program operations, including the HPW operations disclosed herein. The memory controller 131 may comprise one or more of a sequencer, state machine, control logic, microcontroller logic, and/or the like. In response to a first command 140 comprising an instruction to write a data page within the memory 115 (a data unit comprising N data values), the memory controller 131 may implement an HPW operation to store the data page within a designated page 38 in response to a first command 140. The first command may comprise a foreground instruction to store a data page within the memory 115 (e.g., a data unit comprising N data values and/or bits). The first command may comprise and/or correspond to a foreground command, such as a host command.

In response to the first command 140, the write circuit 134 may be configured to apply a single programming pulse to a designated page 38 within the memory 115, as disclosed herein. The single programming pulse may be configured to raise the $V_{TH}$ of first cells 10 of the designated page 38 to at least a minimum level $V_{P\_MIN}$ (e.g., raise the $V_{TH}$ of the first cells 10 above $V_{E\_MAX}$ towards $V_{REF}$ and/or another reference or verify level). The write circuit 134 may be configured to inhibit second cells 10 of the designated page 38 during the single programming pulse, such that the second cells 10 remain in an erased and/or non-programmed state. The first cells 10 may comprise cells 10 being used to store and/or represent first data values (e.g., "0" bit values), and the second cells 10 may comprise cells 10 being used to store and/or represent second data values (e.g., "1" bit values). The first and second cells 10 may be selected in accordance with data being stored within the designated page 38 (e.g., a data unit, data page, data block, and/or the like). While the single programming pulse is applied, the write circuit 134 may be configured to: couple bit lines 34 of the first cells 10 to ground; and bias bit lines 34 of the second cells 10 to $V_{INH}$. The write circuit 134 may complete the first command 140 in response to generating the single programming pulse and/or applying the single programing pulse to the designated page 38.

In some embodiments, the memory controller 131 may configure the write circuit 134 and/or driver circuitry 136 to apply the single programming pulse to selected cells 10 of the designated page 38 in response to the first command 140. The single programming pulse may comprise a first programming pulse configured to: raise substantially all of the selected cells 10 to at least a minimum level (e.g., to at least $V_{REF}$–UPF), and prevent any of the selected cells 10 from being over-programmed, regardless of the programming characteristics thereof. The first programming pulse may comprise an under-program pulse, as disclosed herein. The amplitude and/or duration of the first programming pulse may be defined in an HPW configuration pertaining to the page 38, which may be maintained in the configuration store 127, as disclosed herein. Applying the first programming pulse may comprise generating the first programming pulse on a word line 36 coupled to the cells 10 of the designated page 38, while word lines 36 of other pages 38 are biased at a determined level (e.g., $V_{PASS}$), bit lines 34 of the selected cells 10 are grounded, and bit 34 lines of other, non-selected cells 10 to remain in an erased and/or non-programmed state are biased at $V_{INH}$. The HPW operation (and first command 140) may be deemed as being complete in response to the first programming pulse. The memory controller 131 may be configured to indicate that the first command 140 is complete in response to the first programming pulse. The memory controller 131 may be configured to generate a completion indication 142 corresponding to the first command 140 in response to configuring the write circuit 134 and/or driver circuitry 136 to apply the first programming pulse to the designated page 38. The completion indication 142 may be configured to acknowledge, report, indicate and/or confirm execution of the first command 140. The completion indication 142 may comprise a return code, acknowledgment, and/or the like. The first command 140 may be indicated as being complete before verifying programming of the designated page 38 (and/or selected cells 10 thereof). The first command 140 may be indicated as being complete while one or more cells 10 of the designated page 38 remain in an under-programmed state (e.g., have a $V_{TH}$ within a UPF below $V_{REF}$).

Implementing the HPW operation may further comprise scheduling background verification of the designated page 38. In some embodiments, the memory controller 131 may be configured to schedule background verification in response to configuring the write circuit 134 and/or driver circuitry 136 to implement the HPW operation on the designated page 38. Scheduling background verification may comprise scheduling, queuing, recording, marking, and/or designating a background verification operation to be performed on the designated page 38. Scheduling background verification may comprise recording a background verification entry for the designated page 38, which may comprise information pertaining to the scheduled background verification, such as an identifier and/or address of the designated page 38, the UPF for use in identifying under-programmed cells 10 within the designated page 38, a configuration for the second programmed pulse to be applied to under-programmed cells 10 within the designated page 38 (if any), and/or the like. Alternatively, or in addition, the background verification entry may specify that under-programmed cells 10 are to be distinguished from erased and/or non-programmed cells 10 based on, inter alia, a $V_{TH}$ distribution of the group (e.g., a $V_{TH}$ distribution curve 277 as illustrated above in conjunction with FIG. 2L).

In some embodiments, the background verification entry may further comprise a background verification threshold ($\Delta t_{MAX}$), as disclosed herein. The entry may comprise an expiration time by which the background verification should be completed (e.g., $t_E = t_P + \Delta t_{MAX}$, where $t_E$ is the expiration time for verification of the group, $t_P$ is the time at which the first programming pulse was applied, and $\Delta t_{MAX}$ is the background verification threshold for the group). The background verification entry may comprise and/or reference the HPW configuration for the designated page 38. The background verification entry may be recorded in a background verification queue 129, which may order background verification entries in accordance with the time at which the HPW operations corresponding thereto were completed (and/or the $\Delta t_{MAX}$ by which the respective background verification operations must be completed). The background verification queue 129 may comprise any suitable data structure including, but not limited to: a buffer, a table, a list, an ordered list, a linked list, a first-in-first-out (FIFO), and/or the like. The background verification queue 129 may be maintained within system storage 125, as disclosed herein.

In some embodiments, the memory control circuitry 130 may be configured to, inter alia, detect idle conditions therein. As disclosed herein, an "idle condition" within the memory control circuitry 130 refers to a condition in which the memory control circuitry 130 is not executing foreground command(s) and/or no pending foreground commands are available for execution. In response to detection of an idle condition, the memory control circuitry 130 may determine whether the background verification queue 129 comprises any queued background verification entries and, if so, may configure the memory controller 131 to implement corresponding background verification operations. The memory control circuitry 130 may continue implementing background verification entries while idle (e.g., until receiving a command for execution and/or determining that a pending command is available for execution). Background verification operations may be interleaved with other background operations, such as grooming operations, garbage collection, refresh, and/or the like.

In some embodiments, the memory control circuitry 130 may be further configured to monitor the background verification queue 129 to ensure that corresponding background verification operations are implemented within respective background verification thresholds thereof (e.g., within $\Delta t_{MAX}$ after corresponding HPW operations). The memory control circuitry 130 may monitor respective background verification thresholds in order to, inter alia, determine when such thresholds are nearing expiration (expiration of a background verification operation may refer to $\Delta t_{MAX}$ after the corresponding HPW operation, e.g., the time at which the entry was queued plus $\Delta t_{MAX}$). In response to determining that a background verification entry is nearing the threshold thereof, the memory control circuitry 130 may configure the memory controller 131 to implement the background verification operation, regardless of whether the memory control circuitry 130 is currently idle. The memory control circuitry 130 may configure the memory controller 131 to implement the background verification operation as a foreground operation, which may override other foreground and/or background operations being executed thereby. Implementing background verification in the foreground may comprise implementing the background verification before operations pertaining to one or more foreground commands.

The memory control circuitry 130 may be further configured to flush the background verification queue 129 before power state transitions (e.g., before transitioning to a lower-power state, such as a shutdown state). In response to an indication that the memory device 110 is transitioning to a lower-power state, the memory control circuitry 130 may implement the queued background verification operations, and may prevent the memory device 110 from transitioning to the lower-power state until the queued background verification operations are complete.

Figure 3:
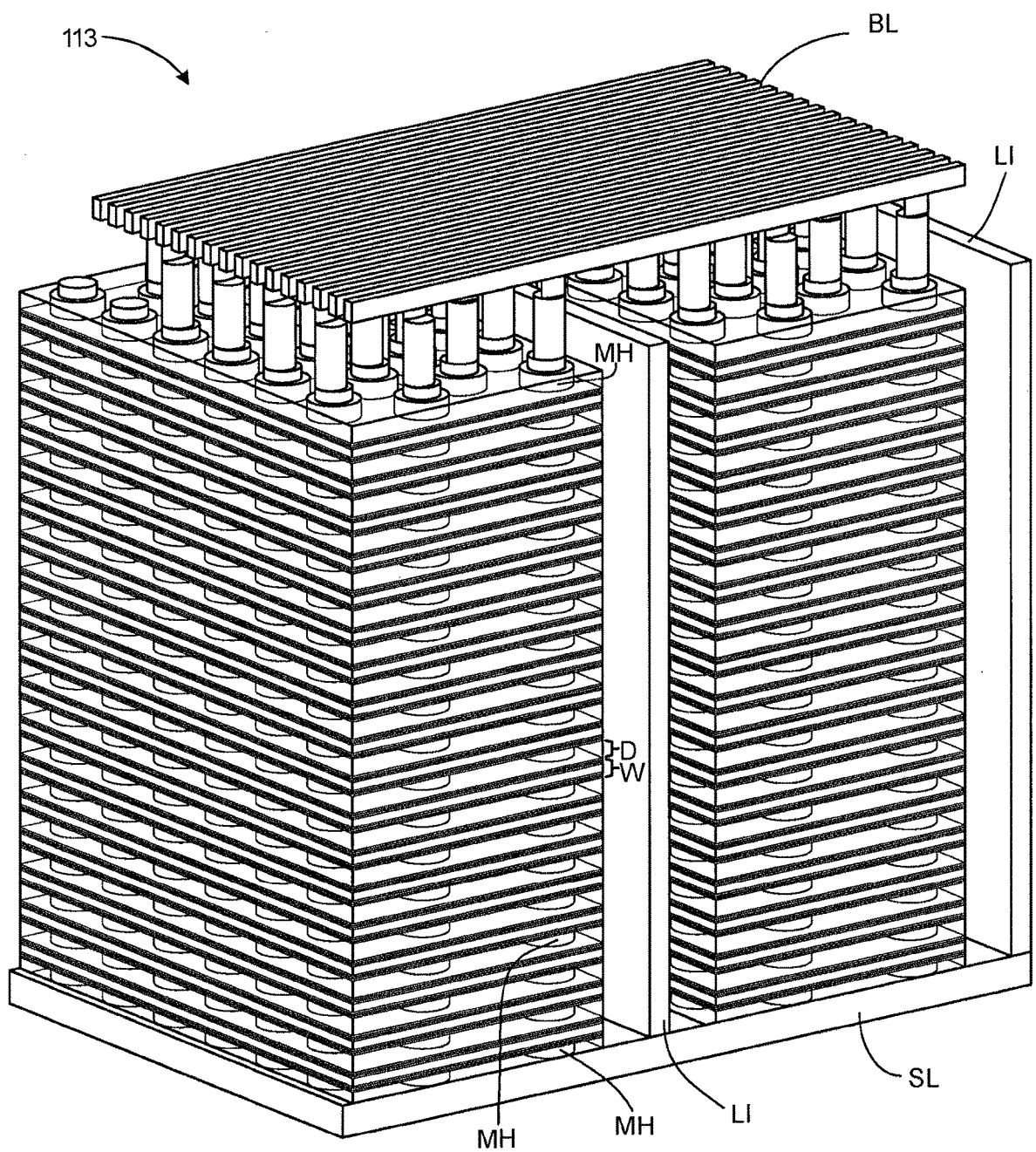
FIG. 3 is a perspective view of a portion of one embodiment of a monolithic three dimensional memory structure.

FIG. 3 is a perspective view of a portion of one example embodiment of a memory structure 113. In the FIG. 3 embodiment, the memory structure 113 comprises a monolithic three dimensional memory structure. For example, FIG. 3 shows a portion of one block of memory. The structure depicted includes a set of bit lines (BL) positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108 and 216 alternating dielectric layers and conductive layers, for example, 96 data word line layers, 8 select layers, 4 dummy word line layers and 108 dielectric layers. More or less than 108 to 216 layers can also be used. As will be explained below, the alternating dielectric layers and conductive layers are divided into four "fingers" by local interconnects LI (isolation areas). FIG. 3 only shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure are provided below with respect to FIGS. 3A-F.

Figure 4A:
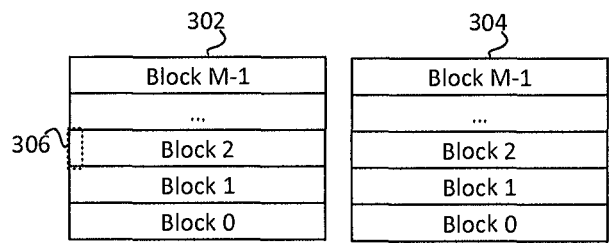
FIG. 4A is a block diagram of a memory structure having two planes.

FIG. 4A is a block diagram explaining one example organization of one embodiment of a memory structure 113, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . . In one embodiment, a block of memory cells is a unit of erase. That is, all memory cells of a block are erased together. In other embodiments, memory cells can be grouped into blocks for other reasons, such as to organize the memory structure 113 to enable the signaling and selection circuits.

Figure 4B:
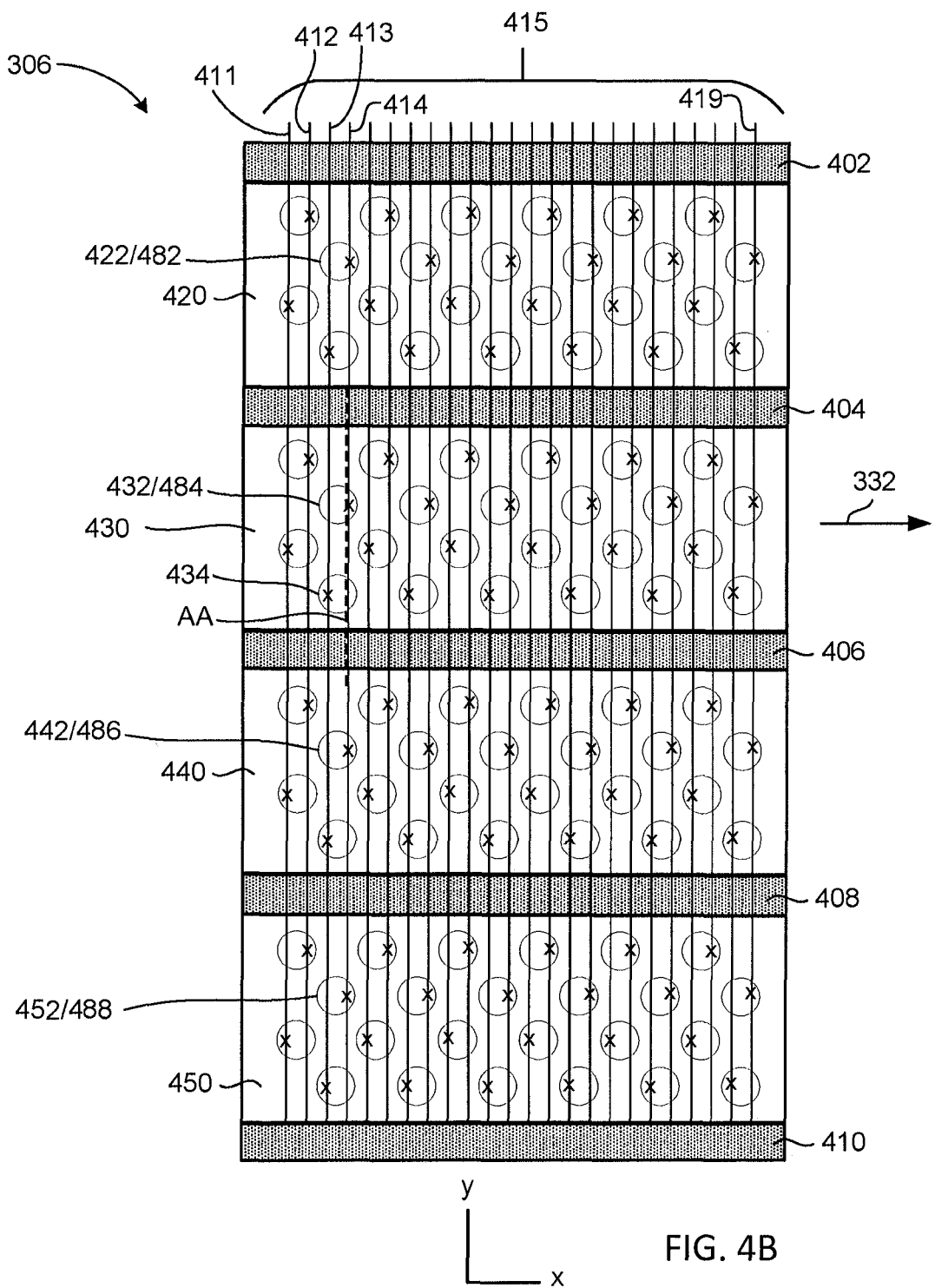
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of arrow 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string and, therefore, can be referred to as a memory column. A memory column can implement other types of memory in addition to NAND. FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than are depicted in FIG. 4B.

FIG. 4B also depicts a set of bit lines 415, including bit lines 411, 412, 413, 414, . . . 419. FIG. 4B shows 24 bit lines because only a portion of the block is depicted. It is contemplated that more than 24 bit lines can be connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of isolation areas 402, 404, 406, 408 and 410 that serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the isolation areas (also serving as local interconnects). In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has 16 rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Isolation areas 402, 404, 406, 408 and 410 also connect the various layers to a source line below the vertical columns. In one embodiment, isolation areas 402, 404, 406, 408 and 410 are filled with a layer of $SiO_2$ (blocking) and a layer of polysilicon (source line connection). Although FIG. 4B shows each region having four rows of vertical columns, four regions and 16 rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

Figure 4C:
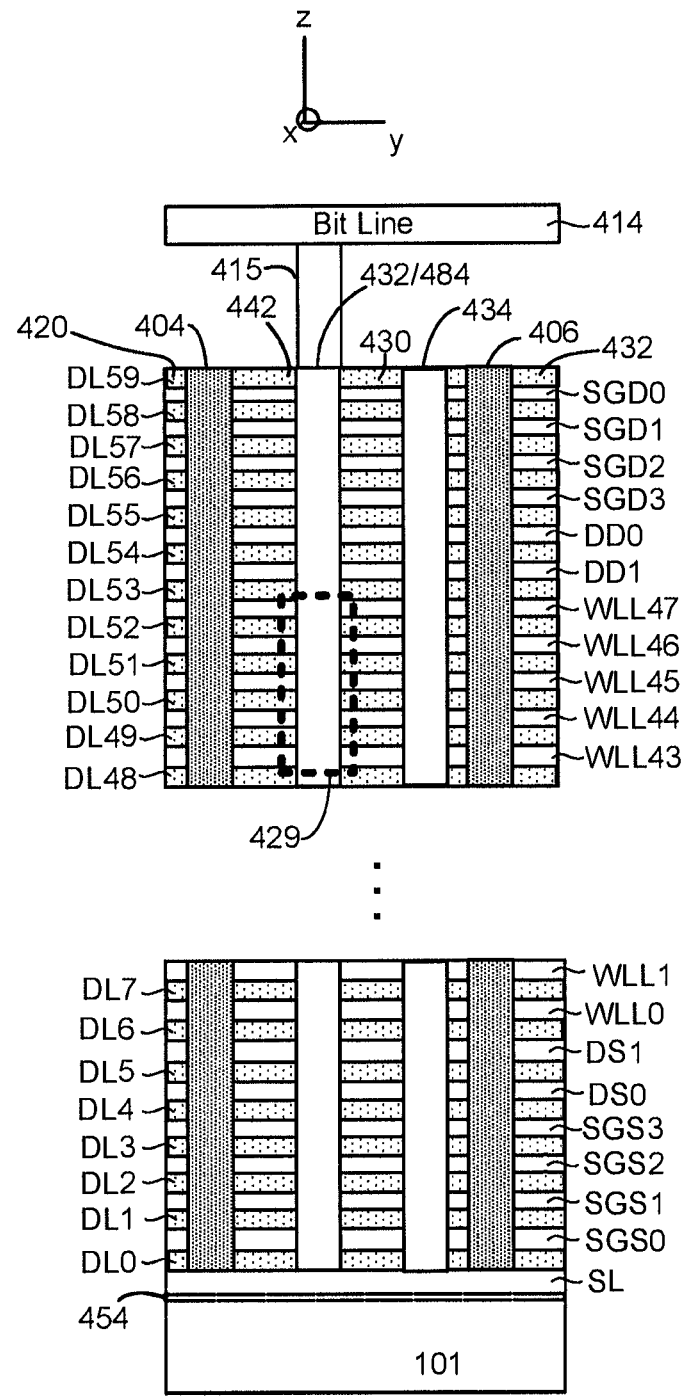
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and 48 data word line layers WLL0-WLL47 for connecting to data memory cells. Other embodiments can implement more or less than four drain side select layers, more or less than four source side select layers, more or less than four dummy word line layers, and more or less than 48 word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C shows vertical column 432 connected to bit line 414 via connector 415. Isolation areas 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, and metal such as Tungsten or metal silicide. In some embodiments, different conductive layers can be formed from different materials. Between conductive layers are dielectric layers DL0-DL59. For example, dielectric layer DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL47 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

Figure 4D:
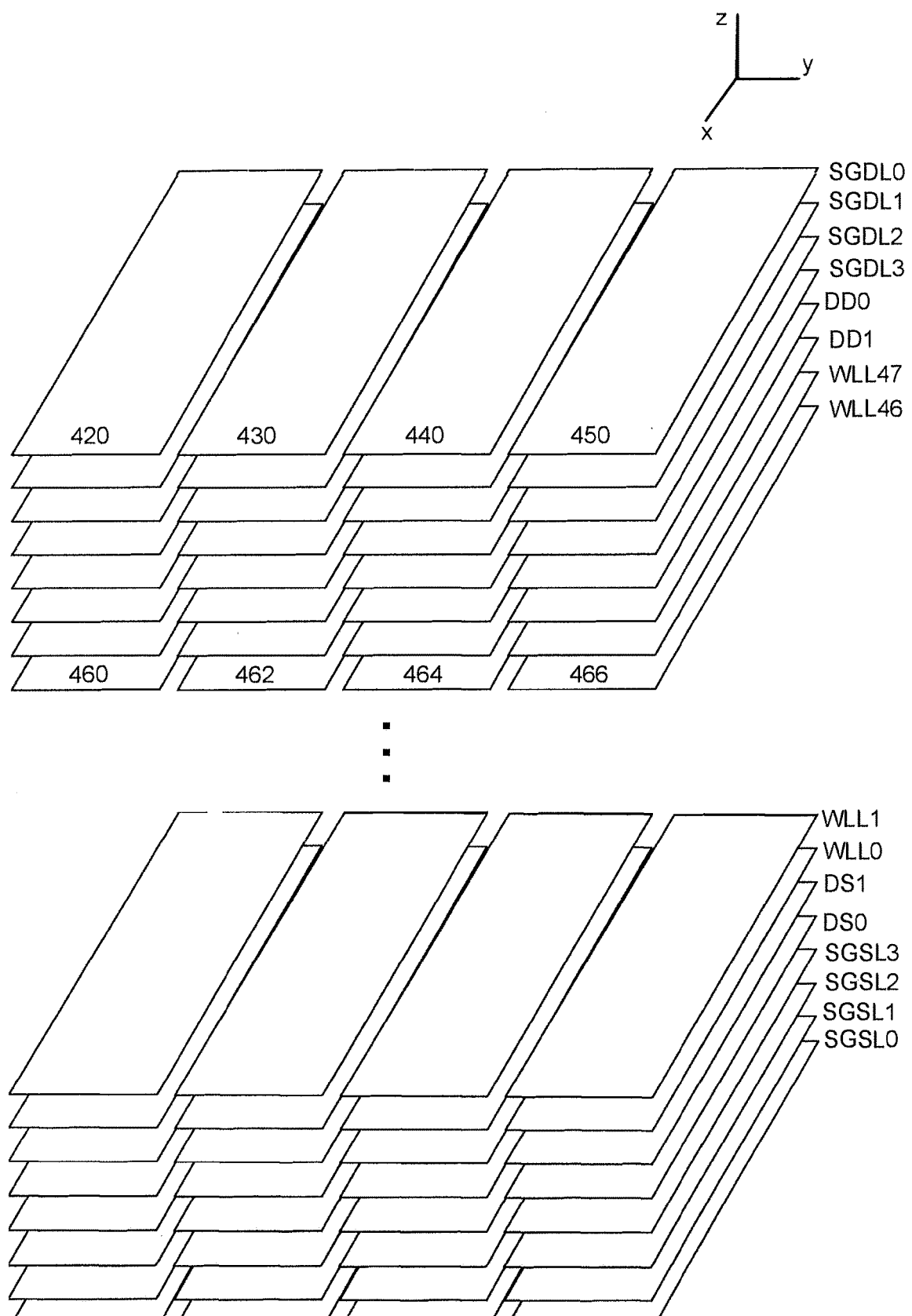
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment isolation areas 402, 404, 406, 408 and 410 break up each conductive layer into four regions or fingers. For example, word line layer WLL31 is divided into regions 460, 462, 464 and 466. For word line layers WLL0-WLL31, the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line. Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
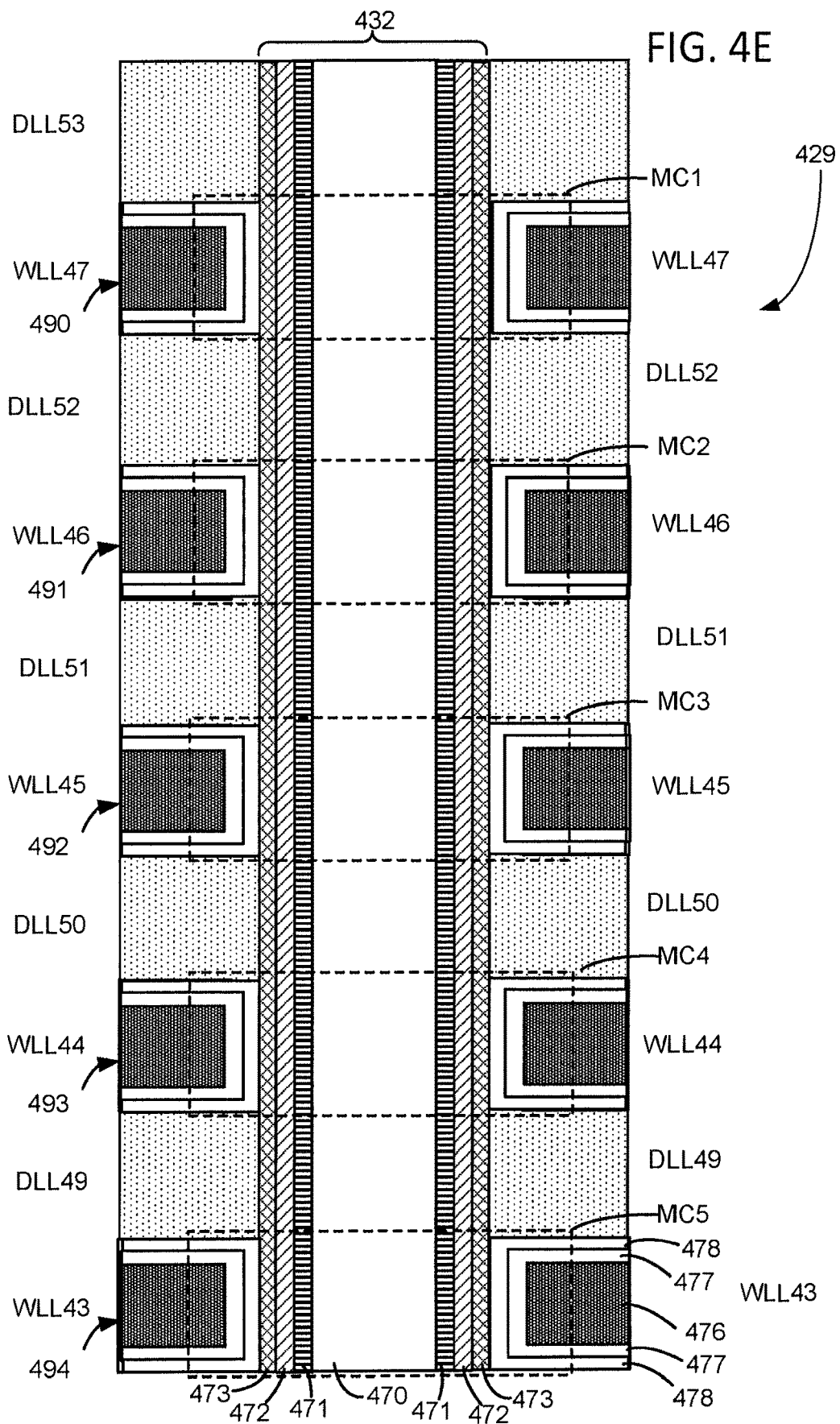
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage ($V_{TH}$) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
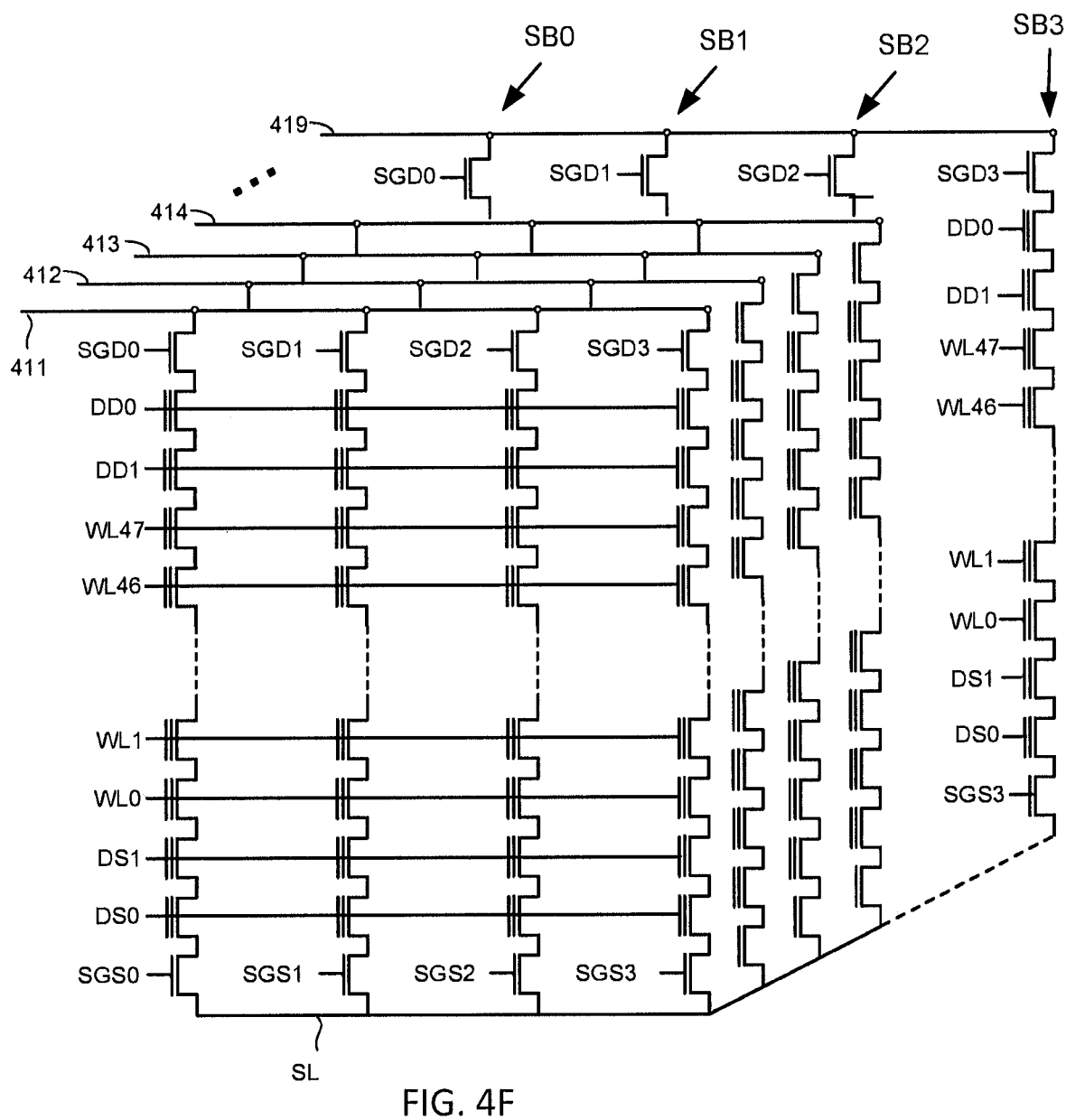
FIG. 4F is a schematic of a plurality of NAND strings.

FIG. 4F shows physical word lines WLL0-WLL47 running across the entire block. The structure of FIG. 4G corresponds to portion 306 in block 2 of FIGS. 4A-F, including bit lines 411, 412, 413, 414, . . . 419. Within the block, each bit line is connected to four NAND strings. Drain side selection lines SGD0, SGD1, SGD2 and SGD3 are used to determine which of the four NAND strings connect to the associated bit line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Figure 5:
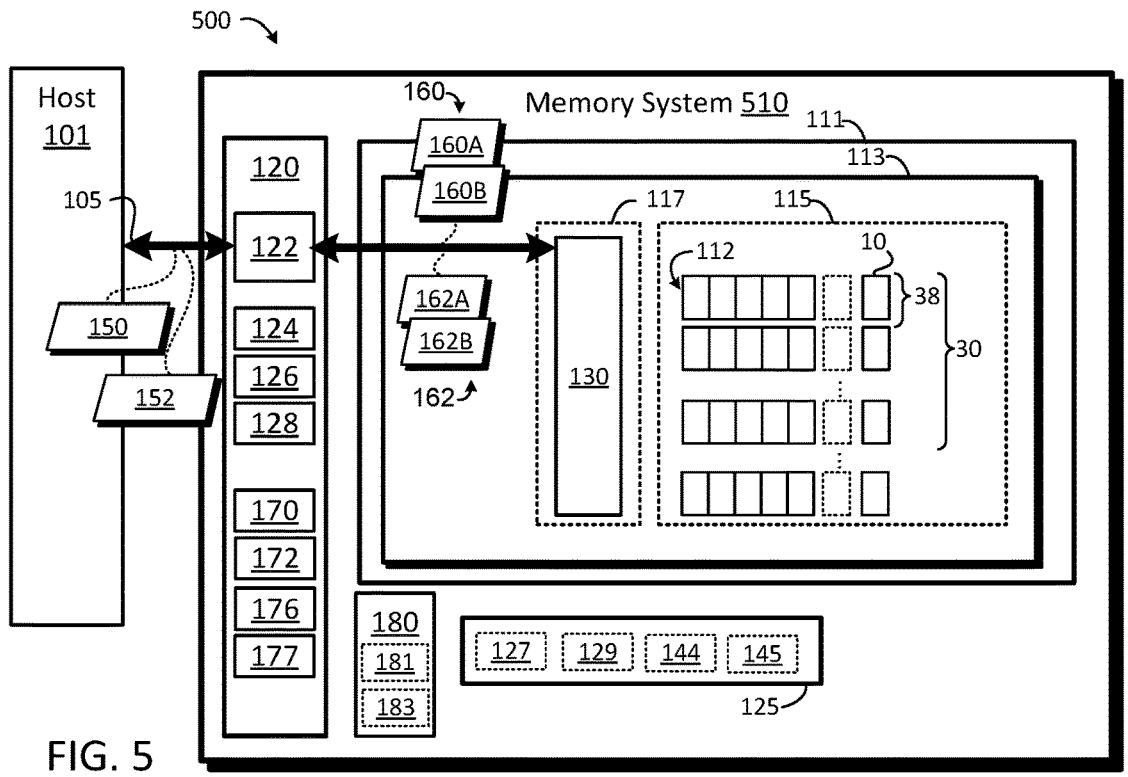
FIG. 5 is a schematic block diagram of one embodiment of a system configured to implement high-performance write operations, as disclosed herein.

FIG. 5 is a schematic block diagram 500 of one embodiment of a memory system 510 configured to implement HPW operations, as disclosed herein. In the FIG. 5 embodiment, the device controller 120 may comprise a command processing logic 122, which may be configured to process and/or execute foreground commands 150. The command processing logic 122 may be configured to receive, fetch, and/or retrieve foreground commands 150 from the host 101 via the interconnect 105. The command processing logic 122 be further configured to parse the foreground commands 150, and implement operation(s) required to execute the foreground commands 150. The command processing logic 122 may, therefore, comprise and/or correspond to foreground processing logic. The command processing logic 122 may be further configured to produce completion indications 152 in response to completing respective foreground command(s) 150. A foreground completion indication 152 may comprise any suitable means for indicating completion of a foreground command 150, including, but not limited to: a notification, a message, an acknowledgement, a report, a return code, a completion code, a completion queue entry, and/or the like. The latency of a foreground command 150 may comprise a time from which the foreground command 150 is queued, received and/or fetched for execution and the time at which the foreground command 150 is completed (e.g., a time at which a corresponding completion indication 152 is produced, returned, and/or communicated).

The command processing logic 122 may execute a foreground command 150 to store data within the memory resources 111 (e.g., memory 115) by, inter alia, issuing one or more internal commands 160. As used herein, an "internal command" 160 refers to a command produced and/or issued within the memory system 510. Internal commands may comprise commands configured to implement portion(s) of foreground command(s) 150, implement background operations pertaining to the memory system 510 (e.g., grooming operations, garbage collection, background verification, post-write validation), and/or the like). A foreground command 150 to store data within the memory 115 may correspond to a plurality of internal commands 160, each internal command 160 to write a respective portion of the data to a respective memory unit 112 (e.g., a respective page 38, group of pages 38, block 30, and/or the like). The command processing logic 122 may indicate that the foreground command 150 is complete in response to completion of the corresponding internal commands 160. An internal command 160 that directly contributes to the latency of a foreground command 150 (e.g., must be completed before the corresponding foreground command 150 can be indicated as complete) may be referred to as an foreground internal command 160 (or foreground command). An internal command 160 that does not directly contribute to the latency of a foreground command 150 (e.g., does not have to be completed in order for foreground command(s) 150 to be indicated as complete) may be referred to as a background internal command 160 (or background command). The memory control circuitry 130 may be configured to execute internal commands 160 and return corresponding internal completion indications 162. An internal completion indication 162 may comprise any suitable means for indicating completion of an internal command 160, including, but not limited to: a notification, a message, an acknowledgement, a report, a return code, a completion code, a completion queue entry, and/or the like.

The command processing logic 122 may comprise and/or be communicatively coupled to a read logic 124 and write logic 126. The read logic 124 may be configured to, inter alia, manage operations to read data from the memory resources 111 (e.g., memory 115). The write logic 126 may be configured to, inter alia, manage operations to write and/or store data within the memory resources 111 (e.g., memory 115). The write logic 126 may be configured to manage sequential storage operations within the memory 115. As used herein, sequential storage operations refer to operations to write data sequentially within a physical address space of the memory 115. The sequential storage operations may comprise storing data units (e.g., data pages) sequentially within respective pages 38 (e.g., from page 38A to page 38M of a block 30 and/or group of blocks 30). The sequential storage operations may further comprise storing metadata with respective data units, the metadata indicating logical addresses of the data units, and/or the like.

In some embodiments, the write logic 126 may comprise and/or be communicatively coupled to metadata logic 128, which may be configured to maintain storage metadata pertaining to the sequential storage operations implemented by the write logic 126. The metadata logic 128 may be configured to maintain a logical-to-physical map 144 comprising associations between logical addresses of stored data units and respective physical addresses of the stored data units within the memory 115. The logical-to-physical map 144 may comprise any-to-any mappings between identifiers of a logical address space (e.g., logical blocks and/or logical block addresses) and physical storage locations. The logical-to-physical map 144 may comprise any suitable data structure including, but not limited to: a map, an index, a table, and/or the like. The logical-to-physical map 144 may be indexed and/or arranged by logical address. The metadata logic 128 may be further configured to maintain a reverse map 145 (a physical-to-logical map), which may comprise information pertaining to data stored at respective physical addresses (and may be indexed and/or arranged by physical address). Portions of the storage metadata, including the logical-to-physical map 144 and/or reverse map 145 may be maintained within the system storage 125, as disclosed herein. Alternatively, or in addition, the storage metadata (and/or portions thereof) may be maintained within the memory resources 111 of the memory system 510 (e.g., in a dedicated region of the memory 115). In some embodiments, portions of the logical-to-physical map 144 may be cached within memory resources of the host 101 (e.g., within a host memory buffer (HMB) allocated to the memory system 510).

The write logic 126 may be configured to maintain a log within the memory 115, the log comprising an ordered sequence of operations (e.g., write operations to store respective data units within the log). The write logic 126 may be configured to append data to the log at an append point. As used herein, an append point refers to an indication of a head of a log being maintained within the memory resources 111. An append point may comprise and/or correspond to a physical address, such as an address of a page 38 (and/or group of pages 38) within one or more blocks 30. A data unit may be appended to the log, which may comprise storing the data unit within the page 38 (and/or group of pages 38) addressed by the append point, along with corresponding metadata, and advancing the append point to a next page 38 (and/or group of pages 38). The write logic 126 may be configured to write data units to any suitable physical storage location, regardless of the logical addresses thereof. The write logic 126 may be configured to write data out-of-place, which may comprise over-writing and/or modifying an existing data unit pertaining to a particular logical identifier and associated with data stored at a first physical address with an updated data unit by, inter alia, storing the updated data unit at a second physical address (the current append point), different from the first physical address, and updating the logical-to-physical map 144 to associate the particular logical identifier with the second physical address (and/or marking the data stored at the first physical address as invalid in a reverse map, e.g., a map pertaining to respective physical addresses of respective blocks 30). The obsolete data may remain stored within the first physical address until a garbage collection and/or grooming operation is performed on the block 30 comprising the first physical address. The write logic 126 may be configured to advance the append point through respective blocks 30 (and/or groups of blocks 30). In response to reaching a last page 38 of a block 30, the write logic 126 may advance the append point to a next available block 30. The next block 30 may be selected from a pool of available blocks 30. As used herein, an "available" or "free" block 30 refers to a block 30 that is not being used to store data that needs to be retained within the memory system 510. An available block 30 may refer to a block 30 that is empty and/or is being used to store data that is invalid and/or obsolete (e.g., no longer needs to be retained and/or has been relocated to other block(s) 30). An available block 30 may comprise a block 30 that may be available for servicing write requests (e.g., can be erased, initialized, and/or otherwise used for incoming write requests). As used herein, an "unavailable" block 30 refers to a block that is being used to store data to retain within the memory system 510 (e.g., valid data) and, as such, is not currently available for use in servicing incoming write requests (e.g., cannot be erased and/or otherwise initialized in preparation for use in servicing the incoming write requests).

The device controller 120 may further comprise a manager 170 configured to, inter alia, manage the memory resources 111 of the memory system 510. The manager 170 may be configured to manage grooming, garbage collection, refresh, and/or other background operations. The manager 170 may comprise and/or corresponding background processing logic. The manager 170 may be configured to maintain a pool of available blocks 30, manage operations to erase and/or initialize selected blocks 30, and/or the like. The manager 170 may be configured to perform grooming and/or garbage collection operations on selected blocks 30. Performing garbage collection on a selected block 30 may comprise transitioning the block 30 from unavailable to available, which may comprise: a) identifying data stored within the block 30 that is to be retained within the memory system 510 (e.g., valid data); and b) relocating the identified data (if any) to one or more other blocks 30. The data to retain within the memory system 510 may be identified by use of the logical-to-physical map 144 (e.g., comprise data that is currently being referenced within the logical-to-physical map 144 and/or is marked as valid in a corresponding reverse map). After the relocating, the block 30 may be added to a pool of available blocks 30. The manager 170 may prepare available blocks 30 for write operations by, inter alia, configuring the memory control circuitry 130 to perform erase and/or initialization operations on selected available blocks 30. The manager 170 may be configured to erase a next available block 30 for use in serving incoming write requests in response to determining that the append point is nearing the end of a current block 30. In some embodiments, the manager 170 may be configured to maintain a determined amount of write capacity, which may comprise maintaining one or more available blocks 30 in an erased state before such blocks are required by the write logic 126. The manager 170 may maintain the write capacity in order to, inter alia, ensure that incoming write operations can be serviced without stalling while additional blocks 30 are prepared for use, even during burst conditions.

The command processing logic 122 may execute a foreground command 150 that comprises, inter alia, a request to store a plurality of data units within the memory resources 111. The write logic 126 may implement a plurality of write operations to store respective data units, of the plurality of data units, within the memory 115. The write logic 126 may be configured to implement sequential storage operations configured to append the data units to a log maintained within the memory 115, as disclosed herein. The write logic 126 may store the data units by, inter alia, issuing a first internal command 160A to the memory control circuitry 130. The first internal command 160A may comprise a memory write command configured to cause the memory control circuitry 130 to store data within respective memory units 112 of the memory 115. The internal command 160 may designate page(s) 38 in which to store respective data units (e.g., may specify physical addresses of respective pages 38). The internal command 160 may comprise a starting physical address and size (e.g., may indicate a physical address corresponding to the current append point at which the data are to be sequentially appended). In some embodiments, the first internal command 160A may specify a programming mode (e.g., specify that the data units are to be programmed in an HPW operation). The first internal command 160A may comprise information pertaining to the HPW operation, such as an amplitude and/or duration of the first programming pulse to be applied to the designated pages 38. The write logic 126 may be configured to retrieve an HPW configuration corresponding to the designated pages 38 from the configuration store 127, and include information of the retrieved HPW configuration in the first internal command 160A. The first internal command 160A may contribute to the latency of the foreground command 150 and, as such, may comprise a foreground internal command.

The memory control logic 130 may implement an HPW operation in response to the first internal command 160A. Implementing the HPW operation may comprise applying a single programming pulse to the page(s) 38 designated in the internal command 160. The HPW operation may further comprise returning a first internal completion indication 162A in response to the single programming pulse. The first internal completion indication 162A may be returned without verifying programming of the one or more groups of cells 10. The single programming pulse may comprise a first programming pulse (e.g., an under-program pulse, as disclosed herein). The first programming pulse may be configured to program selected cells 10 of the group(s) to at least a minimum level (e.g., $V_{REF}$–UPF). The first programming pulse may be further configured to prevent over-programming of substantially any of the cells 10 (e.g., ensure that the $V_{TH}$ of substantially all the cells 10 remains under $V_{TH\_MAX}$ thereof). The first internal completion indication 162A may be returned while one or more of the selected cells 10 remain in an under-programmed state. The internal completion indication 162 may be returned while one or more of the selected cells 10 have a $V_{TH}$ within a determined range below $V_{REF}$ (e.g., within a UPF under $V_{TH}$).

The write logic 126 may comprise and/or be communicatively coupled to schedule logic 176, which may be configured to, inter alia, schedule background verification of groups of cells 10 programmed in HPW operations. In response to the internal completion indication 162, the schedule logic 176 may be configured to schedule background verification of page(s) 38 designated by the first internal command 160A. Scheduling the background verification may comprise appending an entry to a background verification queue 129, as disclosed herein. The schedule logic 176 may include and/or reference the HPW configuration pertaining to the pages 38 in the entry, which may include, but is not limited to: the UPF for use in identifying under-programmed cells 10 within the pages 38 during background verification (and/or specifying that under-programmed cells 10 are to be identified based on a $V_{TH}$ distribution of the cells 10); the background verification threshold (e.g., $\Delta t_{MAX}$); the configuration of the second programming pulse to apply to the under-programmed cells 10 (if any); and so on. The write logic 126 may be further configured to update the logical-to-physical map 144 in response to the internal completion indication 162 in order to, inter alia, associate logical addresses of the data units with physical addresses of the designated page(s) 38. Alternatively, or in addition, in some embodiments, scheduling the background verification may comprise setting and/or advancing a verify point. The verify point may comprise and/or correspond to a physical address of a memory unit 112, page 38, group of pages 38, and/or the like. The verify point may correspond to an append point maintained by the write logic 124. As disclosed above, the write logic 124 may be configured to write data sequentially, which may comprise writing data at an append point that is sequentially advanced within the physical address space of the memory 115, as disclosed above. The verify point may follow the append point, and may indicate the next page for background verification. In response to verifying the page 38 corresponding to the verify point, the verify point may be advanced sequentially within the physical address space (per the append point). During idle periods, background verification may continue until the verification point reaches the append point (and/or additional foreground commands 150 are available for execution).

In response to the single programming pulse (e.g., the internal completion indication 162 corresponding to the first internal command 160A), the command processing logic 122 may return a foreground completion indication 152. The foreground completion indication 152 may be returned without performing the background verification scheduled for the designated page(s) 38. The foreground completion indication 152 may be returned without verifying programming of the selected cells 10. The foreground completion indication 152 may be returned while one or more of the selected cells 10 remain in an under-programmed state. The foreground completion indication 152 may be returned while one or more of the selected cells 10 has a $V_{TH}$ within a determined range below $V_{REF}$ (e.g., within a UPF under $V_{TH}$). The foreground completion indication 152 may be returned via the interconnect 105. Returning the foreground completion indication 152 may comprise writing an entry to the completion queue maintained within the host 101. The latency of the foreground command 150 may, therefore, comprise a latency for applying the single programming pulse to the designated page(s) 38. The latency of the foreground command 150 may not include latencies involved with verifying, validating, reading, and/or sensing cells 10 of the designated pages 38.

The manager 170 may comprise and/or be communicatively coupled to idle logic 172 and background verify logic 177. The idle logic 172 may be configured to detect idle conditions within the memory system 510 and/or memory control circuitry 130. The idle logic 172 may be configured to monitor incoming foreground commands 150, monitor the availability of pending foreground commands 150 (e.g., monitor foreground command queues), and/or monitor execution of foreground commands 150 at the memory system 510. The idle logic 172 may be further configured to monitor the availability and/or execution of foreground internal commands 160 (e.g., internal commands 160 pertaining to execution of foreground commands 150) by the memory control logic 130. In response to the monitoring, the idle logic 172 may determine whether idle resources are available for executing one or more background verification operations (and/or other background operations). Idle resources may comprise resources that are not being used to execute current or pending foreground commands 150 and/or foreground internal commands 160. By way of non-limiting example, during execution of foreground command(s) 150 to read data stored within the memory 115, resources required to implement background verification (e.g., data validation and/or programming resources) may be idle, which may enable background verification to be performed during execution of such foreground commands 150.

The idle logic 172 may notify the manager 170 and/or background verify logic 177 of the availability of idle resources. In response to determining that idle resources required to implement background verification are available, the background verify logic 177 may implement background operation(s) to verify and/or validate programming of selected pages 38 (in accordance with the background verify queue 129, verify point, and/or other mechanism for recording, queuing, and/or scheduling background verification operations). The background verify logic 177 may, therefore, comprise and/or correspond to background processing logic of the device controller 120. While the idle logic 172 indicates that idle resources are available, the background verify logic 177 may select pages 38 for background verification (e.g., fetch entries from the background verify queue 129), perform background verify operation(s) on the selected pages 38, and record that the background verify operations are complete (e.g., remove scheduled background verification entries in response to completion thereof, clear markings and/or designations from the pages 38, storage metadata, logical identifier(s), physical address(es), and/or the like). The background verify logic 177 may comprise detection logic, which may be configured to identify cells 10 of the selected page 38 having $V_{TH}$ within UPF below $V_{REF}$, and correction logic, which may be configured to apply a second programming pulse to the identified cells 10, as disclosed herein. In some embodiments, the UPF may be maintained within an HPW configuration pertaining to the selected page 38. Alternatively, or in addition, background verification of the selected page 38 may comprise determining an optimal UPF for the selected page 38, which may comprise: deriving a $V_{TH}$ distribution curve from cell counts determined in respective sense operations performed on the selected page 38, each sense operation performed at a respective level ranging between about $V_E$ and $V_{REF}$; identifying a minimum within the $V_{TH}$ distribution curve (e.g., using gradient descent, a valley search, and/or the like); and determining the optimal UPF for the selected page 38 in accordance with the identified minima (e.g., calculating the optimal UPF such that $V_{REF}$–UPF is at a voltage level corresponding to the determined minima). The determined UPF may be used in the background verification of the selected page 38 and/or may be recorded in the HPW configuration pertaining to the selected page 38 (e.g., for use in subsequent background verification operations on the selected page 38 and/or other pages 38 in a same program region as the selected page 38).

In some embodiments, the background verify logic 177 may issue a second internal command 160 to the memory control circuitry 130. The second internal command 160B may configure the memory control circuitry 130 to perform background verification of the selected page 38, as disclosed herein. The second internal command 160B may comprise physical addresses of the selected page 38. The second internal command 160B may further comprise information pertaining to the scheduled background verification operation, such as the UPF, a configuration of the second programming pulse, and/or the like. Alternatively, or in addition, the second internal command 160B may direct the memory control circuitry 130 to determine an optimal UPF for the selected page 38, as disclosed herein (e.g., based on a $V_{TH}$ distribution curve determined for the selected page 38). The information pertaining to the background verification operation may be obtained from the background verification entry, the HPW configuration corresponding to the selected 38, and/or the like. The second internal command 160B may be issued after the foreground completion indication 152 corresponding to the foreground command 150, and may not contribute to the latency of the foreground command 150 (or other pending foreground commands 150). As such, the second internal command 160B may comprise a background internal command 150.

In response to the second internal command 160B, the memory control circuitry 130 may be configured to: a) identify under-programmed cells 10 of the selected page 38, and b) apply a second programming pulse to the identified under-programmed cells 10 (if any). In some embodiments, identifying the under-programmed cells 10 may comprise configuring the read circuit 132 to perform respective sense operations at each of $V_{REF}$ and $V_{REF}$–UPF. The under-programmed cells 10 may comprise cells 10 determined to be conductive at $V_{REF}$ and non-conductive at $V_{REF}$–UPF. In some embodiments, identifying the under-programmed cells 10 may further comprise determining an optimal UPF for the selected page 38, as disclosed herein. The second internal command 160B may further configure the memory control circuitry 130 to apply the second programming pulse to the identified, under-programmed cells 10 (if any), as disclosed herein.

A second internal completion indication 162B may be returned in response to applying the second programming pulse (and/or in response to determining that the designated pages 38 do not comprise any under-programmed cells 10). In response to the second internal completion indication 162B, the background verification logic 177 may remove the corresponding entry from the background verification queue 129 and/or may fetch a next entry for processing (if any). The background verification logic 177 may be configured to fetch entries from the background verification queue 129 in accordance with the order in which the entries were appended thereto (e.g., in accordance with a FIFO pattern). In some embodiments, the background verification logic 177 may be configured to fetch entries from the background verification queue 129 based on the remaining time thereof (e.g., proximity to expiration time of the respective entries, which may be expressed as the time at which the entries were queued plus $\Delta t_{MAX}$ of the respective entries). Alternatively, or in addition, the schedule logic 176 may be configured to order entries in the queue by expiration time (queue time plus $\Delta t_{MAX}$), such that entries having earlier expiration times are ordered before entries with later expiration times.

In some embodiments, the background verification logic 177 may be further configured to monitor the background verification queue 129 in order to, inter alia, identify entries nearing the background verification thresholds thereof. In response to determining that the amount of time an entry has been queued is nearing the $\Delta t_{MAX}$ thereof, the background verification logic 177 may be configured to implement a background verification corresponding to the entry, regardless of whether idle resources are currently available. The background verification logic 177 may implement the background verification as a foreground operation, which may impact the latency of one or more foreground commands 150.

The device controller 120 may be configured to manage the power state of the memory system 510. The device controller 120 may be configured to transition the memory system 510 from a full-functionality power state to a lower, reduced functionality power state. As used herein, a "full-functionality" power state refers to a power state in which all, or substantially all, of the functionality of the memory system 510 is operational and/or available. A "reduced functionality" power state refers to a power state in which at least some of the functionality of the memory system 510 is non-functional. A reduced functionality power state may comprise one or more of a sleep power state, a hibernate power state, a powered-off state, and/or the like. The background verification logic 177 may monitor the power state of the memory system 510. The background verification logic 177 may be configured to flush the background verification queue 129 in response to determining that the system controller 110 is preparing to transition the memory system to a lower power state (e.g., a reduced functionality power state). Flushing the background verification queue 129 may comprise implementing all, or substantially all, of the background verification operations queued therein. The background verification logic 177 may prevent the device controller 120 from transitioning to the lower-power state until all, or substantially all, of the background verification operations have been completed.

In some embodiments, the background verification logic 177 may be configured to cancel a scheduled background verification operation (e.g., remove the corresponding entry from the background verification queue 129). The background verification logic 177 may be configured to cancel a scheduled background verification operation on a group of cells 10 in response to determining that data stored within the group of cells 10 does not need to be retained within the memory system 510. The background verification logic 177 may cancel a scheduled background verification operation in response to a message pertaining to a logical identifier associated with the data. The background verification logic 177 may cancel a scheduled background verification operation in response to one or more of: a TRIM message indicating that data corresponding to the logical identifier does not need to be retained, an unmap message indicating that the logical identifier should be unmapped from stored data, a deallocate message pertaining to the logical identifier, an indication that the data has been evicted and/or destaged from cache storage, and/or the like. The background verification logic 177 may be configured to monitor the logical-to-physical map 145 in order to, inter alia, detect modifications pertaining to logical identifiers associated with scheduled background verification operations. The background verification logic 177 may be configured to cancel a scheduled background verification operation in response to determining that a logical identifier corresponding to the background verification operation has been removed from the logical-to-physical map 145. Alternatively, or in addition, the background verification logic 177 may be configured to monitor a reverse map, which may indicate whether data stored at respective physical addresses needs to be retained (e.g., is valid). The background verification logic 177 may cancel a scheduled background verification operation in response to determining that the reverse map indicates that data stored within physical address(es) to be background verified does not need to be retained (e.g., is invalid).

In some embodiments, the schedule logic 176 may be configured to schedule background validation of selected pages 38, and/or mark pages 38 for background verification by use of the metadata manager 128. The metadata manager 128 may be configured to maintain the background verification queue 129, as disclosed herein and/or may link queued background verification entries therein to logical identifier(s) and/or physical address(es) of the storage metadata (e.g., within one or more of the logical-to-physical map 144, reverse map 145, and/or the like). The metadata manager 128 may be configured to schedule a page 38 for background verification by, inter alia, recording an entry in the background verification queue 129, as disclosed herein. The metadata manager 128 may be further configured to schedule background verification of selected pages 38 by, inter alia, marking the selected pages 38 in the storage metadata. The metadata manager 128 may be configured to mark logical identifiers and/or physical addresses corresponding to the selected pages 38 in one or more of the logical-to-physical map 144 and/or reverse map 145. The marking may comprise flagging and/or recording indications that designated logical identifiers and/or physical addresses pertain to pages 38 that are scheduled for background verification. The marking may further comprise configuring the metadata manager 128 to notify the background verify logic 177 of changes to the storage metadata pertaining to selected pages 38. The metadata manager 128 may be configured to notify the background verify logic 177 in response to detecting operations indicating that data corresponding to the marked logical identifier does not need to be retained within the memory system 510 (e.g., in response to removing, trimming, deallocating, unmapping and/or remapping a marked logical identifier within the logical-to-physical map 144, which operations may indicate that data previously associated with the marked logical identifier no longer need to be retained). In response to such a notification, the background verify logic 177 may be configured to cancel the scheduled background verification operation on the page 38 corresponding to the marked logical identifier (e.g., remove the corresponding background verification entry from the queue 129 and/or clear the marking(s) therefrom). The metadata manager 128 may be further configured to notify the background verify logic 177 in response to changes pertaining to marked physical addresses indicating that data stored therein does not need to be retained (e.g., invalidation of the marked physical addresses in the reverse map 145). In response to such a notification, the background verify logic 177 may be configured to cancel the scheduled background verification on the page 38 corresponding to the marked physical addresses, as disclosed above.

In some embodiments, the device controller 120 may further comprise a configuration manager 180. The configuration manager 180 may be adapted to, inter alia, manage HPW configuration information pertaining to the memory 115 (e.g., HPW configuration(s) for respective program regions within the memory structure 113). The configuration manager 180 may comprise a default HPW configuration 181, which may correspond to the design, fabrication, and/or process characteristics of the memory structure 113. The default HPW configuration 181 may comprise program constraints and/or default values, such as $V_{TH\_MAX}$, $V_{PASS}$, $V_{PGM\_MAX}$, $V_{PGM\_HIGH}$, $V_{PGM\_OPT}$, $V_{PGM\_LOW}$, programming pulse durations, and/or the like. The default HPW configuration 181 may comprise a default configuration for the first programming pulse of HPW operations (e.g., an amplitude of about $V_{PGM\_LOW}$), a UPF (and/or indication to identify under-programmed cells 10 within respective groups based on $V_{TH}$ distributions thereof), a background verification threshold (e.g., $\Delta t_{MAX}$), a configuration for the second programming pulse (e.g., an amplitude of about $V_{PGM\_LOW}+V_{PGM\_BGTRIM}$), and/or the like. In some embodiments, the default HPW configuration 181 may be used to control HPW operations throughout the memory 115, regardless of program region. The configuration manager 180 may be configured to adapt and/or adjust the default HPW configuration 181 in accordance with wear, degradation, and/or operating conditions, as disclosed herein.

In some embodiments, the configuration manager 180 may be adapted to manage HPW configuration(s) for respective program regions. The program regions may be defined in, inter alia, a region map 183. The region map 183 may comprise associations between physical addresses (e.g., respective memory units 112, pages 38, blocks 30, and/or the like) and respective program regions. The configuration manager 180 may be configured to adapt and/or modify the default HPW configuration 181 within respective program regions. Alternatively, or in addition, the configuration manager 180 may maintain different HPW configurations for respective program regions. The configuration manager 180 may be configured to determine suitable HPW configurations for respective program regions by, inter alia, performing a series of one or more pulse test operation(s) within the respective program regions, as disclosed herein. The pulse test operations may be implemented as background operations (during idle periods as detected by the idle logic 172). The pulse test operations may comprise determining suitable and/or optimal HPW configurations for respective program regions, which HPW configurations may be recorded within the configuration store 127 for use in controlling HPW operations (and corresponding background verification operations) within the respective regions. The pulse test operations may further comprise validating the HPW configurations and/or adjusting the HPW configurations in response to the validating.

The configuration manager 180 may be further configured to update HPW configurations of respective program regions, as disclosed herein. The HPW configuration of a program region may be updated in response to any suitable criterion including, but not limited to: wear levels of cells 10 within the program region, error rate for operations within the program region (e.g., program error rate, read error rate, and/or the like), reliability metrics for the region, a time threshold, operating conditions, user preferences, command(s), and/or the like. In some embodiments, the HPW configuration of a program region may be updated periodically and/or after a determined number of program-erase cycles have been performed therein. Updating the HPW configuration for a program region may comprise validating a current HPW configuration for the program region and adjusting and/or replacing the HPW configuration in response to the validation. Updating the HPW configuration for a program region may comprise performing a series of pulse test operations within the program region to determine an optical HPW configuration for the program region, as disclosed herein.

Figure 6:
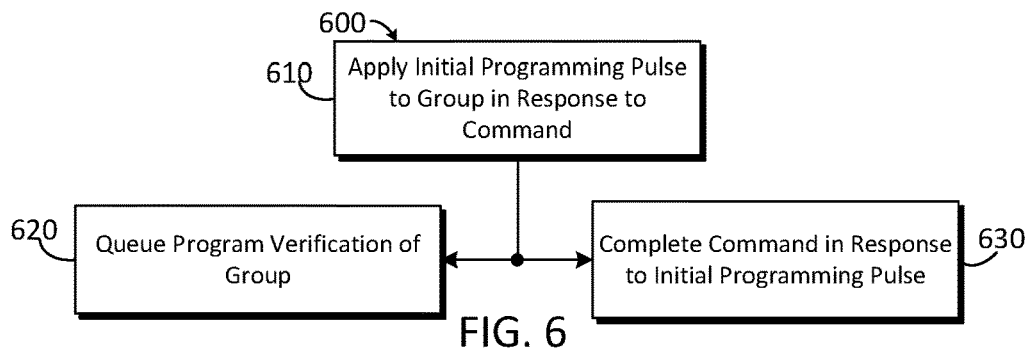
FIG. 6 is a flow diagram of one embodiment of a method for implementing high-performance write operations, as disclosed herein.

FIG. 6 is a flow diagram of one embodiment of a method 600 for high-performance write operations. One or more of the steps of the method 600 (and/or the other methods disclosed herein) may be embodied as instructions stored on a non-transitory computer-readable storage medium. The instructions may be configured to cause a computing device to perform the disclosed processing steps and/or operations. Alternatively, or in addition, one or more of the steps of the method 600 (and/or the other methods disclosed herein) may be embodied and/or implemented by hardware components, such as a circuit, monitoring device, control device, communication device, and/or the like.

The method 600 may comprise implementing an HPW operation on a group of cells 10, as disclosed herein. The HPW operation of method 600 may be implemented in response to a command (e.g., a foreground command, such as a host command). Step 610 may comprise applying an initial programming pulse to the group in response to the command. The initial programming pulse of the HPW operation may be configured to raise the $V_{TH}$ of selected cells 10 of the group to at least a minimum level below a reference voltage level for distinguishing programmed cells 10 from erased and/or non-programmed cells 10 (e.g., within a minimum level below $V_{REF}$). The initial programming pulse may be configured to raise the $V_{TH}$ of the selected cells 10 to at least $V_{REF}$–UPF. The configuration of the initial programming pulse may be defined in an HPW configuration for the group (e.g., an HPW configuration for a program region comprising the group). Alternatively, or in addition, the configuration of the initial programming pulse may be defined in a default HPW configuration 181, which may be used in HPW operations throughout the memory 115. Step 610 may comprise one or more of: the write circuit 134 applying a single programming pulse to the group, the memory controller 131 configuring the write circuit 134 and/or driver circuitry 136 to apply the single programming pulse to the group, and/or command processing logic 122 configuring the memory control circuitry 130 to apply the single programming pulse to the group, as disclosed herein.

Step 620 may comprise queuing background verification of the group in response to the initial programming pulse, as disclosed herein. Step 620 may comprise recording a background verification entry. Step 620 may comprise queuing the entry to a background verification queue 129. Step 620 may comprise associating the entry with information pertaining to the background verification operation, such as a physical address of the group, a UPF for use in identifying under-programmed cells 10 of the group, a background verification threshold (e.g., $\Delta t_{MAX}$), a configuration for an additional programming pulse to be applied to the under-programmed cells 10, and/or the like. The entry may comprise and/or reference the HPW configuration for the group.

Step 630 may comprise completing the command in response to the initial programming pulse of step 610. Step 630 may comprise reporting that the command is complete, returning from the command, generating a completion and/or return code, acknowledging execution of the command, issuing a notification that the command has been completed, and/or the like. Step 630 may comprise completing the command prior to performing the queued background verification of the group. Step 630 may comprise completing the command without verifying programming of the group (and/or selected cells 10 therein). Step 630 may comprise completing the command without validating, verifying, reading, and/or sensing the cells 10 comprising the group. Step 630 may comprise completing the command while one or more of the cells 10 of the group is in an under-programmed state. Step 630 may comprise completing the command while one or more of the cells 10 has a $V_{TH}$ below $V_{REF}$ (and/or above $V_{REF}$ less a delta value, such as UPF). Step 630 may comprise completing the command such that a latency of the command includes a latency for applying the initial programming pulse, and excludes a latency for validating, verifying, reading, and/or sensing the cells 10 comprising the group. Step 630 may comprise reducing the program time of the group to substantially a latency for application of the initial programming pulse. Step 630 may comprise acknowledging completion of the command, returning a completion code in response to the command, recording a completion entry corresponding to the command, and/or the like. As illustrated in FIG. 6, steps 620 and 630 may be implemented in response to applying the initial programming pulse to the group. In some embodiments, steps 620 and 630 may be performed substantially concurrently and/or in parallel. Alternatively, step 630 may be performed after completion of step 620. Steps 620 and/or 630 may be implemented by one or more of the write circuit 134, memory controller 131, memory control circuitry 130, controller 120, command processing logic 122, write logic 126, metadata manager 128, manager 170, schedule logic 176, and/or the like.

Figure 7:
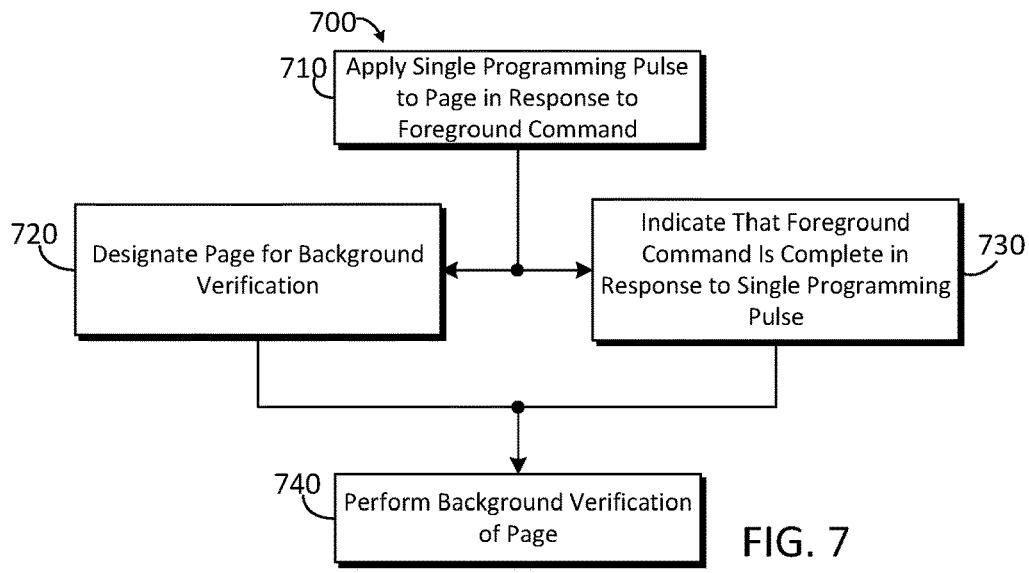
FIG. 7 is a flow diagram of one embodiment of a method for implementing high-performance, background-verified write operations, as disclosed herein.

FIG. 7 is a flow diagram of another embodiment of a method 700 for high-performance write operations. Step 710 may comprise applying a single programming pulse to a page 38 in response to a foreground command 150, as disclosed herein. The foreground command may comprise a request to store data within the memory 115. The foreground command 150 may be received from a host 101 via an interconnect 105, as disclosed herein. Step 710 may be performed in response to a first internal command 160A corresponding to the foreground command 150. The first internal command 160A may comprise a foreground internal command, and may comprise a physical address of the page 38, a configuration of the single programming pulse (e.g., the amplitude and/or duration of the single programming pulse), and/or the like. The single programming pulse may be configured to raise the $V_{TH}$ of selected cells 10 of the page 38 to at least a minimum level (e.g., $V_{REF}$–UPF), while preventing over-programming of the cells 10, regardless of cell-to-cell variations in the programming characteristics of the cells 10. The single programming pulse may comprise an under-program pulse, as disclosed herein.

Step 720 may comprise marking the page 38 for background verification. Marking the page 38 may comprise marking storage metadata, such as a logical-to-physical map 144, reverse map 145, an/or the like. Marking the page 38 may further comprise scheduling background verification for the page 38 by, inter alia, appending a background verification entry to a background verification queue 129. The background verification entry may comprise information pertaining to the background verification operation, as disclosed herein.

Step 730 may comprise indicating that the foreground command 150 is complete in response to the single programming pulse of step 710. Step 720 may comprise one or more of acknowledging completion of the foreground command 150, producing a return code in response to the foreground command 150, reporting completion of the foreground command 150, returning from execution of the foreground command 150, generating a completion entry corresponding to the foreground command 150, and/or the like. Step 720 may comprise issuing a first internal completion indication 162A corresponding to the first internal command 160A and/or a foreground completion indication 152 corresponding to the foreground command 150. Step 720 may comprise reporting that the foreground command 150 is complete without verifying programming of the page 38, without performing background verification on the page, without validating, verifying, reading, and/or sensing cells 10 of the page 38, and/or the like. Step 730 may comprise reducing the programming time of the page 38 to include the latency for applying the single programming pulse and exclude foreground verification of the page 38. As illustrated in FIG. 7, steps 720 and 730 may be implemented in response to applying the single programming pulse to the page 38. In some embodiments, steps 720 and 730 may be performed substantially concurrently and/or in parallel. Alternatively, step 730 may be performed after completion of step 720.

Step 740 may comprise performing background verification of the page 38. Step 740 may be implemented after step 730 (after indicating that the foreground command 150 of step 710 is complete). Step 740 may be implemented as a background operation during an idle period in which the memory system 510, device controller 120, and/or memory control circuitry 130 are not executing operations pertaining to foreground command(s) 150 (and/or no foreground commands 150 are available for execution). Step 740 may be implemented in response to a second internal command 160B. The second internal command 160B may comprise a background command that does not contribute to the latency of foreground command(s) 150.

Step 740 may comprise identifying under-programmed cells 10 of the page 38. In some embodiments, step 740 may comprise identifying under-programmed cells 10 based on a UPF for the page 38. The under-programmed cells 10 may comprise cells 10 with a $V_{TH}$ below $V_{REF}$ by less than the UPF. Step 740 may comprise sensing the cells 10 of the page 38 at each of $V_{REF}$ and $V_{REF}$–UPF. Alternatively, step 740 may comprise identifying the under-programmed cells 10 based on, inter alia, a $V_{TH}$ distribution of the cells 10 comprising the page 38. Step 740 may comprise performing a plurality of sense operations at respective levels (e.g., from about $V_E$ to about $V_{REF}$); deriving a $V_{TH}$ distribution curve from cell counts determined in the respective sense operations; and determining a minimum point between about $V_E$ and about $V_{REF}$ along the $V_{TH}$ distribution curve. The minimum point may be used to identify under-programmed cells 10, as disclosed herein.

Step 740 may further comprise applying an additional programming pulse to the identified cells 10. The additional programming pulse is configured to raise the $V_{TH}$ of the identified cells 10 to at least $V_{REF}$ without over-programming any of the cells 10 of the page 38. The additional programming pulse may have an amplitude and/or duration that is higher than the amplitude and/or duration of the single programming pulse. The amplitude of the additional programming pulse may be $V_{PGM\_AP} = V_{PGM\_SP} + V_{PGM\_BGTRIM}$, where $V_{PGM\_AP}$ is the amplitude of the additional programming pulse, $V_{PGM\_SP}$ is the amplitude of the single programming pulse, and $V_{PGM\_BGTRIM}$ is a trim factor. Step 740 may further comprise clearing the marking from the page 38 in response to completing the background verification operation (e.g., in response to the additional programming pulse). The UPF and/or configuration of the additional programming pulse may be defined in a default HPW configuration, an HPW configuration pertaining to the page 38 (an HPW configuration for a program region comprising the page 38), and/or the like.

Figure 8:
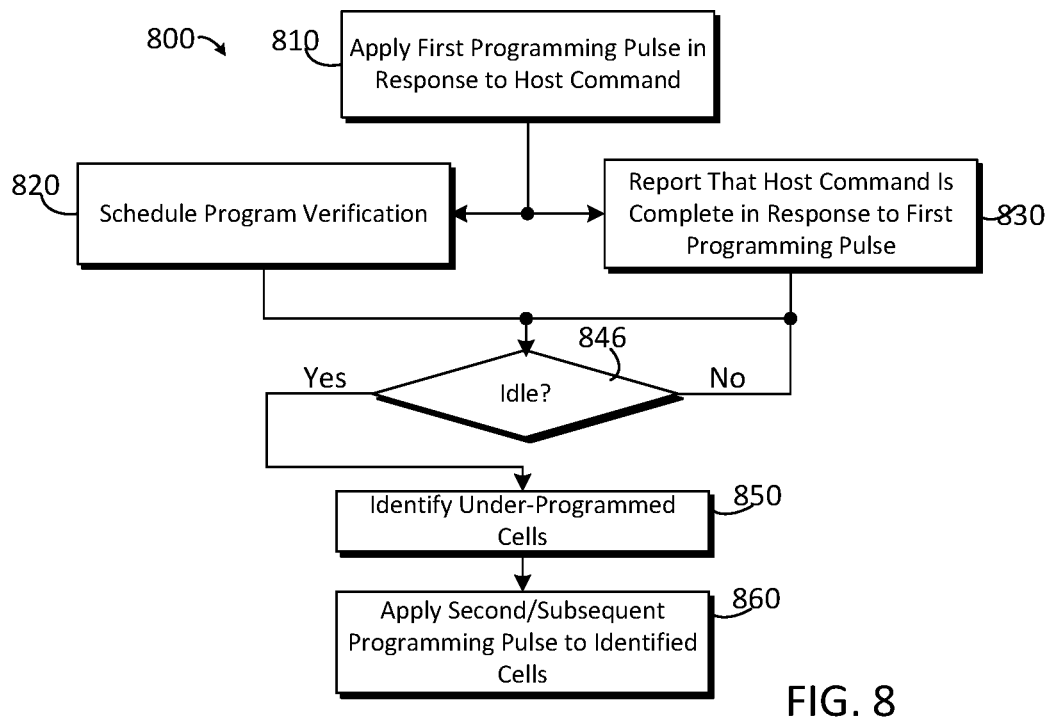
FIG. 8 is a flow diagram of one embodiment of a method for implementing high-performance write operations that are verified during idle periods, as disclosed herein.

FIG. 8 is a flow diagram of another embodiment of a method 800 for high-performance write operations. Step 810 may comprise applying a first programming pulse in response to a host command, as disclosed herein. Step 810 may comprise applying the first programming pulse to a group of cells 10 (e.g., a page 38, a group of pages 38, and/or the like). Step 820 may comprise scheduling program verification of the group and step 830 may comprise reporting that the host command is complete in response to the first programming pulse, as disclosed herein. Step 820 may comprise marking the group for verification to be performed subsequent to reporting that the host command is complete at step 830.

Step 846 may comprise determining whether the memory system 510, device controller 120, and/or memory control circuitry 130 are idle. Step 846 may comprise monitoring foreground commands 150 (and/or corresponding internal commands 160), as disclosed herein. Step 846 may further comprise monitoring the availability of pending foreground commands 150 (e.g., monitoring a submission queue). Step 846 may further comprise monitoring the availability of resources of the memory system 510, as disclosed herein. If the determination of step 846 is that idle resources are available for use for background verification, the flow may continue at step 850; otherwise, the flow may continue back at step 846.

Steps 850 and 860 may comprise implementing a background verification operation on the group of cells 10. Step 850 may comprise identifying under-programmed cells 10 within the group, and step 860 may comprise applying a second and/or subsequent programming pulse to the under-programmed cells 10, as disclosed herein. The second programming pulse may be applied subsequent to reporting completion of the host command at step 830 (e.g., may be applied after completion of the host command). The second programming pulse may be applied to the identified cells 10 in addition to the first programming pulse (e.g., step 860 may comprise applying an additional and/or corrective programming pulse to the under-programmed cells 10).

Figure 9:
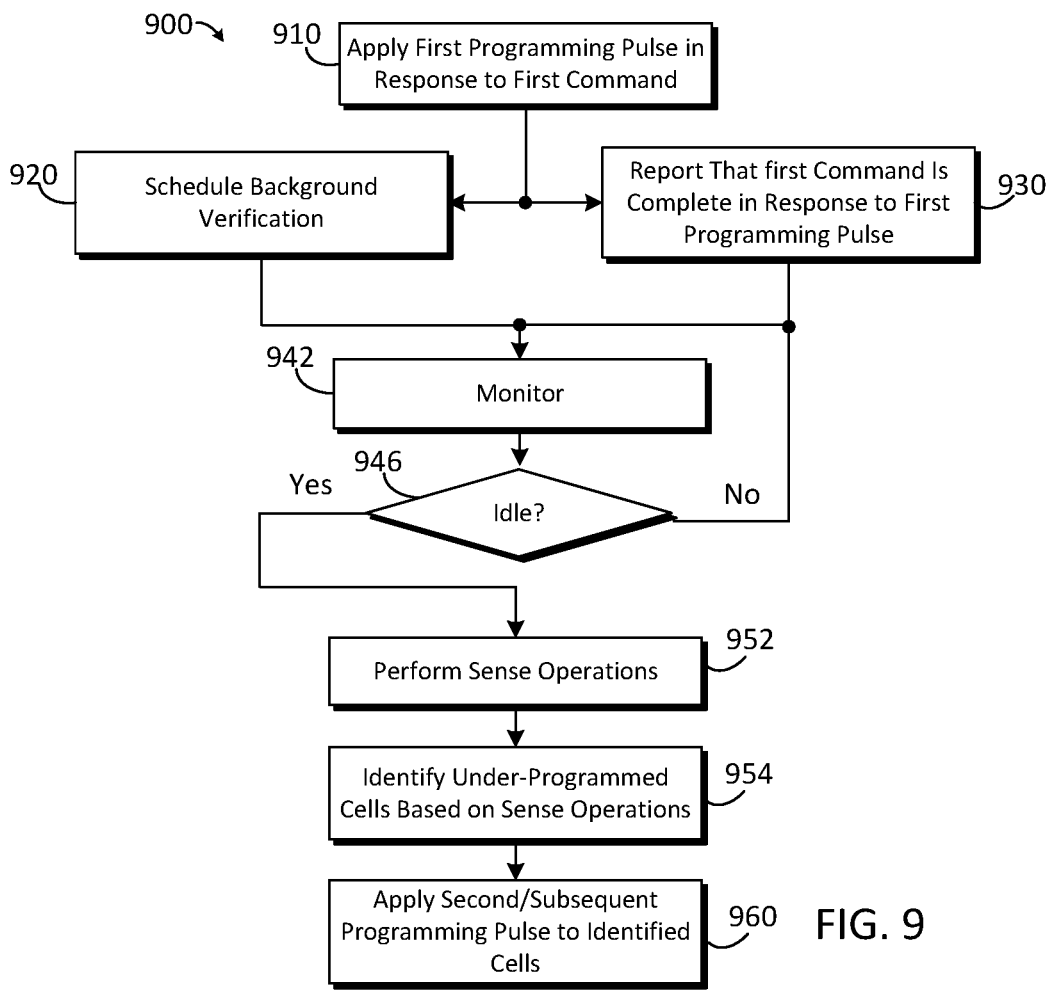
FIG. 9 is a flow diagram of one embodiment of a method for implementing high-performance write operations and corresponding background verification operations, as disclosed herein.

FIG. 9 is a flow diagram of another embodiment of a method 900 for high-performance write operations. Step 910 may comprise applying a first programming pulse to a group of cells 10 in response to a first command, as disclosed herein. The first command may comprise one or more of a foreground command 150, a host command, a foreground internal command 160 (e.g., a first internal command 160A), and/or the like. Step 920 may comprise scheduling background verification of the group. Step 930 may comprise reporting that the first command is complete in response to the first programming pulse, as disclosed herein.

Step 942 may comprise monitoring command execution, as disclosed herein. Step 942 may comprise monitoring the receiving, fetching, and/or retrieving of foreground commands 150 via the interconnect 105 (e.g., host commands). Step 942 may comprise monitoring the execution of foreground commands 150 (and/or availability of pending foreground commands 150). Step 942 may comprise monitoring the utilization of respective resources. Step 942 may comprise detecting availability of idle resources capable of implementing background verification operations, as disclosed herein.

Step 946 may comprise determining whether idle resources capable of implementing background verification operations are available. If the determination of step 946 is that idle resources are available, the flow may continue to step 952; otherwise, the flow may continue back at step 942.

Steps 952-960 may comprise performing background verification of the group of cells 10, as disclosed herein. Step 952 may comprise performing sense operations within the group of cells 10. In some embodiments, step 952 comprises performing sense operations at each of $V_{REF}$ and $V_{REF}$–UPF. Alternatively, step 952 may comprise: performing a plurality of sense operations at respective levels (e.g., from about $V_E$ to about $V_{REF}$); deriving a $V_{TH}$ distribution curve from cell counts determined in the respective sense operations; and determining a minimum point between about $V_E$ and about $V_{REF}$ along the $V_{TH}$ distribution curve.

Step 954 may comprise identifying under-programmed cells 10 in response to the sense operations of step 952. In some embodiments, step 954 may comprise identifying under-programmed cells 10 based on a UPF for the group, which may comprise identifying under-programmed cells 10 as cells 10 determined to be conducting at $V_{REF}$–UPF and not conducting at $V_{REF}$. Alternatively, step 954 may comprise identifying under-programmed cells 10 based on the $V_{TH}$ distribution curve derived from the sense operations of step 952. Step 954 may comprise using the determined minimum point along the $V_{TH}$ distribution curve to identify under-programmed cells 10, as disclosed herein. Step 960 may comprise applying the second and/or subsequent programming pulse to the under-programmed cells 10 identified at step 954.

Figure 10:
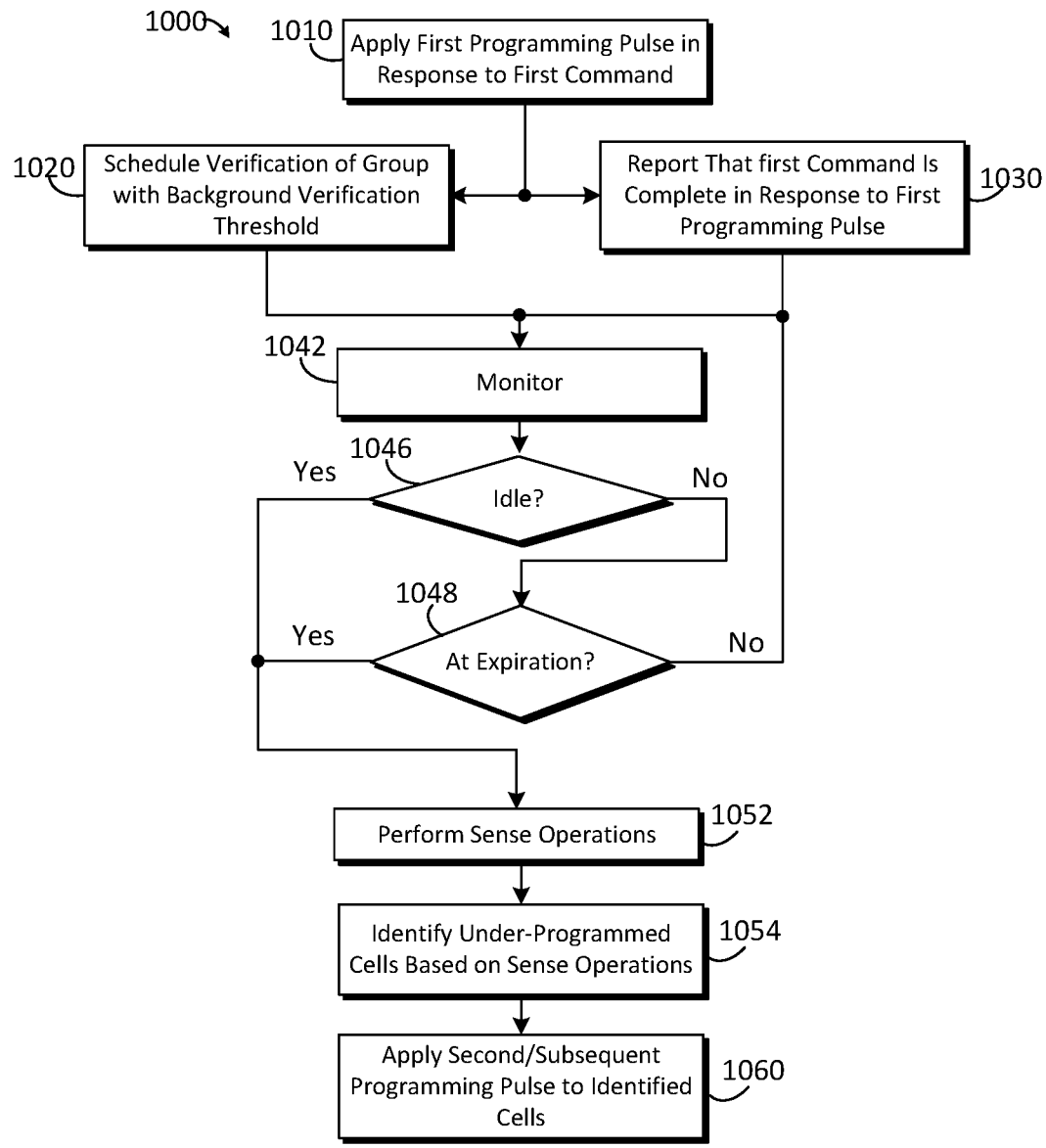
FIG. 10 is a flow diagram of one embodiment of a method for implementing a high-performance write operations and corresponding background verification operations within respective time thresholds, as disclosed herein.

FIG. 10 is a flow diagram of another embodiment of a method 1000 for high-performance write operations. Step 1010 may comprise applying a first programming pulse to a group of cells 10 in response to a first command, step 1020 may comprise scheduling verification of the group, and step 1030 may comprise reporting that the first command is complete in response to the first programming pulse, as disclosed herein. Step 1020 may further comprise scheduling verification of the group in accordance with a background verification threshold for the group (e.g., $\Delta t_{MAX}$). Step 1020 may comprise setting an expiration time at which the verification of the group should be completed, as disclosed herein (e.g., $t_E=t_P+\Delta t_{MAX}$, where $t_E$ is the expiration time for verification of the group, $t_P$ is the time at which the first programming pulse was applied, and $\Delta t_{MAX}$ is the background verification threshold for the group).

Step 1042 may comprise monitoring command execution, and step 1046 may comprise determining whether idle resources capable of implementing background verification operations are available, as disclosed herein. If idle resources are determined to be available at step 1046, the flow may continue at step 1052; otherwise, the flow may continue at step 1048.

Step 1048 may comprise determining whether the background verification operation is at, or near, the expiration time thereof. Step 1048 may comprise comparing a current time (the time at which step 1048 is performed) to an expiration time of the scheduled background verification. Step 1048 may comprise determining whether the current time is at (or within a threshold of) the expiration time. In response to determining that the current time is at (or within a threshold of) the expiration time, step 1048 may comprise implementing background verification of the group as a foreground operation (and the flow may continue at step 1052); otherwise, the flow may continue back at step 1042. Steps 1052-1060 may comprise verifying programming of the group of cells 10, as disclosed herein.

Figure 11:
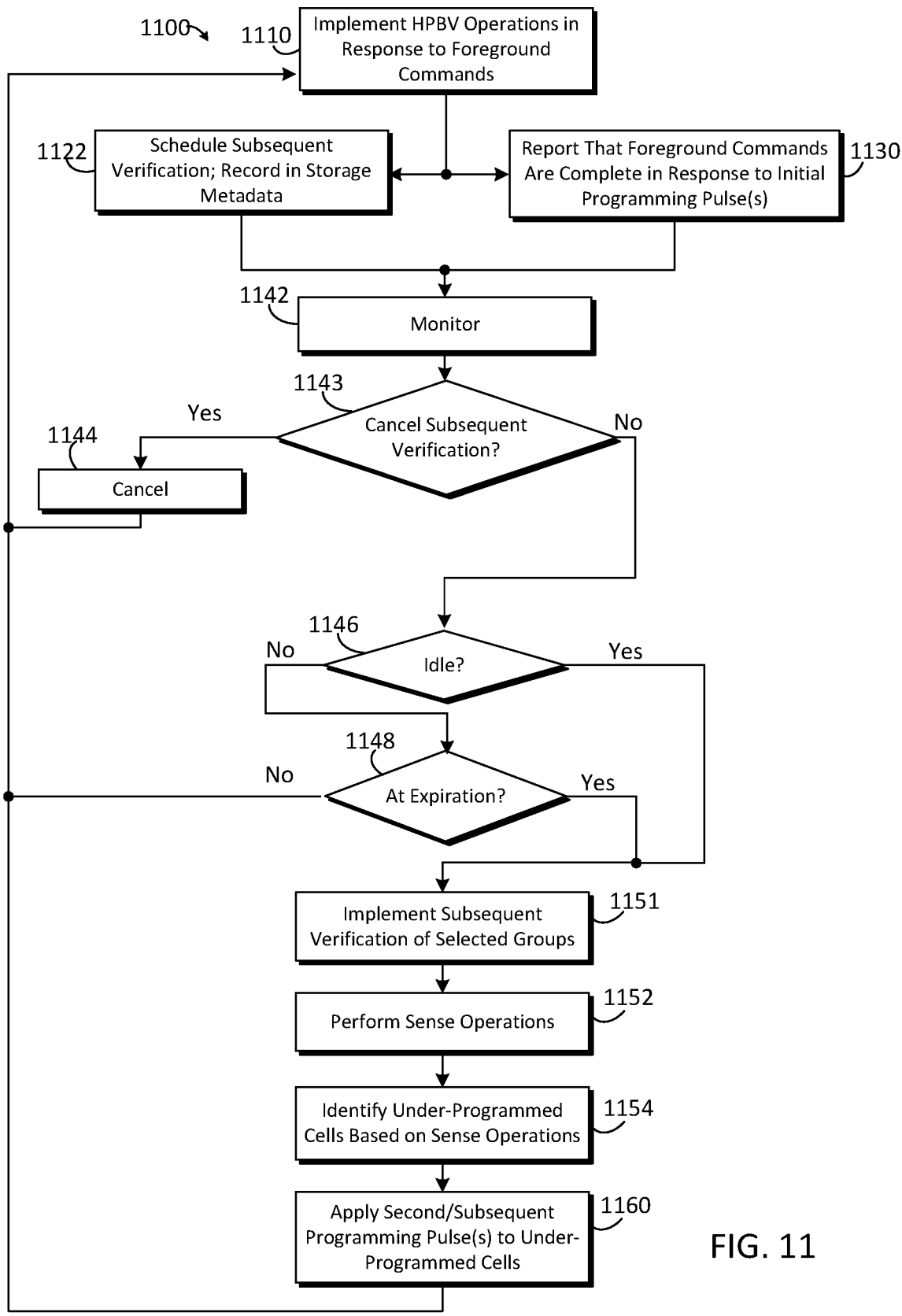
FIG. 11 is a flow diagram of one embodiment of a method for implementing high-performance write operations and corresponding verification operations within a verification threshold, as disclosed herein.

FIG. 11 is a flow diagram of another embodiment of a method 1100 for high-performance write operations. Step 1110 may comprise implementing HPW operations in response to respective foreground commands 150. Step 1110 may comprise applying first programming pulse(s) to respective groups of cells 10 in response to respective foreground commands 150. Step 1122 may comprise scheduling subsequent verification of the respective groups of cells 10. Step 1122 may comprise scheduling the groups for background verification, as disclosed herein (e.g., by appending background queue entries to a queue 129, marking logical address(es) and/or physical address(es) pertaining to the group in storage metadata, and/or the like). Step 1122 may further comprise configuring the metadata logic 128 to notify background verification logic 177 of changes pertaining to the logical identifier(s) and/or physical address (es), as disclosed herein. In some embodiments, step 1122 comprises determining expiration times for subsequent verification of the respective groups (e.g., based on $\Delta t_{MAX}$ determined for the respective groups). Step 1130 may comprise reporting that the foreground commands are complete in response to completing the corresponding HPW operations. Step 1130 may comprise reporting completion of foreground commands in response to applying (and/or configuring the memory control circuitry 130 to apply) first, initial, and/or single programming pulses to the respective groups, as disclosed herein. The amplitude and/or duration of the first programming pulse(s) may be configured in accordance with HPW configuration(s) pertaining to the respective groups.

Step 1142 may comprise monitoring memory resources. Step 1142 may comprise one or more of monitoring execution of the foreground commands 150, availability of pending foreground commands 150, utilization of respective resources (e.g., resources of the device and/or system controller 120, memory control circuitry 130, memory structure 113, and so on), and/or the like. Step 1142 may further comprise monitoring the storage metadata to detect changes pertaining to the logical identifier(s) and/or physical address (es) associated with the groups scheduled for subsequent verification. Step 1142 may comprise monitoring one or more of the logical-to-physical map 144, the reverse map 145, and/or the like.

Step 1143 may comprise determining whether subsequent verification of one or more groups can be canceled based on, inter alia, the monitoring of step 1142. Step 1143 may comprise determining that subsequent verification of a group may be canceled in response to determining that the logical address(es) associated with the group have been trimmed, deallocated, unmapped, remapped, and/or the like (e.g., in the logical-to-physical map 144). Step 1143 may further comprise determining that subsequent verification may be canceled in response to determining that data stored at physical address(es) associated with the group no longer need to be retained (e.g., are invalid, evicted, and/or obsolete as indicated by the reverse map 145). In response to determining to cancel subsequent verification of one or more groups, the flow may continue at step 1144; otherwise, and if one or more groups remain scheduled for subsequent verification, the flow may continue to step 1146. Step 1144 may comprise canceling subsequent verification of the groups identified at step 1143. Step 1144 may comprise removing corresponding entries from the background verification queue 129, clearing corresponding marking(s) from the storage metadata, and/or the like, as disclosed herein.

Steps 1146-1160 may comprise subsequent verification of one or more groups of cells 10. Step 1146 may comprise determining whether idle resources capable of implementing subsequent verification are available, as disclosed herein. If idle resources are determined to be available at step 1146, the flow may continue at step 1151; otherwise, the flow may continue at step 1148. Step 1148 may comprise determining whether any remaining subsequent verification operations are at, or near, the expiration times thereof. Step 1148 may comprise determining a remaining time ($t_R$) for subsequent verification of respective groups, as $t_{R\_G}=\Delta t_{MAX\_G}-\Delta t_{PRG\_G}$, where $\Delta t_{MAX\_G}$ is the verification threshold for a particular group G, $\Delta t_{PRG\_G}$ is the time elapsed since the first programming pulse was applied to the group G, and $t_{R\_G}$ is the remaining time until subsequent should/must be performed on group G. Step 1148 may comprise determining whether the remaining time ($t_R$) for subsequent verification of one or more groups is at or below a threshold. In response to identifying one or more subsequent verification operations that are at (or near) the expiration times thereof, the flow may continue to step 1151, where the identified subsequent verification operations may be performed, regardless of whether idle resources are available; otherwise, the flow may continue back at step 1110.

Step 1151 may comprise selecting groups for subsequent verification, as disclosed herein. Step 1151 may comprise selecting groups for subsequent verification based on, inter alia, expiration time(s) of the subsequent verification operations scheduled thereon, such that subsequent verification operations having less remaining time are implemented before those having more remaining time. Steps 1152-1160 may comprise implementing subsequent verification of the groups selected at step 1151, as disclosed herein. Subsequent verification of a group may comprise performing sense operation(s) on the group (step 1152) to identify under-programmed cells 10 (step 1154), and applying a second and/or subsequent programming pulse to the under-programmed cells 10 (if any) at step 1160. Steps 1151-1160 may be performed during idle periods (as indicated in step 1146). Alternatively, or in addition, steps 1151-1160 may be implemented until scheduled verification operations nearing expiration have been completed, regardless of whether idle resources are available.

Figure 12A:
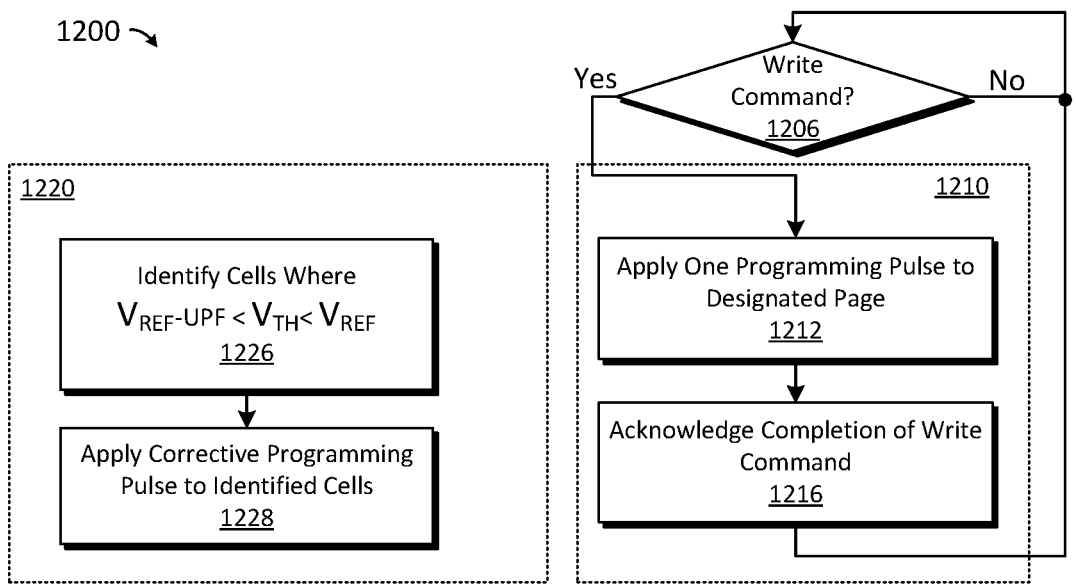
FIG. 12A is a flow diagram of another embodiment of a method for implementing high-performance, asynchronously validated operations, as disclosed herein.

FIG. 12A is a flow diagram of another method 1200 for implementing high-performance write operations, as disclosed herein. The method 1200 may be configured to implement HPW operations to write data to respective groups of cells 10, as disclosed herein (e.g., respective pages 38). Step 1206 may comprise determining whether a write command is available for execution. Step 1206 may comprise determining whether a foreground command 150 comprising a write request has been received (e.g., via the interconnect 105). Alternatively, or in addition, step 1206 may comprise determining whether a host- and/or device-based command queue comprises a write command.

In response to determining that a write command is available for execution at step 1206, the method 1201 may further comprise performing foreground operations 1210 to execute the write command. The write command may comprise a foreground command 150 (e.g., an external command, host command, and/or the like). The foreground operations 1210 may comprise operations that contribute to the latency of the write command. The foreground operations 1210 performed in response to the write command may comprise: applying one programming pulse to a designated page 38 at step 1212, and acknowledging completion of the write command in response to the one programming pulse at step 1216. The one programming pulse may comprise a first and/or initial programming pulse, as disclosed herein. The one programming pulse applied at step 1212 may be configured to raise the $V_{TH}$ of selected cells 10 of the designated page 38 to at least $V_{REF}$–UPF, while preventing over-programming of substantially any of the cells 10 of the designated page 38, regardless of cell-to-cell variations in the programming characteristics thereof. The configuration of the one programming pulse (e.g., amplitude and/or duration) may be defined in an HPW configuration pertaining to the designated page 38. Step 1216 may comprise acknowledging completion of the write command in response to applying the one programming pulse (and/or configuring the memory control circuitry 130, write circuitry 134, and/or driver circuitry 136 to apply the one programming pulse), as disclosed herein. Step 1216 may comprise one or more of: indicating that the write command is complete, returning a completion code in response to the write command, returning a foreground completion indication 152, returning an internal completion indication 162, and/or the like. Step 1216 may further comprise scheduling post-write validation of the designated page 38 to be completed after completion of the write command has been acknowledged (e.g., scheduling verification of the page 38 to be performed subsequent to completion of the write command). After acknowledging completion of the write command at step 1216, the foreground operations 1210 may comprise waiting for a next write command (or other foreground command) at step 1206.

The latency of the foreground operations 1210 required to complete execution of the write command may include: the latency for applying the one programming pulse and acknowledging completion of the write command (e.g., steps 1212 and 1216). Step 1216 may be completed prior to verifying programming of the designated page 38 (e.g., prior to implementing the post-write validation operation scheduled for the designated page 38). Step 1216 may be completed without validating, verifying, reading, and/or sensing cells 10 of the designated page 38. The latency of the write command may, therefore, exclude latencies for foreground verification of the designated page 38, foreground operation(s) to validate, verify, read, and/or sense cells 10 of the designated page 38, and/or the like.

Programming of the designated page 38 may be verified and/or corrected in asynchronous operations 1220. The asynchronous operations 1220 may comprise background operations that do not contribute to the latency of foreground commands (e.g., write commands). The asynchronous operations 1220 may be configured to implement post-write validation of the designated page 38 after completion of the write command (e.g., after acknowledging completion of the write command at step 1216). The asynchronous operations 1220 may be implemented in response to detecting an idle condition and/or in response to determining that post-write validation of the designated page 38 has been scheduled, queued, recorded and/or the like (e.g., the designated page 38 has been marked for post-write validation, as disclosed herein). The asynchronous operations 1220 may comprise system-driven operations managed by the device and/or system controller 120 (and/or the memory control circuitry 130), as disclosed herein. The asynchronous operations 1220 may comprise: identifying cells 10 of the designated page 38 in which $V_{TH}$ of the cell 10 is within UPF of $V_{REF}$ at step 1226, and applying a corrective programming pulse to the identified cells 10 (if any) at step 1228. Step 1226 may comprise performing a plurality of sense operations, including a sense operation at $V_{REF}$–UPF and at $V_{REF}$. The value UPF may be defined in an HPW configuration pertaining to the designated page 38, as disclosed herein. Alternatively, or in addition, the UPF may be determined from a $V_{TH}$ distribution curve of the cells 10 comprising the designated page 38, as disclosed herein. The $V_{TH}$ distribution curve may be derived from cell counts determined in sense operations performed at respective sense levels ranging from a low sense level at about $V_E$ to a high sense level at about $V_{REF}$. An optimal UPF for distinguishing under-programmed cells 10 of the designated page 38 from erased and/or non-programmed cells 10 of the designated page 38 may correspond to a minima within the $V_{TH}$ distribution curve.

The corrective programming pulse of step 1228 may comprise a second and/or additional programming pulse, as disclosed herein. The corrective programming pulse may have an amplitude and/or duration configured to raise the $V_{TH}$ of substantially all of the identified cells 10 to at least $V_{REF}$ and prevent over-programming of substantially any of the cells 10 of the designated page 38, regardless of the programming characteristics thereof. The amplitude of the corrective programming pulse may be higher than the amplitude of the one programming pulse by a trim factor (e.g., $V_{BG\_TRIM}$, $V_{PGM\_TRIM}$, and/or the like). The configuration of the corrective programming pulse may be defined in, inter alia, an HPW configuration pertaining to the designated page 38, as disclosed herein. The asynchronous operations 1220 may comprise performing scheduled post-write validation operations until such operations are complete and/or until idle resources are no longer available (e.g., until a next foreground command, such as a write command, is available for execution).

Figure 12B:
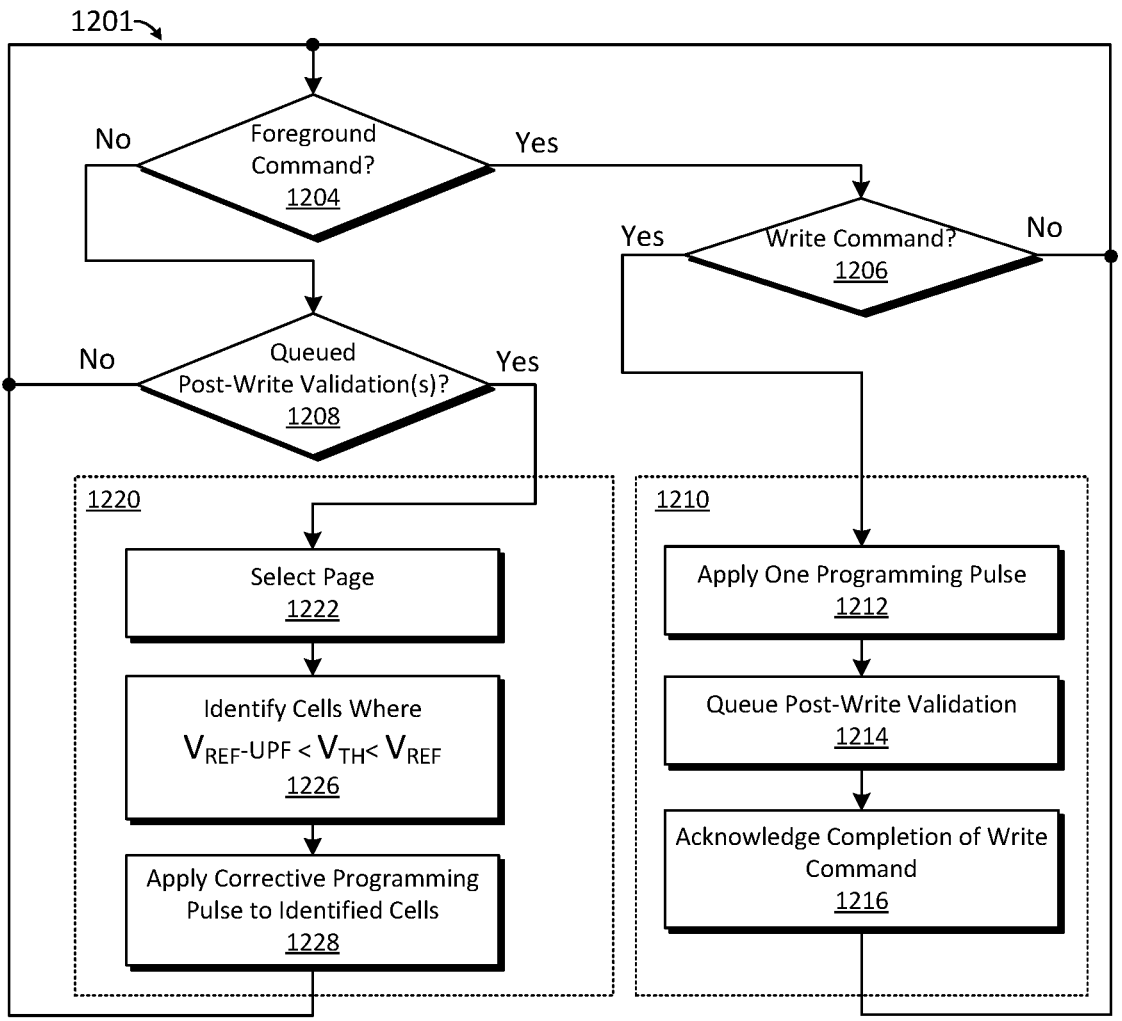
FIG. 12B is a flow diagram of another embodiment of a method for implementing high-performance, asynchronously validated operations, as disclosed herein.

FIG. 12B is a flow diagram of another method 1201 for implementing high-performance write operations, as disclosed herein. The method 1201 may be configured to implement HPW operations to write data to respective groups of cells 10, as disclosed herein (e.g., respective pages 38). Step 1204 may comprise determining whether a foreground command 150 is available for execution. Step 1204 may comprise determining whether the controller 120, and/or memory control circuitry 130 are idle, as disclosed herein. Step 1204 may be implemented by command processing logic 122 and/or idle logic 172 of the device controller 120. Alternatively, or in addition, step 1204 may be implemented, at least in part, by the memory control circuitry 130. In response to determining that a foreground command 150 is available for execution, the flow may continue at step 1206; otherwise, the flow may continue at step 1208.

Step 1206 may comprise determining whether the foreground command 150 comprises and/or corresponds to a write command. In response to determining that the foreground 150 comprises and/or corresponds to a write command, the method 1201 may comprise executing the write command in foreground operation(s) 1210, as disclosed herein; otherwise, the flow may continue back at step 1204. The foreground operations 1210 may comprise: applying one programming pulse to a designated page 38 at step 1212, queuing post-write validation operation of the designated page 38 at step 1214, and acknowledging completion of the write command at step 1216. Step 1216 may comprise acknowledging completion of the write command in response to the one programming pulse, independent of step 1214 (e.g., completion of the write command may be acknowledged before queuing the post-write validation operation on the designated page 38 at step 1214). After completion of the write command, the flow may return to step 1204, which may comprise executing a next foreground command 160 (if available).

Step 1208 may be performed during an idle period (e.g., when no foreground command(s) 150 are available for execution and/or are currently being executed). Step 1208 may comprise determining whether one or more post-write validation operations are queued (e.g., whether a background verify queue 129 comprises one or more background verification entries). In response to determining that one or more post-write validation operations are queued, the flow may continue at asynchronous operations 1220; otherwise, the flow may continue back to step 1204. The asynchronous operations 1220 may comprise background operations for implementing post-write validation of a page 38, as disclosed herein, including: selecting a page 38 for post-write validation at step 1222, identifying cells 10 of the selected page 38 having a $V_{TH}$ within UPF of $V_{REF}$ at step 1226, and/or applying a corrective programming pulse to the identified cells 10 at step 1228.

Step 1222 may comprise selecting a page 38 for post-write validation. Step 1222 may comprise selecting an entry from a background verify queue 129, as disclosed herein. Step 1222 may comprise selecting the entry based on, inter alia, the order in which the entry was queued relative to other entries within the background verify queue 129, an expiration time of the queued entries (e.g., remaining time $t_R$ for respective post-write validation operations), and/or other suitable selection criteria. In some embodiments, step 1222 may comprise selecting a page 38 at a verify point, which may be advanced sequentially within the physical address space of the memory 115 in accordance with an append point, as disclosed herein.

Step 1226 may comprise identifying cells 10 of the selected page 38 that have a $V_{TH}$ within UPF below $V_{REF}$, as disclosed herein. Step 1226 may further comprise determining an optimal UPF for the selected page 38 based on, inter alia, a $V_{TH}$ distribution curve, which may be derived from sense operations performed on the selected page 38 at different respective voltage levels. Step 1228 may comprise applying a corrective programming pulse to selected page 38, as disclosed herein. Step 1228 may comprise inhibiting cells 10 other than the identified cells 10 during the corrective programming pulse.

Figure 12C:
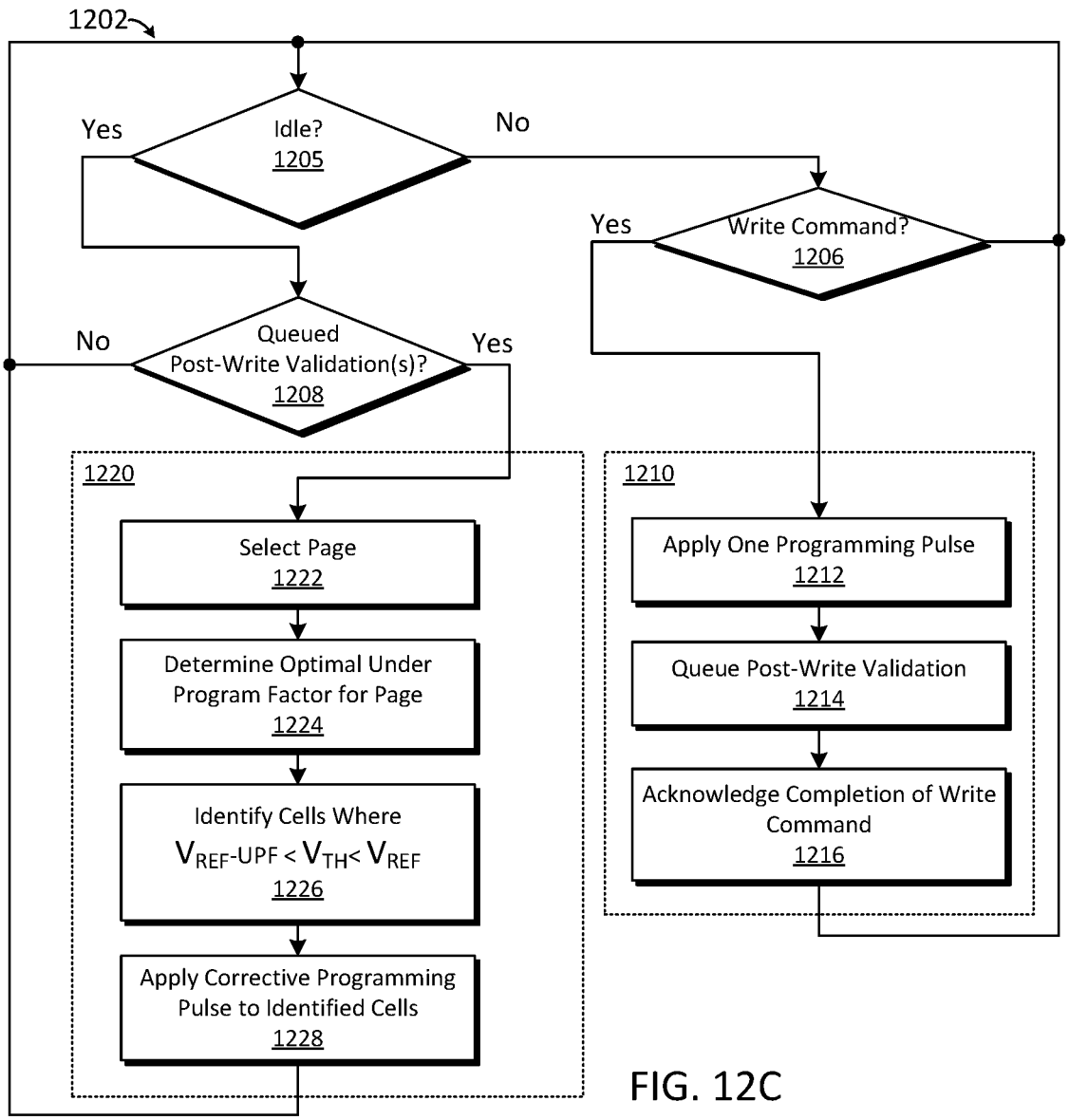
FIG. 12C is a flow diagram of another embodiment of a method for implementing high-performance, asynchronously validated operations, as disclosed herein.

FIG. 12C is a flow diagram of another method 1202 for implementing high-performance write operations, as disclosed herein. Step 1205 may comprise determining whether an idle condition exists (e.g., whether one or more of the controller 120, and/or memory control circuitry 130 are idle, as disclosed herein). Step 1205 may comprise monitoring execution and/or availability of foreground commands 150 (and/or corresponding foreground internal commands 160). Step 1205 may further comprise monitoring utilization of respective resources in order to, inter alia, identify idle resources suitable for executing post-write validation operations. In response to determining that an idle condition does not exist (e.g., one or more foreground commands 150 are pending for execution), the flow may continue at step 1206; otherwise, the flow may continue at step 1208. Step 1206 may comprise determining whether a write command is available for execution. The write command may comprise a foreground command 150 that comprises and/or corresponds to a request to write, program, and/or store data within the memory resources 111. In response to determining that a write command is available for execution at step 1206, the flow may continue to foreground operations 1210; otherwise, the flow may continue back at step 1205. The foreground operations 1210 to execute the write command may comprise applying one programming pulse to a designated page 38 at step 1212, queuing post-write validation of the designated page 38 at step 1214, and/or acknowledging completion of the write command at step 1216, as disclosed herein.

Step 1208 may be implemented in response to detecting an idle condition at step 1205, and may comprise determining whether one or more pages 38 are queued for post-write validation, as disclosed herein. In response to determining that one or more pages are queued for post-write validation, the flow may continue to asynchronous operations 1220; otherwise, the flow may continue back at step 1205. The asynchronous operations 1220 may comprise selecting a page 38 for post-write validation at step 1222, as disclosed herein. Step 1224 may comprise determining an optimal UPF for the selected page 38. Step 1224 may comprise deriving a $V_{TH}$ distribution curve from cell counts determined in respective sense operations performed on the selected page 38, each sense operation performed at a respective level ranging between about $V_E$ and $V_{REF}$. Step 1224 may further comprise determining a minima along the $V_{TH}$ distribution curve using a suitable technique (e.g., gradient descent, valley search, and/or the like). Step 1224 may further comprise determining the optimal UPF for the selected page 38 in accordance with the determined minima (e.g., calculating the optimal UPF such that $V_{REF}$–UPF is at a voltage level corresponding to the determined minima). Step 1224 may further comprise recording the optimal UPF in an HPW configuration for the page 38, as disclosed herein.

Step 1226 may comprise identifying cells 10 of the selected page 38 having a $V_{TH}$ between $V_{REF}$–UPF and $V_{REF}$, and step 1228 may comprise applying a corrective programming pulse to the identified cells 10 of the selected page 38, as disclosed herein.

Step 1204 may be implemented by command processing logic 122 and/or idle logic 172 of the device controller 120. Alternatively, or in addition, step 1204 may be implemented, at least in part, by the memory control circuitry 130. In response to determining that a foreground command 150 is available for execution, the flow may continue at step 1206; otherwise, the flow may continue at step 1208.

Step 1206 may comprise determining whether the foreground command 150 comprises and/or corresponds to a write command. In response to determining that the foreground 150 comprises and/or corresponds to a write command, the method 1201 may comprise executing the write command in foreground operation(s) 1210, as disclosed above; otherwise, the flow may continue back at step 1204. The foreground operations 1210 may comprise: applying one programming pulse to a designated page 38 at step 1212, queuing post-write validation of the designated page 38 at step 1214, and acknowledging completion of the write command at step 1216. Step 1216 may comprise acknowledging completion of the write command in response to the one programming pulse, independent of step 1214 (e.g., completion of the write command may be acknowledged before queuing the post-write validation operation on the designated page 38 at step 1214). After completion of the write command, the flow may return to step 1204, which may comprise executing a next foreground command 160 (if available).

Step 1208 may be performed during an idle period (e.g., when no foreground commands 150 are available for execution and/or are currently being executed). Step 1208 may comprise determining whether one or more post-write validation operations are queued for execution (e.g., whether a background verify queue 129 comprises one or more background verification entries). In response to determining that one or more post-write validation operations are queued, the flow may continue at asynchronous operations 1220; otherwise, the flow may continue back to step 1204. The asynchronous operations 1220 may comprise background operations for implementing post-write validation of one or more pages 38, as disclosed herein, including selecting a page 38 for post-write validation at step 1222, identifying cells 10 of the selected page 38 having a $V_{TH}$ within UPF of $V_{REF}$ at step 1226, and/or applying a corrective programming pulse to the identified cells 10 at step 1228.

Step 1222 may comprise selecting a page 38 for post-write validation. Step 1222 may comprise selecting an entry from a background verify queue 129, as disclosed herein. Step 1222 may comprise selecting the entry based on, inter alia, the order in which the entry was queued relative to other entries within the background verify queue 129, an expiration time of the queued entries, and/or other suitable selection criteria. In some embodiments, step 1222 may comprise selecting a page 38 at a verify point, which may be advanced sequentially within the physical address space of the memory 115 in accordance with an append point, as disclosed herein.

Step 1226 may comprise identifying cells 10 of the selected page 38 that have a $V_{TH}$ within UPF below $V_{REF}$, as disclosed herein. Step 1226 may further comprise determining an optimal UPF for the selected page 38 based on, inter alia, a $V_{TH}$ distribution curve, which may be derived from sense operations performed on the selected page 38 at different respective voltage levels. Step 1228 may comprise applying a corrective programming pulse to selected page 38, as disclosed herein. Step 1228 may comprise inhibiting cells 10 other than the identified cells 10 during the corrective programming pulse.

Figure 13:
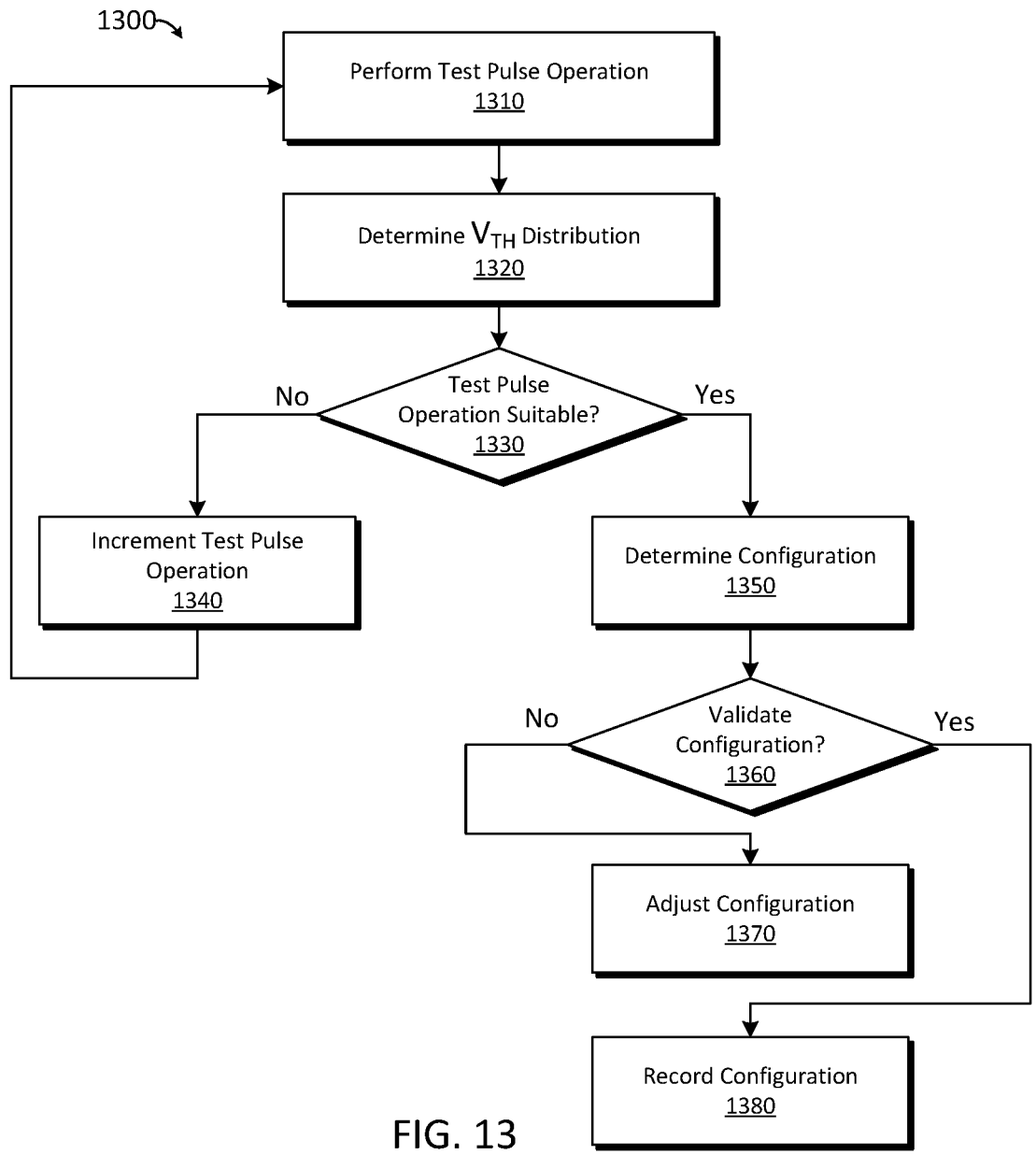
FIG. 13 is a flow diagram of one embodiment of a method for determining a configuration for high-performance, background-verified operations, as disclosed herein.

FIG. 13 is a flow diagram of one embodiment of a method 1300 for managing HPW configuration data. Step 1310 may comprise performing a test pulse operation on a test group of cells 10, as disclosed herein. Step 1310 may comprise erasing cells 10 of the test group and applying a test programming pulse to selected cells 10 within the test group. Step 1310 may comprise configuring the test programming pulse to have an initial amplitude and/or duration (e.g., to an amplitude at about $V_{PGM\_LOW}$ or below, in accordance with design, fabrication, and/or process characteristics of the cells 10 comprising the test group). Step 1320 may comprise determining a $V_{TH}$ distribution curve for the test group, which may comprise: performing sense operations at respective levels (ranging from about $V_E$ to about $V_{TH\_MAX}$ and/or $V_{PASS}$); and deriving the $V_{TH}$ distribution curve from cell counts determined in the respective sense operations, as disclosed herein. Step 1330 may comprise determining whether the test programming pulse applied at step 1320 comprises a suitable and/or optimal programming pulse for HPW operations performed within the test group (e.g., suitable and/or optimal for use as the single and/or first programming pulse of the HPW operations). Step 1330 may comprise determining: a) whether the test programming pulse provides sufficient differentiation between erased and/or non-programmed cells 10 and under-programmed cells 10, and b) whether the test programming pulse prevents over-programming of substantially all of the cells 10 within the test group.

The determination of whether the test programming pulse provides sufficient differentiation may comprise: identifying a minima within the $V_{TH}$ distribution curve (e.g., between $V_E$ and $V_{REF}$), determining whether the minima satisfies a cell count threshold and/or provides suitable $V_{TH}$ range in which cell count(s) remain below the cell count threshold (e.g., $V_{TH}$ range 299 of FIG. 2O), and/or determining whether an average and/or mean $V_{TH}$ of the selected cells 10 is within a first voltage threshold below $V_{REF}$. If the minima fails to satisfy the cell count threshold, provides insufficient $V_{TH}$ range, and/or is below $V_{REF}$ by more than the first voltage threshold, the test programming pulse may be rejected as unsuitable for failing to provide insufficient differentiation. Alternatively, or in addition, step 1330 may comprise determining whether the test programming pulse raised the $V_{TH}$ of the selected cells 10 to at least a minimum level above a maximum level of the erased and/or non-programmed cells 10 (e.g., to at least $V_{P\_MIN}$ where $V_{P\_MIN}$ is greater than $V_{E\_MAX}$ by at least a determined amount).

Determining whether the test programming pulse prevents over-programming may comprise determining whether the $V_{TH}$ distribution curve remains below a maximum $V_{TH}$ threshold for the cells 10 (e.g., $V_{TH\_MAX}$ and/or $V_{PASS}$), whether the $V_{TH}$ distribution curve has an amplitude below $V_{PGM\_MAX}$ for the cells 10, and whether the average and/or mean $V_{TH}$ of the selected cells 10 is more than a second voltage threshold above $V_{REF}$ (and/or less than a third voltage threshold lower than $V_{REF}$). In response to determining that the test programming pulse results in a $V_{TH}$ distribution curve that exceeds the maximum $V_{TH}$ threshold for the cells 10, is at or above $V_{PGM\_MAX}$ for the cells 10, and/or fails to satisfy one or more of the second or third voltage thresholds, the test programming pulse may be rejected as unsuitable for failing to prevent over-programming.

If the test programming pulse is determined to be unsuitable at step 1340, the flow may continue at step 1340; otherwise, the flow may continue at step 1350. Step 1340 may comprise incrementing the test pulse operation. Incrementing the test pulse operation may comprise adjusting the configuration of the test programming pulse to either: a) increase the amplitude and/or duration of the test programming pulse, or b) decrease the amplitude and/or duration of the test programming pulse. Step 1340 may comprise increasing the amplitude and/or duration of the test programming pulse in response to determining that the test programming pulse fails to provide sufficient differentiation at step 1330 (incrementing the amplitude and/or duration by an increase factor). Step 1340 may comprise decreasing the amplitude and/or duration of the test programming pulse in response to determining that the test programming pulse fails to prevent over-programming at step 1330 (decreasing the amplitude and/or duration by a decrease factor). After incrementing the test pulse operation, the flow may continue at step 1310, which may comprise: a) erasing the test group, and b) applying the incremented test programming pulse determined at step 1340.

Step 1350 may be implemented in response to determining that the test programming pulse is suitable and/or optimal for use as a single and/or first programming pulse at step 1330 (e.g., provides sufficient differentiation between the selected cells 10 and erased and/or non-programmed cells 10 and prevents over-programming of the cells 10, as disclosed herein). Step 1350 may comprise determining a configuration corresponding to the test programming pulse (e.g., an HPW configuration, as disclosed herein). Step 1350 may comprise determining a configuration for the single and/or first programming pulse in accordance with the amplitude and/or duration of the test programming pulse, determining an optimal UPF, and so on, as disclosed herein. Step 1350 may further comprise determining a background verification threshold (e.g., $\Delta t_{MAX}$) for the configuration based on, inter alia, projected widening rates of the $V_{TH}$ distributions of erased and/or selected cells 10. Step 1350 may further comprise determining a configuration for an additional, second, and/or corrective, programming pulse configured to raise the $V_{TH}$ of substantially all of the selected cells 10, including under-programmed cells 10 (e.g., cells 10 having a $V_{TH}$ within the determined UPF below $V_{REF}$) to at least $V_{REF}$, while preventing over-programming of substantially any of the cells 10. The amplitude and/or duration of the second programming pulse may be higher than the amplitude and/or duration of the first programming pulse (the test programming pulse). The amplitude of the second programming pulse may be increased by about $V_{PGM\_BGTRIM}$, as disclosed herein.

Step 1360 may comprise validating the configuration determined at step 1350. Step 1360 may comprise using the UPF to identify under-programmed cells 10, verifying that the number of fully programmed and under-programmed cells 10 corresponds to the number of selected cells 10 to which the test pulse operation was applied, and/or the like. Step 1360 may further comprise identifying under-programmed cells 10, applying the second programming pulse thereto, and determining an updated $V_{TH}$ distribution curve for the test group in response to applying the second programming pulse. Step 1360 may comprise evaluating the updated $V_{TH}$ distribution curve to verify that the $V_{TH}$ of substantially all of the selected cells 10 are at $V_{REF}$ or above, and substantially none of the cells 10 are over-programmed. If the configuration is validated at step 1360, the flow may continue at step 1380; otherwise, the flow may continue at step 1370.

Step 1370 may comprise adjusting the configuration. The configuration may be adjusted to increase the amplitude and/or duration of the first and/or second programming pulses in response to step 1360 indicating that one or more of the selected cells 10 remained in an under-programmed state. Step 1370 may comprise decreasing the amplitude and/or duration of the first and/or second programming pulses in response to step 1360 indicating that one or more of the cells 10 were over-programmed. Step 1370 may comprise validating the adjusted configuration, as disclosed herein (e.g., erasing the cells 10 of the test group, applying a first programming pulse to selected cells 10 in accordance with the adjusted configuration, validating the resulting $V_{TH}$ distribution curve, applying a second programming pulse to under-programmed cells 10 in accordance with the adjusted configuration, and validating the resulting updated $V_{TH}$ distribution curve). Step 1370 may comprise adjusting the configuration until arriving at a suitable and/or optimal configuration. Alternatively, step 1370 may fail in response to failing to arrive at a suitable and/or optimal configuration after a threshold number of adjustments.

Step 1380 may comprise recording the configuration. Recording the configuration may comprise storing the configuration within the system storage 125 (e.g., in configuration store 127) and/or associating the configuration with a program region corresponding to the test group (in a region map 183), as disclosed herein, such that the configuration may be used to control HPW operations on cells 10 within the program region. Alternatively, or in addition, step 1380 may comprise associating the configuration with substantially all of the groups, pages, and/or blocks of the memory 115 (and/or multiple program regions within the memory structure 113).

Figure 14:
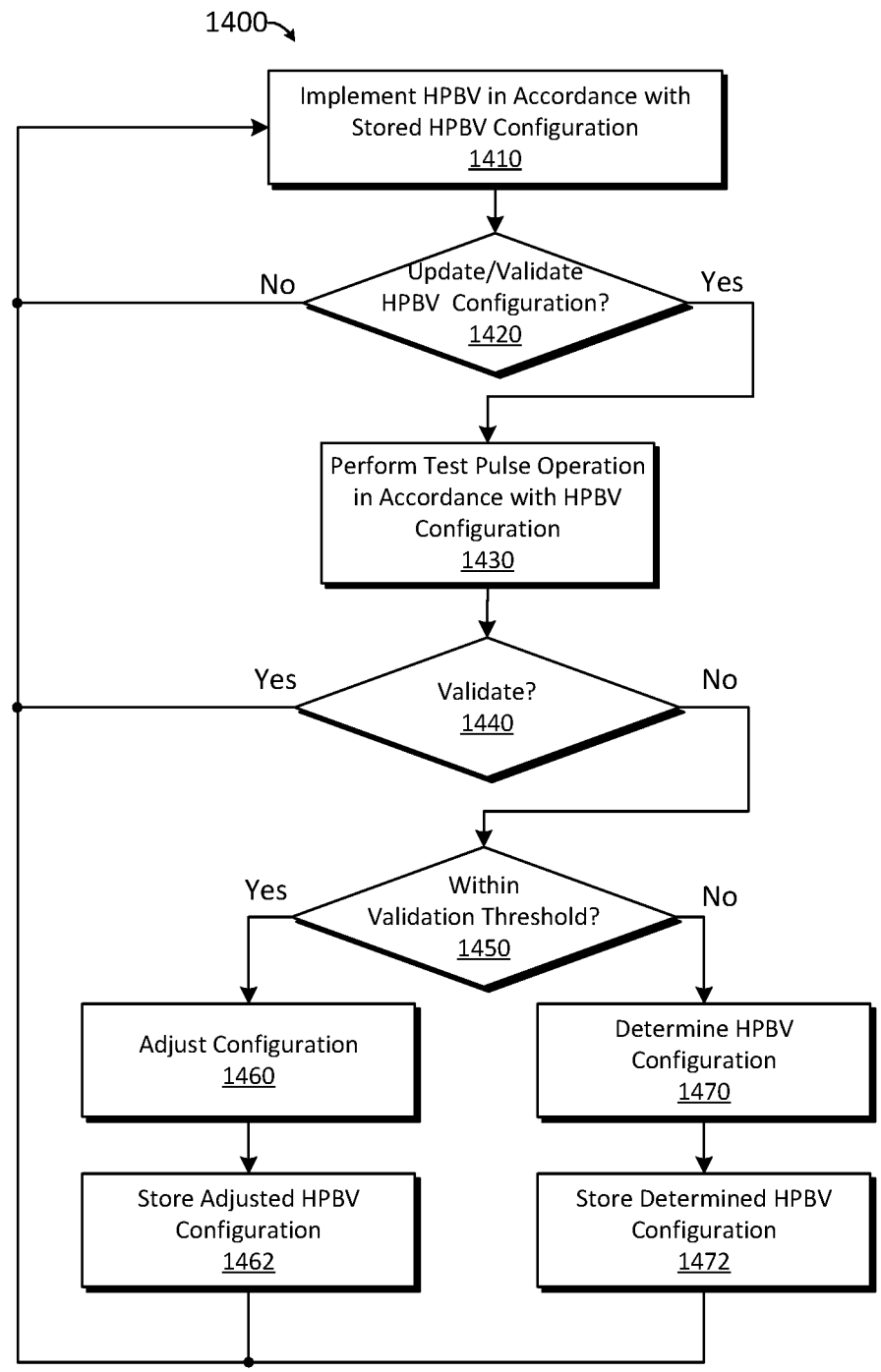
FIG. 14 is a flow diagram of one embodiment of a method for managing configuration data pertaining to high-performance, background-verified operations, as disclosed herein.

FIG. 14 is a flow diagram of one embodiment for managing an HPW configuration pertaining to a program region. Step 1410 may comprise implementing HPW operations within the program region in accordance with an HPW configuration, as disclosed herein. Step 1410 may further comprise monitoring one or more of a program error rate corresponding to the HPW operations, a read error rate corresponding to the HPW operations, a wear level of the cells 10 within the program region, operating conditions, an elapsed time since the HPW configuration was determined, and/or the like.

Step 1420 may comprise determining whether to update and/or validate the HPW configuration for the program region. The determination of step 1420 may be based on any suitable criteria, including, but not limited to: a program error rate corresponding to the HPW operations, a read error rate corresponding to the HPW operations, a wear level of the cells 10 within the program region, operating conditions, an elapsed time since the HPW configuration was determined, and/or the like. Step 1420 may comprise determining to update and/or validate the HPW configuration after a determined time period and/or at determined wear level(s). If the determination of step 1420 is to update and/or validate the HPW configuration, the flow may continue at step 1430; otherwise, the flow may continue at step 1410.

Step 1430 may comprise validating the HPW configuration, which may comprise determining whether the HPW configuration is suitable and/or optimal for HPW operations performed within the program region. Step 1430 may comprise performing test pulse operations on a test group comprising cells 10 within the program region, which may comprise: erasing the test group; applying a first programming pulse to selected cells 10 of the test group (in accordance with the HPW configuration); determining a $V_{TH}$ distribution curve for the test group; and evaluating the $V_{TH}$ distribution curve to determine whether the HPW configuration is suitable and/or optimal for HPW operations within the program region (e.g., as disclosed above in conjunction with, inter alia, steps 1330-1360 of FIG. 13). In response to failing to validate the HPW configuration, the flow may continue at step 1450; otherwise, the flow may continue at step 1410.

Step 1450 may comprise determining whether the HPW configuration is within a validation threshold. The validation threshold may indicate whether the HPW configuration is relatively close to a suitable and/or optimal HPW configuration for the program region. Step 1450 may comprise determining whether the HPW configuration raises substantially all of the selected cells 10 of the test group to within an under-program threshold $V_{REF}$–UPF, over-programs cells 10 by less than an over-program threshold (e.g., fewer than a threshold number of cells 10 are over-programmed by less than a threshold amount), and/or the like. If the determination of step 1450 is that the HPW configuration is within the validation threshold, the flow may continue at step 1460; otherwise, the flow may continue at step 1470.

Step 1460 may comprise adjusting the HPW configuration as disclosed above in conjunction with, inter alia, step 1370 of FIG. 13. Step 1460 may comprise adjusting the HPW configuration in accordance with the validation(s) of steps 1440 and/or 1450. Step 1460 may comprise increasing the amplitude and/or duration of the first and/or second programming pulses of the HPW configuration in response to determining that the HPW configuration fails to provide sufficient differentiation (and/or one or more of the selected cells 10 remained under-programmed during steps 1430-1440). Step 1460 may comprise decreasing the amplitude and/or duration of the first and/or second programming pulses of the HPW configuration in response to determining that the HPW configuration resulted in over-programming one or more cells 10 within the test group. Step 1460 may comprise validating the adjusted HPW configuration, as disclosed herein. Step 1460 may comprise adjusting the HPW configuration until arriving at a suitable and/or optimal HPW configuration (and/or until failing to arrive at a suitable and/or optimal HPW configuration after a threshold number of adjustments). Step 1462 may comprise storing the adjusted HPW configuration, as disclosed herein.

Step 1470 may comprise determining an HPW configuration for the program region. Step 1470 may comprise determining the HPW configuration in accordance with method 1300 (e.g., by iteratively performing test pulse operations within the program region). Step 1472 may comprise storing the determined HPW configuration, as disclosed herein.

Aspects of this disclosure may be embodied as an apparatus, system, method, logic, programmable logic, circuit, and/or computer program product (e.g., instructions and/or code stored and/or embodied on a non-transitory computer-readable storage medium). Accordingly, aspects of this disclosure may take the form of hardware, software (including firmware, resident software, firmware micro-code, or the like), combinations of hardware and software, and/or the like. As such, aspects of this disclosure may be referred to herein as a "circuit," "circuitry," "module," "element," "apparatus," "system," and/or the like. Aspects of this disclosure may be embodied as instructions stored on a non-transitory storage medium. Computer program code for carrying out operations, steps, and/or implementing aspects of this disclosure may be written in any combination of one or more programming languages.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit and/or circuitry, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this disclosure to "one embodiment," "an embodiment," "some embodiments," or similar language means that a particular feature, structure, or characteristic described in connection with the embodiment is included in at least one embodiment of the disclosure (e.g., one or more embodiments). The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

We claim:

1. A memory device, comprising:
a memory controller configured to:
apply a first programming pulse to a page comprising a plurality of memory cells in response to a first command, and
indicate that the first command is complete in response to the first programming pulse; and
a device controller configured to schedule verification of the page.

2. The memory device of claim 1, wherein the device controller is further configured to cancel the scheduled verification of the page in response to determining that data corresponding to the first command does not need to be retained.

3. The memory device of claim 1, wherein:
the first command pertains to a foreground command issued by a host computing device; and
the device controller is further configured to:
acknowledge completion of the first command in response to the first programming pulse and without verifying programming of the memory cells comprising the page, and
issue a second command to the memory controller after acknowledging completion of the first command, the second command configured to cause the memory controller to implement the scheduled verification of the page.

4. The memory device of claim 1, wherein the memory controller is further configured to implement the scheduled verification of the page by:
identifying under-programmed memory cells of the page, the under-programmed memory cells having voltage thresholds lower than a reference voltage potential used to read data states of the memory cells by less than a determined amount; and
applying a second programming pulse to the under-programmed memory cells.

5. The memory device of claim 1, wherein, in response to a command to implement the scheduled verification of the page, the memory controller is further configured to:
identify memory cells within the page having voltage thresholds between a first reference voltage level used to distinguish programmed memory cells from non-programmed memory cells and a second reference voltage level, the second reference voltage level lower than the first reference voltage level by an under-program factor; and
apply a second programming pulse to the identified memory cells.

6. The memory device of claim 5, wherein the memory controller is further configured to: perform a first sense operation at the first reference voltage level; and
perform a second sense operation at the second reference voltage level.

7. The memory device of claim 5, wherein the device controller is further configured to determine the under-program factor based on a distribution of threshold voltages of a plurality of memory cells.

8. The memory device of claim 1, wherein the device controller further comprises: foreground processing logic configured to execute commands of a host; and
background processing logic configured to direct the memory controller to implement the scheduled verification of the page while the foreground processing logic is idle.

9. The memory device of claim 1, wherein:
the first command pertains to a host command retrieved from a queue; and
the device controller is configured to instruct the memory controller to perform the scheduled verification of the page in response to determining that the queue is empty.

* * * * *